US006833904B1

(12) United States Patent
Komatsuda

(10) Patent No.: US 6,833,904 B1
(45) Date of Patent: Dec. 21, 2004

(54) EXPOSURE APPARATUS AND METHOD OF FABRICATING A MICRO-DEVICE USING THE EXPOSURE APPARATUS

(75) Inventor: Hideki Komatsuda, Kawasaki (JP)

(73) Assignee: Nikon Corporation, Tokyo (JP)

( * ) Notice: Subject to any disclaimer, the term of this patent is extended or adjusted under 35 U.S.C. 154(b) by 237 days.

(21) Appl. No.: 09/697,639

(22) Filed: Oct. 27, 2000

Related U.S. Application Data

(63) Continuation-in-part of application No. 09/259,137, filed on Feb. 26, 1999.

(30) Foreign Application Priority Data

| Feb. 27, 1998 | (JP) | .......................................... 10-047400 |
| Sep. 17, 1998 | (JP) | .......................................... 10-263673 |
| Feb. 25, 2000 | (JP) | ...................................... 2000-050137 |

(51) Int. Cl.[7] .................. G03B 27/42; G03B 27/54; G03B 27/72; G03B 27/32; F21V 29/00

(52) U.S. Cl. .............................. 355/67; 355/53; 355/71; 355/77; 362/268

(58) Field of Search .............................. 355/53, 67, 71, 355/77; 362/268, 341, 216, 317; 378/34; 359/620, 366

(56) References Cited

U.S. PATENT DOCUMENTS

| 4,497,015 A | 1/1985 | Konno et al. ................ 362/268 |
| 4,682,885 A | 7/1987 | Torigoe ........................ 355/67 |
| 4,931,830 A | 6/1990 | Suwa et al. ..................... 355/71 |
| 5,245,384 A | 9/1993 | Mori ............................ 355/67 |
| 5,315,629 A * | 5/1994 | Jewell et al. .................. 378/34 |
| 5,440,423 A | 8/1995 | Ogura .......................... 359/365 |
| 5,461,456 A * | 10/1995 | Michaloski .................. 355/53 |
| 5,581,605 A | 12/1996 | Murakami et al. ............. 378/84 |
| 5,631,721 A | 5/1997 | Stanton et al. ................. 355/71 |
| 5,669,708 A | 9/1997 | Mashima et al. ........... 362/341 |
| 5,677,939 A | 10/1997 | Oshino ......................... 378/34 |
| 5,703,675 A | 12/1997 | Hirukawa et al. |
| 5,724,122 A | 3/1998 | Oskotsky ...................... 355/67 |
| 5,737,137 A | 4/1998 | Cohen et al. ................ 359/859 |
| 5,739,899 A | 4/1998 | Nishi et al. |
| 5,798,824 A | 8/1998 | Kudo .......................... 355/67 |
| 5,864,388 A | 1/1999 | Shima et al. .................. 355/53 |
| 5,867,319 A | 2/1999 | Sugiyama et al. .......... 359/618 |
| 5,891,806 A | 4/1999 | Shibuya et al. ............. 438/707 |
| 5,894,341 A | 4/1999 | Nishi et al. ................... 355/68 |
| 6,127,095 A | 10/2000 | Kudo .......................... 430/311 |
| 6,195,201 B1 | 2/2001 | Koch et al. ................. 359/366 |
| 6,249,382 B1 | 6/2001 | Komatsuda |
| 6,266,389 B1 * | 7/2001 | Murayama et al. ........... 378/34 |
| 6,281,967 B1 | 8/2001 | Kudo |
| 6,295,122 B1 | 9/2001 | Schultz et al. |
| 6,480,262 B1 | 11/2002 | Tanaka et al. |
| 6,560,044 B2 | 5/2003 | Shinoda |
| 2001/0012101 A1 | 8/2001 | Mulkens |
| 2001/0043408 A1 | 11/2001 | Wangler et al. |
| 2003/0025890 A1 | 2/2003 | Nishinaga |

FOREIGN PATENT DOCUMENTS

| EP | 1 024 408 A2 | 8/2000 |
| JP | A-60-232552 | 11/1985 |
| JP | A-62-2540 | 1/1987 |
| JP | 11-224853 A | 8/1999 |

* cited by examiner

Primary Examiner—Rodney Fuller
(74) Attorney, Agent, or Firm—Oliff & Berridge PLC

(57) ABSTRACT

A projection system projects a pattern formed on a mask onto a photosensitive substrate. An illumination optical system forms an illumination field at a position on the mask. A drive relatively moves the mask and the photosensitive substrate with respect to the projection system along a predetermined scanning exposure direction. A first illumination adjustment mechanism adjusts an illumination characteristic along the scanning exposure direction. A second illumination adjustment mechanism adjusts an illumination characteristic in a direction crossing the scanning exposure direction. A first telecentricity adjustment mechanism applies an inclined component to telecentricity. A second telecentricity adjustment mechanism adjusts the telecentricity relative to the position of an optical axis.

95 Claims, 27 Drawing Sheets

EXPOSURE APPARATUS AND METHOD OF FABRICATING A MICRO-DEVICE USING THE EXPOSURE APPARATUS

INCORPORATION BY REFERENCE

This is a Continuation-In-Part of application Ser. No. 09/259,137, filed Feb. 26, 1999, the disclosure of which is incorporated herein by reference in its entirety.

Additionally, the disclosures of the following priority applications are herein incorporated by reference in their entireties: Japanese Patent Application No. 10-47400 filed Feb. 27, 1998, Japanese Patent Application No. 10-263673 filed Sep. 17, 1998, and Japanese Patent Application No. 2000-50137, filed Feb. 25, 2000.

BACKGROUND OF THE INVENTION

1. Field of the Invention

This invention relates to an exposure apparatus, and to a method of making a micro-device using the exposure apparatus, when a micro-device (for example, a semiconductor element of a semiconductor device, a liquid crystal display element, an imaging element (e.g., a CCD), a thin film magnetic head, or the like) is fabricated by a photolithography process.

2. Description of Related Art

Conventionally, exposure apparatus for fabricating a semiconductor element are provided with an illumination device and a projection optical system. A circuit pattern formed on a mask is projected and transferred onto a photosensitive substrate, such as a wafer on which a photoresist is coated, via the projection optical system.

U.S. Pat. No. 5,737,137 discloses an exposure apparatus using an ELV ray (extreme ultraviolet ray) in the soft X-ray region of approximately 5 nm–21 nm. In order to transfer finer micro patterns onto a photosensitive substrate, it is necessary to sufficiently satisfy stricter illumination conditions in the illumination device of the exposure apparatus. However, adjusting mechanisms that sufficiently satisfy strict illumination conditions are not known.

SUMMARY OF THE INVENTION

Therefore, one object of the invention is to provide a method of fabricating an improved micro-device by exposure of a finer micro pattern, and to provide an exposure apparatus that is highly capable of satisfying strict illumination conditions.

In order to accomplish the above-mentioned and/or other objects, according to one aspect of the invention, an exposure apparatus includes a projection system, an illumination optical system, a drive system, first and second illumination adjustment mechanisms and first and second telecentricity adjustment mechanisms. The projection system has an exposure field that is decentered with respect to an optical axis in order to project a pattern formed on a mask onto a photosensitive substrate. The illumination optical system forms an illumination field at a position on the mask which is decentered with respect to the optical axis of the projection system in order to guide a light beam for exposure to the exposure field. The drive system relatively moves the mask and the photosensitive substrate along a specified scanning exposure direction with respect to the projection system. The first illumination adjustment mechanism adjusts an illumination characteristic, along the scanning exposure direction, in one of: (a) the exposure field of the projection system which is formed on the photosensitive substrate, and (b) an illumination field which is formed on the mask. The second illumination adjustment mechanism adjusts an illumination characteristic, in a direction crossing the scanning exposure direction, in one of: (a) the exposure field of the projection system which is formed on the photosensitive substrate, and (b) the illumination field which is formed on the mask. The first telecentricity adjustment mechanism applies an oblique component to telecentricity in one of: (a) the exposure field of the projection system and (b) the illumination field formed on the mask. The second telecentricity adjustment mechanism adjusts telecentricity relative to the optical axis in one of: (a) the exposure field of the projection system formed on the photosensitive substrate and (b) the illumination field formed on the mask.

According to one aspect of the invention, the illumination optical system forms an arcuate illumination field on the mask in the direction crossing the scanning exposure direction.

According to another aspect of the invention, the first illumination adjustment mechanism applies an illumination distribution component that is oblique relative to the scanning exposure direction, and the second illumination adjustment mechanism applies an illumination distribution component that is oblique relative to the direction crossing the scanning exposure direction.

According to another aspect of the invention, the illumination optical system includes a plurality of illumination optical components, and the first and second illumination adjustment mechanisms move or incline at least some similar ones of the illumination optical components among the plurality of illumination optical components in mutually different directions, or respectively move or incline mutually different ones of the illumination optical components which are different from each other.

According to another aspect of the invention, the first telecentricity adjustment mechanism adjusts an illumination optical component which is different from an illumination optical component adjusted by the first and second illumination adjustment mechanisms, and the second telecentricity adjustment mechanism adjusts an illumination optical component which is different from an illumination optical component which is adjusted by the first telecentricity adjustment mechanism, or the same illumination optical component that is adjusted by the first telecentricity adjustment mechanism.

According to another aspect of the invention, the illumination optical system includes a plurality of reflective components, and the first and second illumination adjustment mechanisms, and the first and second telecentricity adjustment mechanisms respectively adjust the position of at least some of the reflective components of the illumination optical system.

According to another aspect of the invention, the first and second illumination adjustment mechanisms incline a common reflective member about mutually different axes of rotation, or move the common reflective component in mutually different directions.

According to another aspect of the invention, the first and second telecentricity adjustment mechanisms move the common reflective member in mutually different directions.

According to another aspect of the invention, the first and second illumination adjustment mechanisms adjust a reflective component that is different from a reflective component that is adjusted by the first and second telecentricity adjustment mechanisms.

According to another aspect of the invention, the illumination optical system includes: a light source that provides the light beam; a reflective optical integrator that makes uniform an illumination distribution on the photosensitive substrate or the mask; and a light guiding optical system, arranged between the light source and the reflective optical integrator, and that guides the light beam from the light source to the reflective optical integrator.

According to another aspect of the invention, an illumination condition changing mechanism is further provided, which changes an illumination condition in an illumination field formed on the mask, or an illumination condition in the exposure field of the projection system formed on the photosensitive substrate. Furthermore, the first and second illumination adjustment mechanisms, and the first and second telecentricity adjustment mechanisms perform their respective adjustments according to a change of the illumination condition affected by the illumination condition changing mechanism.

Another aspect of the invention pertains to a method of fabricating a micro-device using the exposure apparatus, and includes the steps of: illuminating the mask utilizing the illumination optical system; and exposing an image of the pattern of the mask onto the photosensitive substrate utilizing the projection system.

Another aspect of the invention pertains to an exposure apparatus having an illumination optical system, a projection system, a drive system, and first and second telecentricity adjustment mechanisms. The illumination optical system includes a plurality of reflective components for illumination, and guides a light beam for exposure to a mask. The projection system projects a pattern of the mask onto a photosensitive substrate. The drive system relatively moves the photosensitive substrate and the mask with respect to the projection system along a specified scanning exposure direction. The first telecentricity adjustment mechanism applies an oblique component to telecentricity in one of: (a) an exposure field of the projection system which is formed on the photosensitive substrate and (b) an illumination field formed on the mask. The second telecentricity adjustment mechanism adjusts telecentricity relative to the optical axis in one of: (a) the exposure field of the projection system which is formed on the photosensitive substrate and (b) the illumination field formed on the mask. The first and second telecentricity adjustment mechanisms respectively adjust at least some of the reflective components of the illumination optical system.

According to another aspect of the invention, the second telecentricity adjustment mechanism moves the reflective component that is adjusted by the first telecentricity adjustment mechanism in a direction different from a direction in which the reflective component is moved by the first telecentricity adjustment mechanism, or moves a reflective component that is different from the reflective component that is adjusted by the first telecentricity adjustment mechanism.

According to another aspect of the invention, the illumination optical system includes: a light source that provides the light beam; a reflective integrator which makes uniform an illumination distribution on the photosensitive substrate or the mask; and a light guiding optical system, arranged between the light source and the reflective integrator, and that guides the light beam from the light source to the reflective integrator.

According to another aspect of the invention, the projection system has an exposure field which is decentered with respect to the optical axis, and the illumination optical system forms an illumination field at a position on the mask which is decentered with respect to the optical axis of the projection system in order to guide the light beam for exposure to the exposure field by using a plurality of reflective components.

According to another aspect of the invention, an illumination condition changing mechanism is further provided, and changes an illumination condition in an illumination field formed on the mask, or an illumination condition in the exposure field of the projection system formed on the photosensitive substrate. Additionally, the first and second telecentricity adjustment mechanisms perform the respective adjustments according to the change of the illumination condition made by the illumination condition changing mechanism.

Another aspect of the invention pertains to a method of fabricating a micro-device using the exposure apparatus.

BRIEF DESCRIPTION OF THE DRAWING

The invention will be described in conjunction with the following drawings in which like reference numerals designate like elements and wherein.

DETAILED DESCRIPTION OF PREFERRED EMBODIMENTS

Figure 1:
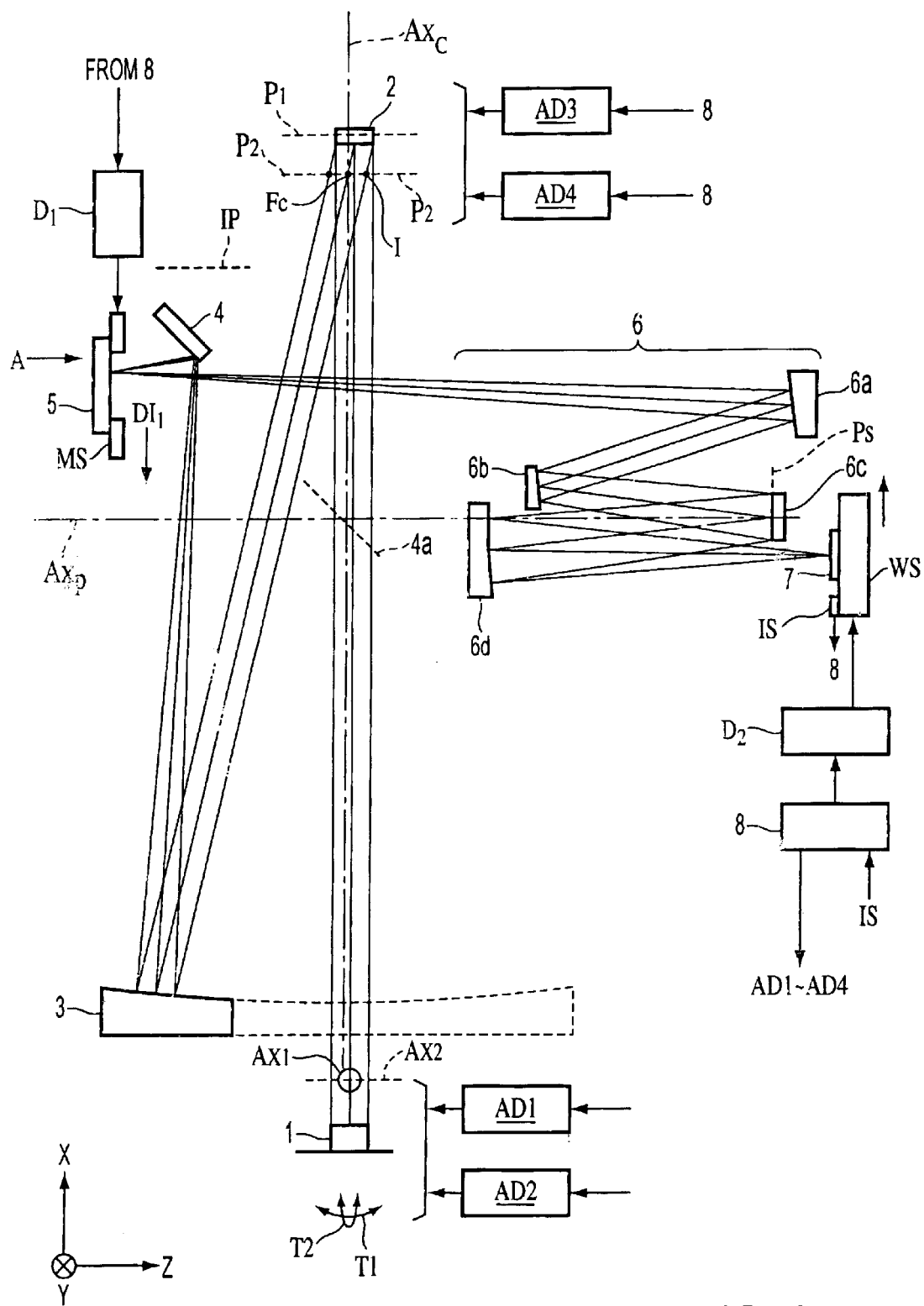
FIG. 1 is a schematic structural diagram of an exposure apparatus according to a first embodiment of the invention.
Figure 2:
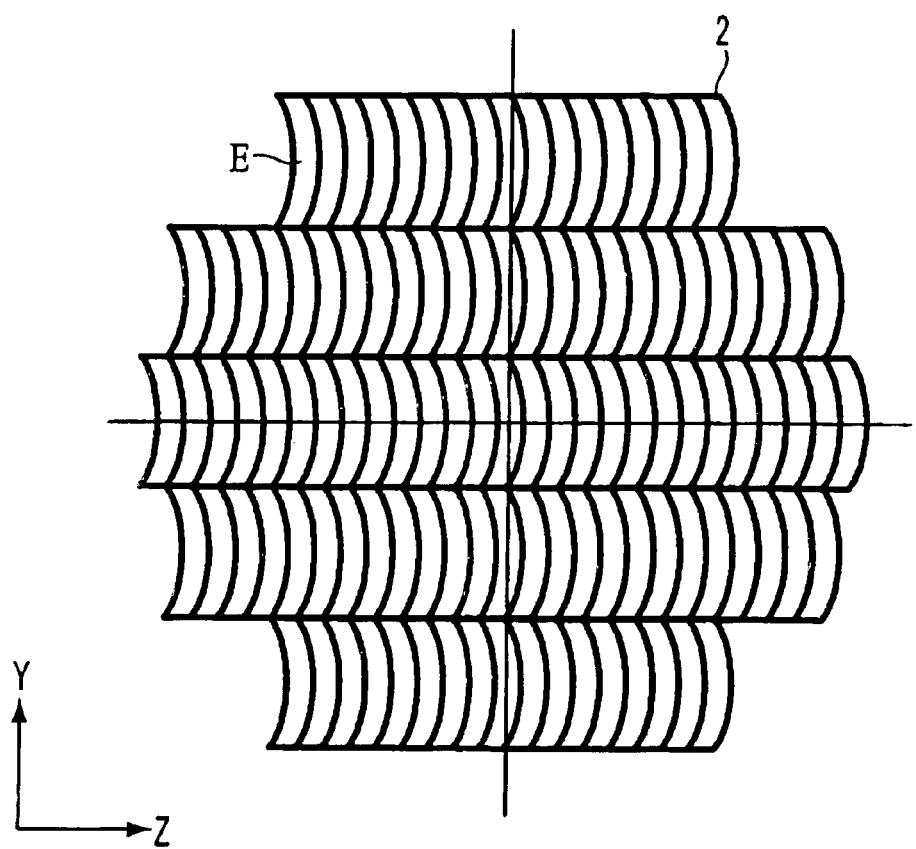
FIG. 2 is a front view showing a structure of a reflective element group shown in FIG. 1.
Figure 3A:
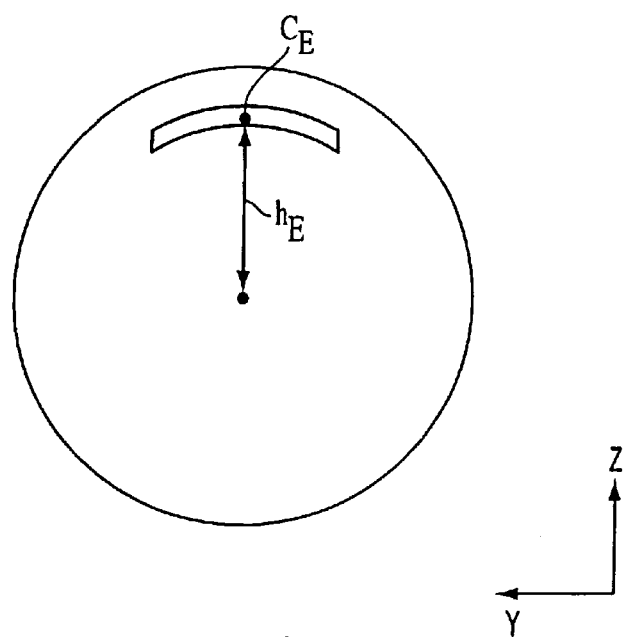
FIG. 3A is a front view showing the geometry of the respective reflective elements within the reflective element group shown in FIG. 2.
Figure 3B:
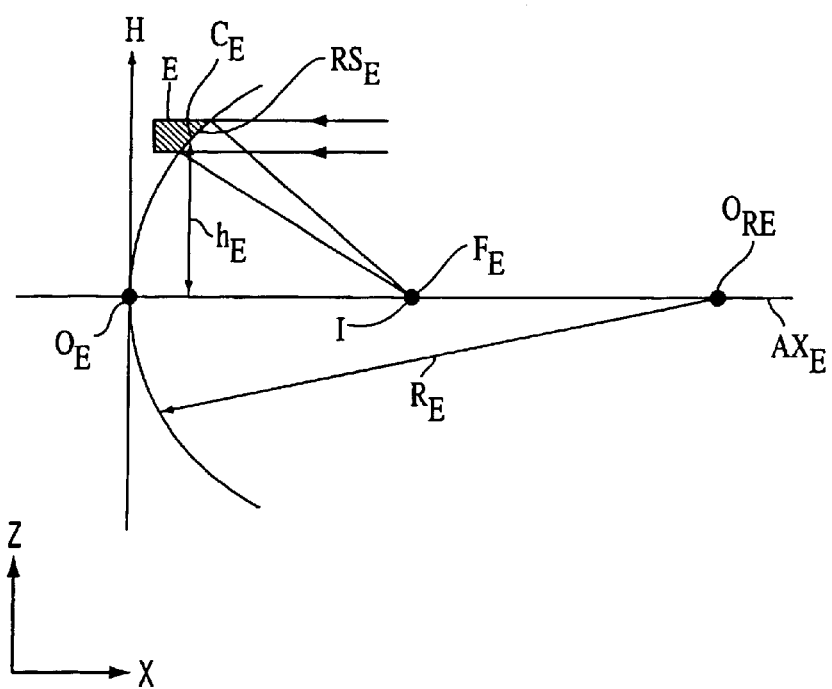
FIG. 3B is a cross-sectional view showing a cross-sectional shape of the reflective elements shown in FIG. 3A.
Figure 4:
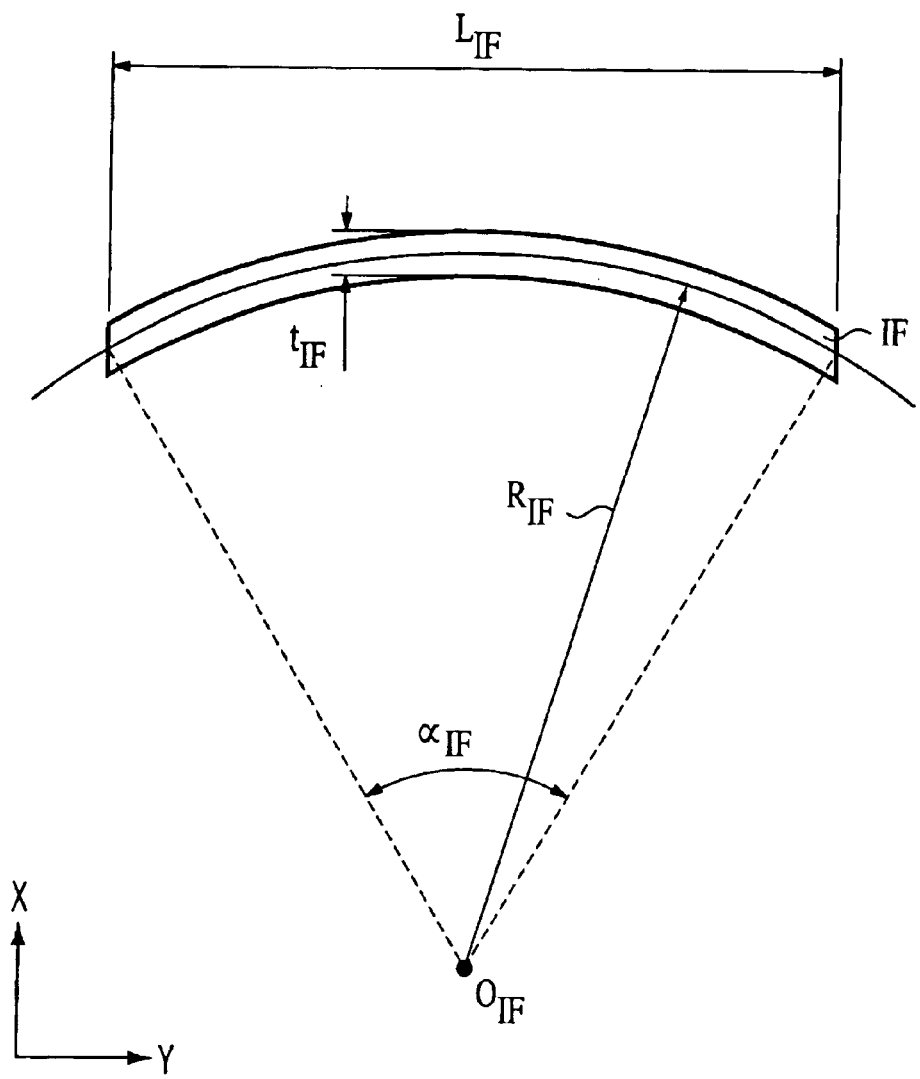
FIG. 4 is a diagram showing an arcuate illumination field IF formed on a reflective type mask.

A first embodiment of this invention will be explained with reference to FIGS. 1–4. FIG. 1 is a diagram showing a schematic structure of a first embodiment according to this invention. FIG. 2 is a front view showing a structure of a reflective element group 2, which functions as a multi-light source formation optical system (optical integrator). FIGS. 3A and 3B are diagrams showing structures of the respective reflective elements E which constitute the reflective type optical element group 2. FIG. 4 is a diagram showing an operation of the reflective element group 2 as a multi-light source image formation optical system (optical integrator) shown in FIG. 1.

As shown in FIG. 1, a laser beam (parallel light beam) which is supplied from a light source 1 such as a laser beam source or the like which supplies laser light having a wavelength of 200 nm or less is incident substantially perpendicular to the reflective element group 2 that is used as a multi-light source formation optical system (optical integrator). An ArF excimer laser which supplies a laser beam having a wavelength of 193 nm, an F2 laser which supplies a laser beam having a wavelength of 157 nm, a laser plasma X-ray source which irradiates X-rays having a wavelength of 10 nm–15 nm, a synchrotron generating device which supplies radiation rays having a wavelength of 10 nm–15 nm or the like can be used as the light source 1.

Here, the reflective element group 2 has a plurality of reflective elements (optical elements) E finely arranged along a predetermined first reference plane $P_1$ perpendicular to a YZ plane in a two-dimensional manner. Specifically, as shown in FIG. 2, the reflective element group 2 has many reflective elements E with reflective curved surfaces having outlines (outer shapes) in the shape of an arc. There are five rows of reflective element groups 2 along the Y direction. The rows of the reflective elements are aligned in the Z direction. Additionally, the reflective elements E are arranged so that together they form a substantially round shape.

The outline shape (arc shape) of each reflective element E is similar to a shape of an arcuate illumination field IF formed on a reflective mask 5 located at an illumination plane, which will be discussed later. As shown in FIGS. 3A and 3B, each reflective element E has a cross-sectional shape having a reflective curved surface part of a predetermined radius of curvature $R_E$ in a predetermined region decentered from an optical axis $AX_E$. Additionally, a center $C_E$ of this arcuate reflective element E is located at a position of height $h_E$ from the optical axis $Ax_E$. Therefore, as shown in FIG. 3B, the reflective surface $RS_E$ of each decentered reflective element E is a decentered spherical mirror having a predetermined radius of curvature $R_E$. Furthermore, $RS_E$ of FIG. 3B shows an effective reflective region of the reflective element E which effectively reflects a light beam incident from the light source 1.

Therefore, as shown in FIG. 3B, a laser beam (collimated light beam) L incident in a direction parallel to the optical axis $Ax_E$ of the reflective element E forms a light source image I by focusing light at a focal point $F_E$ on the optical axis $Ax_E$ of the reflective element E. Furthermore, the focal length $F_E$ of the reflective element E is located a distance between an apex $O_E$ of the reflective curved surface of the reflective element E and the focal point $F_E$ of the reflective curved surface of the reflective element E. If the radius of curvature of the reflective curved surface of the reflective element E is $R_E$, the relationship of the following equation (1) is established.

$$F_E = -R_E/2 \quad (1)$$

With reference to FIG. 1, wavefronts of the laser beam (collimated light beam) are incident substantially perpendicular to the reflective element group 2, and form, upon reflection from reflective elements E, a plurality of converging beams, each having an arcuate cross-section (hereafter "arcuate light beam"). This results in a plurality of light source images corresponding in number to the number of the reflective elements E being formed at a position $P_2$ shifted from the incident light beam. In other words, if the laser beam is incident from a direction parallel to the optical axis $Ax_E$ of the reflective elements E that form the reflective element group 2, due to the reflective light-focusing operation of the reflective elements E, light source images I are respectively formed in plane $P_2$ through which the focal point $F_E$ passes. Thus, a plurality of secondary light sources are formed in the plane $P_2$ in which the plurality of light source images I are formed. In this manner, the reflective element group 2 functions as a multiple light source image formation optical system that forms a plurality of light source images I, i.e., group 2 functions as an optical integrator that forms a plurality of secondary light sources.

The light beams of the plurality of light source images I are incident to a condenser mirror 3 having an optical axis $Ax_C$. Mirror 3 functions as a condenser optical system. This condenser mirror 3 is constituted by a spherical mirror having an effective reflective surface located at a position separated from the optical axis $Ax_C$. The spherical mirror has a predetermined radius of curvature $R_C$. The optical axis $Ax_C$ of the condenser mirror 3 passes through a center (a position at which the optical axis $Ax_C$ and the plane $P_2$ in which the light source image I is formed cross each other) of the location where the plurality of light source images I are formed by the optical element group 2. However, the focal point of the condenser mirror 3 exists on the optical axis $Ax_C$.

Furthermore, the optical axis $Ax_C$ of the condenser mirror 3 is parallel to the respective optical axes $AX_{E1}$ of the plurality of optical elements $E_1$ that form the optical element group 2. After the light beams from the plurality of light source images I are reflected and focused by the condenser mirror 3, a reflective mask 5 is superimposingly illuminated (irradiated) in an arc shape via a flat mirror 4, which functions as a fold mirror. FIG. 4 shows an arcuate illumination field IF formed on the reflective mask 5 when it is viewed from a direction shown by arrow A of FIG. 1, that is, from behind the reflective mask 5. The center of curvature $O_{IF}$ of the arcuate illumination field IF exists on the optical axis $Ax_P$ of a projection system shown FIG. 1. If the flat mirror 4 of FIG. 1 were removed, the illumination field IF would be formed at the position (plane) of the illumination plane IP of FIG. 1, and the center of curvature $O_{IF}$ of the illumination field IF would be located on the optical axis $Ax_C$ of the condenser mirror 3.

In the example shown in FIG. 1, the optical axis $Ax_C$ of the condenser mirror 3 is not deflected 90° by the fold mirror 4. However, if the optical axis $Ax_c$ of the condenser mirror 3 were deflected 90° by a hypothetical reflective surface 4a, the optical axis $Ax_C$ of the condenser mirror 3 would be on the same axis as the optical axis $Ax_P$ of the projection system 6 and intersect the reflective mask 5. Accordingly, it can be said that these optical axes ($Ax_C$, $Ax_P$) are optically coaxial. Therefore, the condenser mirror 3 and the projection system 6 are arranged so that the respective optical axes ($Ax_C$, $Ax_P$) can optically pass through the center of curvature $O_{IF}$ of the arcuate illumination field IF.

A predetermined circuit pattern is formed in the surface of the reflective mask 5, and the reflective mask 5 is held by a mask stage MS that is two-dimensionally movable in the XY plane. The light that reflects off the reflective mask 5 is imaged onto a wafer 7 coated by resist (i.e., it is a photosensitive substrate) via the projection system 6. Thus, an arcuate pattern image of the reflective mask 5 is projected and transferred onto the wafer 7. The wafer 7 is held by a wafer (or substrate) stage WS that is two-dimensionally movable along the XY plane.

The mask stage MS two-dimensionally moves in the XY plane via a first driving system $D_1$, and the substrate stage WS two-dimensionally moves in the XY plane via a second driving system $D_2$. The driving amounts for these two driving systems ($D_1$, $D_2$) are controlled by a control system 8. Therefore, by the control system 8 moving the mask stage MS and the substrate stage WS relative to each other in opposite directions (shown by the arrows) via the two driving systems ($D_1$, $D_2$), the entire pattern formed on the reflective mask 5 is scanned and exposed onto the wafer 7 via the projection system 6. By this operation, a desired circuit pattern in a photolithography process of fabricating a semiconductor device is transferred onto the wafer 7, to fabricate a desired semiconductor device.

The projection system 6 having the optical axis $Ax_P$ is an off-axis type reduction system including four aspherical mirrors (6a–6d), each having an effective reflective surface located at a position separated from the optical axis $Ax_P$. The projection system 6 has an arcuate field located at a position separated from the optical axis $Ax_C$ at both the object plane (mask 5) and the image plane (wafer 7). Additionally, with respect to the projection system 6, the arcuate field in the object plane (mask 5) has a size corresponding to the arcuate illumination field IF formed on the mask 5 by the illumination system.

The first, third, and fourth aspherical mirrors (6a, 6c, 6d) are concave aspherical mirrors, and the second aspherical mirror 6b is a convex aspherical mirror. A pupil position $P_S$ of the projection system 6 exists on a reflective surface of the third aspherical mirror 6c, and an aperture stop or the like is arranged at the pupil position $P_S$.

Figure 5:
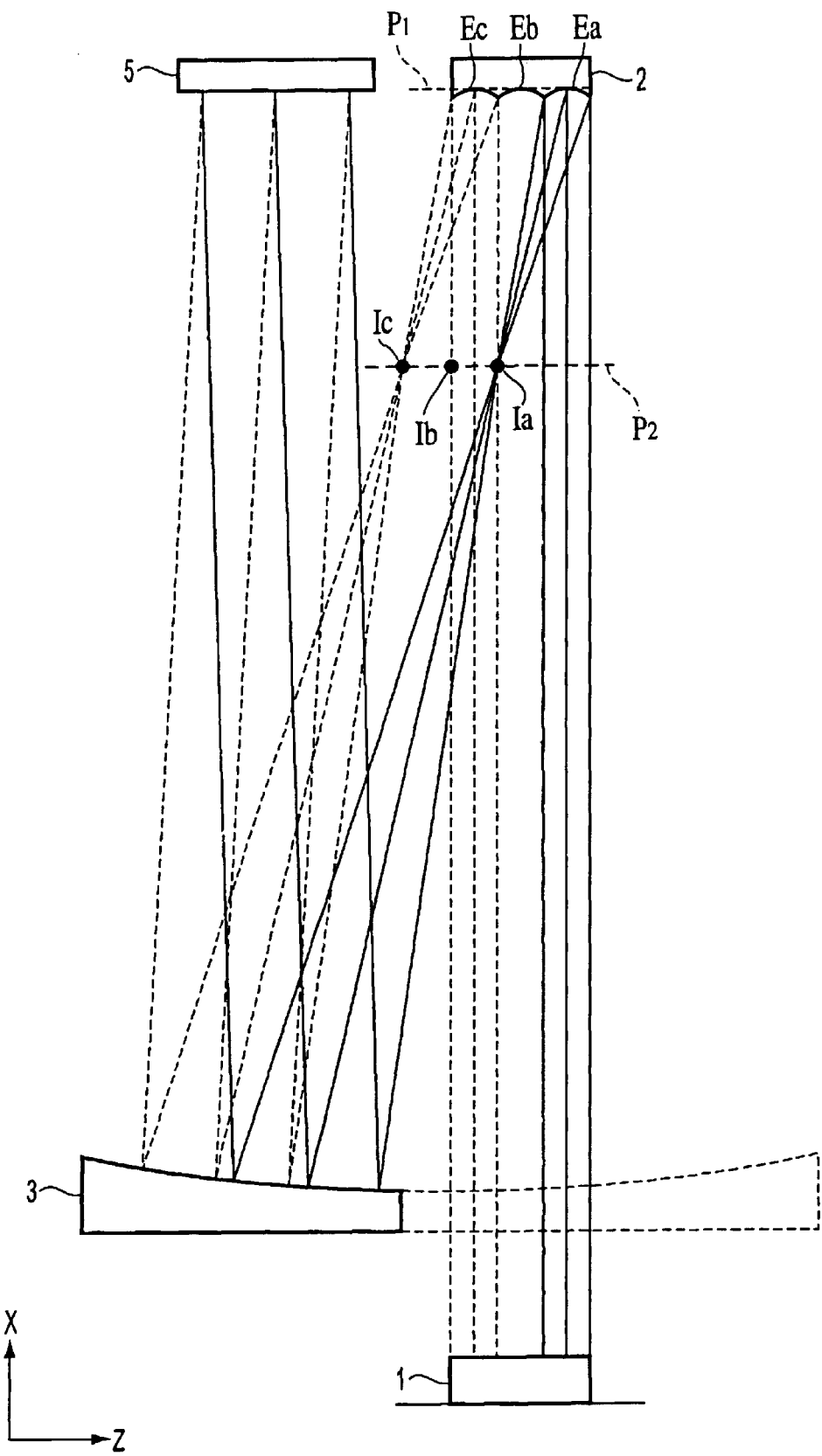
FIG. 5 is a diagram showing an operation of the reflective element group of FIG. 1.

The operation of the optical element group 2 shown in FIG. 1 is explained in greater detail with reference to FIG. 5. FIG. 5 shows an enlarged part of an illumination device which illuminates the reflective mask 5 shown in FIG. 1. For the sake of explanation, the flat mirror 4 is omitted from FIG. 5 and the reflective element group 2 is illustrated as having three reflective elements ($E_a$–$E_c$).

As shown in FIG. 5, the reflective element group 2 includes 3 reflective elements ($E_a$–$E_c$) arranged along a predetermined reference plane $P_1$. The predetermined reference plane $P_1$ is parallel to a plane (YZ plane) such that the focal point (position of the center of curvature) of each of the reflective elements ($E_a$–$E_c$) reside on plane $P_2$. The laser beam (collimated light beams) incident to the reflective element $E_a$ within the reflective element group 2 are formed into arcuate light beams.so as to correspond to an outline shape of a reflective surface of the reflective element $E_a$. The arcuate light beams (light beams shown by solid lines) converge to form a light source image $I_a$ due to the light focusing operation of the reflective surface of the reflective element $E_a$. Subsequently, the light beams from the light source image $I_a$ are focused by the reflective surface of the condenser mirror 3, and the reflective mask 5 is illuminated in an arcuate shape from an oblique direction. Furthermore, the paper plane direction of FIG. 5 is a width direction of the arcuate illumination field formed on the reflective mask 5.

Similarly, the laser beam (collimated light beams) incident to the reflective element $E_c$ within the reflective element group 2 is formed into arcuate light beams so as to correspond to an outline shape of a reflective surface of the optical element $E_C$. The arcuate light beams focusing operation of the reflective surface of the reflective element $E_C$. Subsequently, the light beams from the light source image $I_C$ are focused by the reflective surface of the condenser mirror 3, and the reflective mask 5 is illuminated in an arcuate shape that is superimposed with an arcuate illumination field formed by the light beams (reflected from elements $E_a$ shown by the solid lines.

Thus, the light which has been reflected by each of the reflective elements within the reflective element group 2 is superimposingly illuminated in an arcuate shape on the reflective mask 5, so that uniform illumination can be accomplished. Furthermore, as shown in FIG. 1, the light source image formed by each of the reflective elements within the reflective element group 2 is re-imaged at a pupil position $P_s$ of the projection system 6 (entrance pupil of the projection system 6). Therefore, so-called Koehler illumination is accomplished.

As shown in the above-mentioned first embodiment, in order to expose the pattern of the mask 5 onto the photosensitive substrate 7, even if the entire illumination system and projection system are formed from reflective type members and reflective type elements, an arcuate illumination field in which illumination is uniform on the mask can be efficiently formed, while substantially maintaining the conditions of Koehler illumination. Furthermore, the projective relationship of the condenser mirror 3 is made to be a positive projection, so that the reflective mask 5 can, be illuminated under a uniform numerical aperture NA regardless of the illumination direction.

Furthermore, as shown in FIG. 2, the outer shape (outline shape) of the reflective element group 2 is made to be substantially circular, and a plurality of reflective elements E are finely aligned, so the outer shape (outline shape) of the secondary light source formed by the plurality of light source images at the position $P_2$ is substantially circular. Accordingly, by making the projective relationship of the condenser mirror 3 positive and simultaneously setting the outer shape (outline shape) of the secondary light source, spatial coherence within the illumination field IF formed on the mask 5 can be made uniform regardless of the location and the direction of illumination.

Furthermore, by configuring the shape of the reflective surface of each of the reflective elements within the reflective element group 2 so that the projective relationship is identical to that of the condenser mirror 3, it is possible to make illumination in the arcuate illumination field formed on the reflective mask 5 more uniform without generating distortion aberration in the reflective element group 2 and the condenser mirror 3. In the above example, the condenser mirror 3 and the reflective elements E forming the reflective element group 2 are spherical and decentered from each other. However, this arrangement also can be aspherical.

Specific numerical values are listed for the condenser mirror 3 and the reflective element group 2 within the exposure apparatus shown in FIG. 1. The numerical value examples listed below are for a case in which the condenser mirror 3 and the reflective elements E forming the reflective element group 2 are constituted by aspherical-shaped reflective surfaces. Referring to FIG. 4, if the arc curvature (radius) $R_{IF}$ of the arcuate illumination field formed on the reflective mask 5 is 96 mm, the arc angle $\alpha_{IF}$ of the illumination field IF is 60°, the distance $L_{IF}$ between both ends of the arcuate illumination field IF is 96 mm, the arc width $t_{IF}$ of the illumination field IF is 6 mm, the illumination numerical aperture NA on the reflective mask 5 is 0.015, and the inclination (obliqueness) of the principle ray of the illumination light with respect to a line normal to the reflective mask 5 is 30 mrad (i.e., the entrance pupil position of the projection system 6 is 3119 mm from the reflective mask 5), then the diameter φ of the light beam supplied from the laser light source is approximately 42 mm.

Figure 6A:
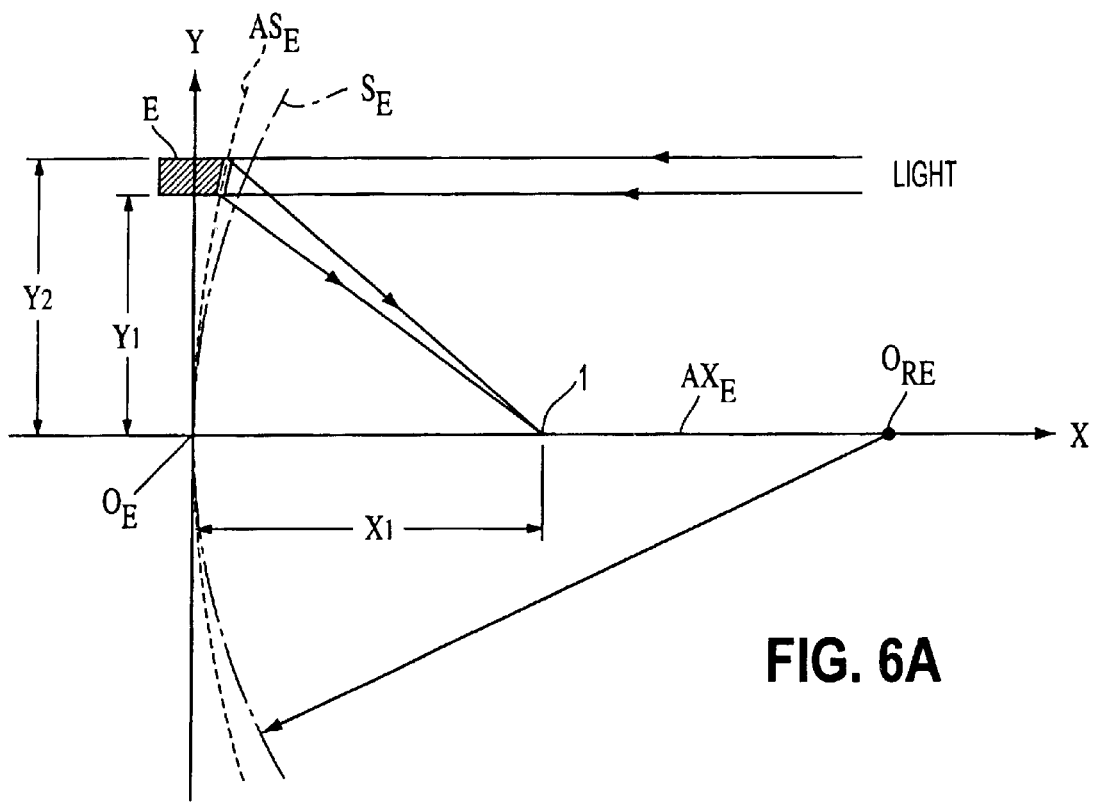
FIG. 6A is a cross-sectional view showing a cross-sectional shape of reflective elements when the respective reflective elements within the reflective element group have aspherical shapes.

Furthermore, as shown in FIG. 6A, the reflective curved surface (aspherical surface) of the reflective element E of the reflective element group 2 is $AS_E$, a reference spherical surface at the apex $O_E$ of the reflective curved surface of the reflective element E is $S_E$, the center of curvature of the reference spherical surface is $O_{RE}$, and the direction passing through the apex $O_E$ of the reflective curved surface of the reflective element E perpendicular to a contact plane at the apex $O_E$ of the reflective curved surface of the reflective element E is the X axis (the optical axis $AX_E$ of the reflective element E is the X axis). The direction passing through the apex $O_E$ of the reflective curved surface of the reflective element E parallel to the contact plane at the apex $O_E$ of the reflective curved surface of the reflective element E is the Y axis. Accordingly, an XY coordinate system can be considered in which the apex $O_E$ of the reflective curved surface of the reflective element E, at which the X axis and the Y axis cross each other, is the origin.

Figure 6B:
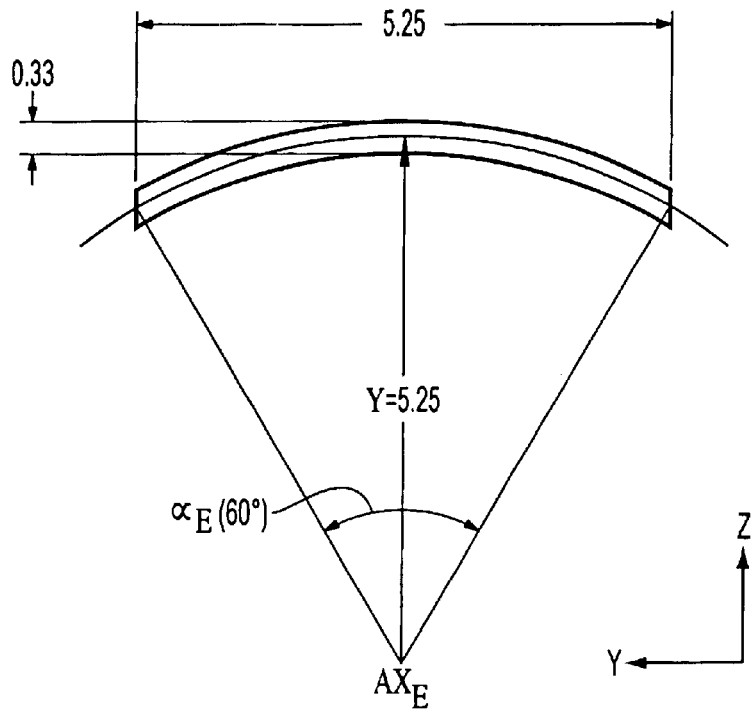
FIG. 6B is a front view of the reflective elements shown in FIG. 6A.

FIG. 6A shows a cross-sectional view of the reflective curved surface of the reflective element E within the reflective element group 2. FIG. 6B shows a front view of the reflective element E within the reflective element group 2. When the distance along the direction of the X axis (optical axis $Ax_E$) from the contact plane at the apex $O_E$ of the reflective curved surface of the reflective element E to the reflective surface (aspherical surface) of the reflective element E is x, the distance along the direction of the Y axis from the X axis (optical axis $AX_E$) to the reflective surface (aspherical surface) of the reflective element E is y, the radius of curvature (reference radius of curvature of the reflective element E) of the reference spherical surface $S_E$ passing through the apex $O_E$ of the reflective curved surface of the reflective element E is $R_E$, and aspherical coefficients are $C_2$, $C_4$, $C_6$, $C_8$, and $C_{10}$, the reflective surfaces of the respective reflective elements E forming the reflective element group 2 are constituted by aspherical surfaces expressed by the following aspherical equation.

$$x(y)=(y^2/R_E)/[1+(1-y^2/R_E^2)^{0.5}]+C_2y^2+C_4y^4+C_6y^6+C_8y^8+C_{10}y^{10}$$

$R_E=-183.3211$
$C_2=-5.37852\times10^{-4}$
$C_4=-4.67282\times10^{-8}$
$C_6=-2.11339\times10^{-10}$
$C_8=5.71431\times10^{-12}$
$C_{10}=-5.18051\times10^{-14}$ As shown in FIG. 6A, each reflective element E forming the reflective element group 2 has a reflective cross-sectional shape between a height $y_1$ from the optical axis $Ax_E$ and a height $y_2$ from the optical axis $Ax_E$ in the mirror cross-sectional direction. As shown in FIG. 6B, in the front-view direction, an arcuate aspherical decentered mirror is constituted in which an arc opening angle $\alpha_E$ is 60°, and the length between both ends of the arc is 5.25 mm. Furthermore, the height $y_1$ from the optical axis $Ax_E$ is 5.085 mm, and the height $y_2$ from the optical axis $Ax_E$ is 5.415 mm.

In this case, the light source image I formed by the reflective element E is located at a position separated from the apex $O_E$ of the reflective curved surface of the reflective element E by 76.56 mm ($=x_1$) in the direction of the optical axis $Ax_E$ of the reflective element E. In the direction perpendicular to the optical axis $Ax_E$ of the reflective element E, the light source image I is located at a position of the optical axis $Ax_E$ separated from the arc center diameter of the reflective element E by 5.25 mm. Furthermore, the position of the light source image I of the reflective element E in a direction perpendicular to the optical axis $Ax_E$ is located at a position of the optical axis $Ax_E$ separated from the arc outer diameter of the reflective element E by 5.085 mm ($=y_1$), and also at a position of the optical axis $Ax_E$ separated from the arc outer diameter of the reflective element E by 5.415 mm ($y_2$).

As shown in FIG. 2, a reflective element group 2 preferably can be structured by aligning a plurality of decentered aspherical type reflective elements E with the above-mentioned dimensions. The following is a specific numerical value example of the condenser mirror 3 when a plurality of decentered aspherical type reflective elements E with the above-mentioned dimensions are used.

Figure 7:
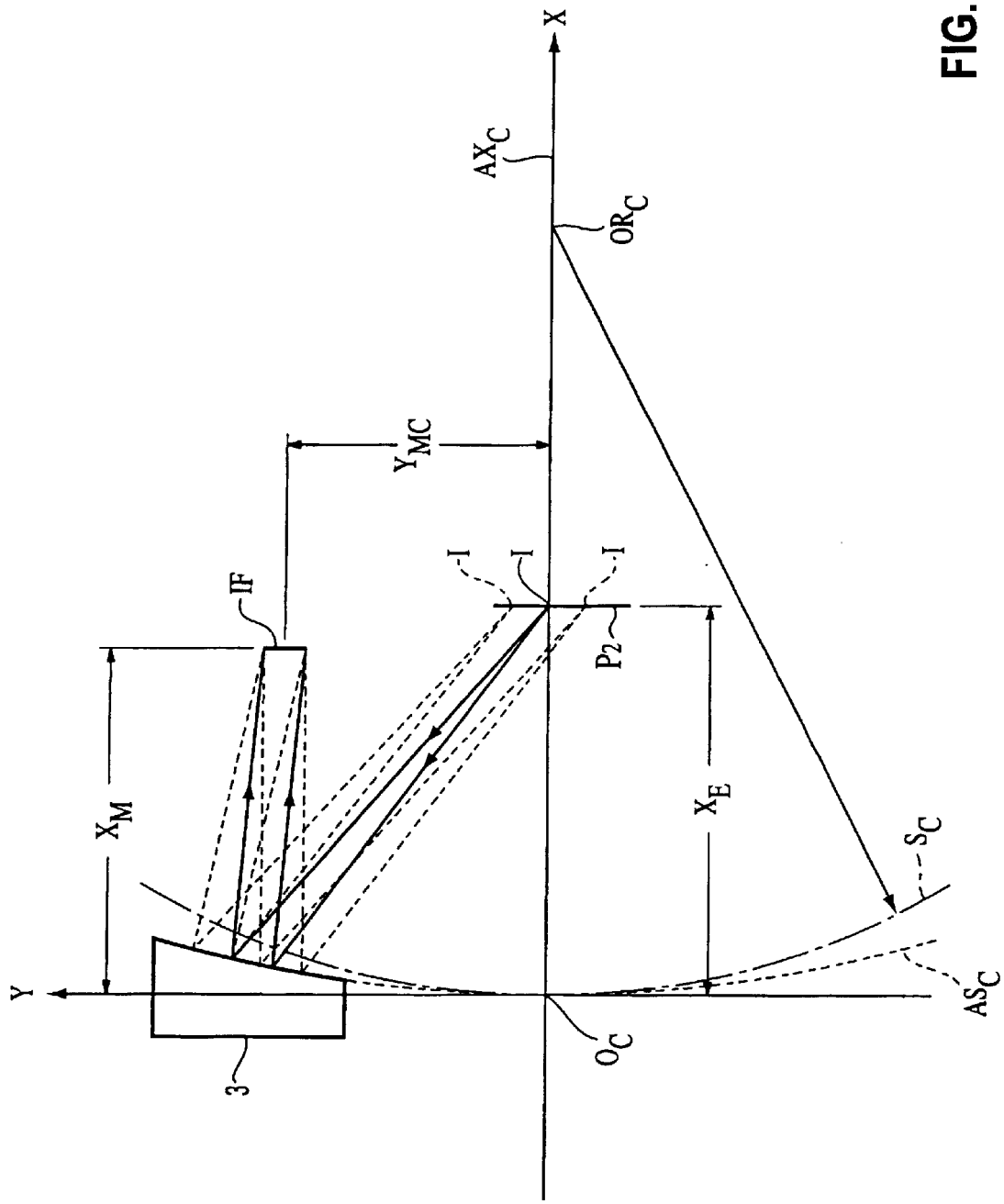
FIG. 7 is a cross-sectional view showing a cross-sectional shape of a condenser mirror when the condenser mirror has an aspherical shape.

As shown in FIG. 7, the reflective curved surface (aspherical surface) of the condenser mirror 3 is $AS_C$, a reference spherical surface at the apex $O_C$ of the condenser mirror 3 is $S_C$, the center of curvature of the reference spherical surface is $O_{RC}$ the direction passing through the apex $O_C$ of the reflective curved surface of the condenser mirror 3 and perpendicular to a contact plane at the apex $O_C$ of the reflective curved surface of the condenser mirror 3 is an X axis (the optical axis $Ax_C$ of the condenser mirror 3 is the X axis), the direction passing through the apex $O_C$ of the reflective curved surface of the condenser mirror 3 and parallel to the contact plane at the apex $O_C$ of the reflective curved surface of the condenser mirror 3 is a Y axis, and the apex $O_C$ of the reflective curved surface of the condenser mirror 3 at which the X axis and the Y axis cross each other is the origin. Thus, an XY coordinate system can be considered.

Here, FIG. 7 shows a cross-sectional view of the reflective curved surface of the condenser mirror 3. When the distance along the direction of the X axis (optical axis $Ax_C$) from the contact plane at the apex $O_C$ of the reflective curved surface of the condenser lens 3 to the reflective surface (aspherical surface) of the condenser mirror 3 is x, the distance along the direction of the Y axis from the X axis (optical axis $Ax_C$) to the reflective surface (aspherical surface) of the condenser mirror 3 is y, the radius of curvature (reference radius of curvature of the condenser mirror 3) of the reference spherical surface passing through the apex $O_C$ of the reflective curved surface of the condenser mirror 3 is $R_C$, and the aspherical coefficients are $C_2$, $C_4$, $C_6$, $C_8$, and $C_{10}$, then the reflective surface of the condenser mirror 3 is constituted by an aspherical surface expressed by the following aspherical equation.

$$x(y)=(y^2/R_C)/[1+(1-y^2/R_C^2)^{0.5}]+C_2y^2+C_4y^4+C_6y^6+C_8y^8+C_{10}y^{10}$$

$R_C=-3518.74523$
$C_2=-3.64753\times10^{-5}$
$C_4=-1.71519\times10^{-11}$
$C_6=1.03873\times10^{-15}$
$C_8=-3.84891\times10^{-20}$
$C_{10}=5.12369\times10^{-25}$ However, the light source images I formed by the reflective element group 2 are formed in the plane $P_2$ perpendicular to the optical axis $Ax_C$ of the condenser mirror 3, and the plane $P_2$ in which these light images I are formed is located at a position separated from the apex $O_C$ of the reflective curved surface of the condenser mirror 3 along the optical axis $Ax_C$ by 2009.8 mm ($x_{IC}$).

An arcuate illumination field IF in which illumination distribution and spatial coherency are uniform is formed by the decentered aspherical type condenser mirror 3 and the reflective element group 2, which is constituted by the plurality of reflective elements E with the decentered aspherical type reflective surface shown in the above-mentioned numerical value example. At this time, as shown in FIG. 7, the center $C_{IF}$ in the width direction of the arcuate illumination field IF formed by the condenser mirror 3 is located at a position separated from the apex $O_C$ of the reflective curved surface of the condenser mirror 3 by 1400 mm (=$x_M$) in the direction of the optical axis $Ax_C$ of the condenser mirror 3. It is located at a position of 96 mm (=$Y_{MC}$) from the optical axis $Ax_C$ in the height direction of the optical axis $Ax_C$ of the condenser mirror 3.

According to the above-mentioned structure, the illumination field IF in which illumination and spatial coherency are uniform can be formed on the reflective mask 5. Furthermore, when the focal length of the respective optical elements E forming the optical element group 2 is $f_F$, and the focal length of the condenser mirror 3 is $f_C$, it is preferable to satisfy the relationship of the following formula (2).

$$0.01<|f_F/f_C|<0.5 \quad (2)$$

If the upper limit of this formula (2) is exceeded, when an appropriate power is applied to the respective optical elements forming the optical element group 2, the focal length of the condenser mirror becomes excessively short. Because of this, aberration is significantly generated in the condenser mirror, so that it is difficult to form a uniform arcuate illumination field on the mask 5. In contrast, if the lower limit of formula (2) is exceeded, when an appropriate power is applied to the respective optical elements forming the optical element group, the focal length of the condenser mirror becomes too long, and the condenser mirror itself becomes too large, so that it is difficult to structure the device in a compact manner.

For example, according to the numerical value example of the condenser mirror 3 and the optical elements E forming the above-mentioned optical element group 2, corresponding values of the above-mentioned formula (2) are listed. As mentioned earlier, the radius of curvature $R_E$ of the optical elements forming the optical element group 2 is −183.3211 mm, so that the reference focal length $f_F$ of the optical element E is 91.66055 mm ($f_F=-R_E/2$). Furthermore, the radius of curvature $R_C$ of the condenser mirror 3 is −3518.74523 mm, so that the reference focal length $f_C$ of the optical element E is 1759.3726 mm ($f_C=-R_C/2$). Therefore, $|f_F/f_C|=0.052$, which satisfies the relationship shown in the above-mentioned formula. Therefore, it can be understood that the device can be formed in a compact manner while a preferable illumination field is maintained.

In the embodiment shown in FIG. 1, it is necessary to make the illumination characteristics (illumination distribution, telecentricity, and the like) suited to the photosensitive substrate 7 or the reflective mask 5 as an illuminated object.

First, with reference to FIGS. 1 and 23A–23C, adjusting principles and an adjusting mechanism for the illumination distribution of the photosensitive substrate 7 and/or the reflective mask 5 as an illuminated object are explained. Additionally, it is assumed that a light beam having a normal (Gaussian) distribution is provided from the light source 1 shown in FIG. 1.

Figure 23A:
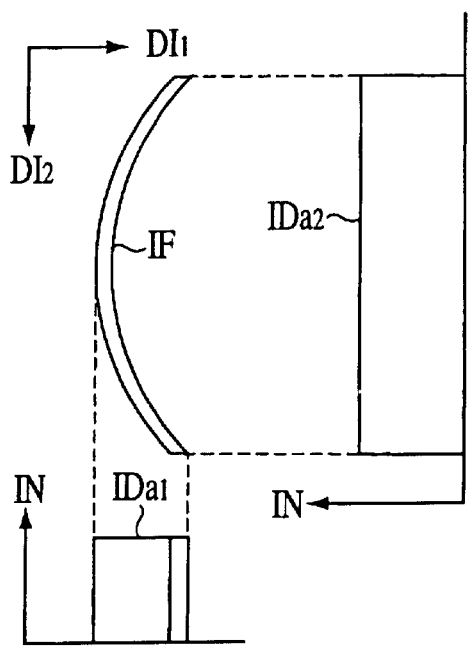
FIGS. 23A–C are diagrams explaining illumination distribution adjustment principles.
Figure 23B:
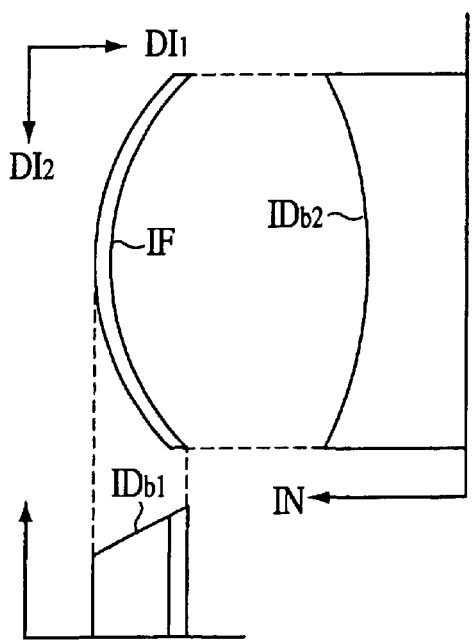
Figure 23C:
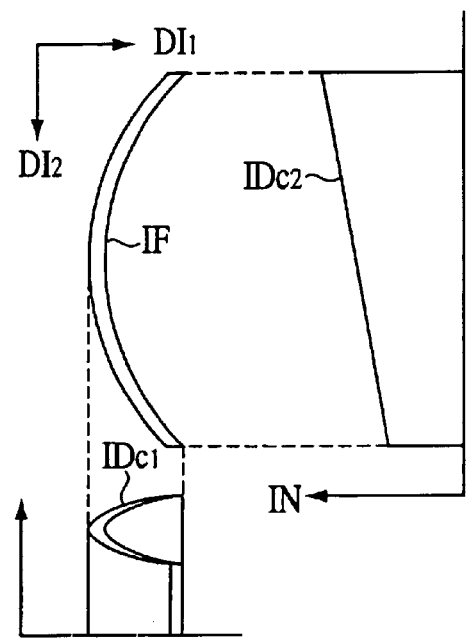

FIGS. 23A–23C show an illumination distribution (or light intensity distribution) formed in an arcuate illumination field IF on the photosensitive substrate 7 or on the reflective mask 5 in the embodiment shown in FIG. 1.

In FIGS. 23A–23C, IN shows illuminance (or light intensity), $DI_1$ shows a scanning direction (scanning exposure direction), and $DI_2$ shows a non-scanning direction (direction perpendicular to the scanning direction $DI_1$). Furthermore, in FIGS. 23A–23C, $ID_{a1}$, $ID_{b1}$, and $ID_{c1}$ show an illumination distribution in the scanning direction $DI_1$, and $ID_{a2}$, $ID_{b2}$, and $ID_{c2}$ show an illumination distribution in the non-scanning direction $DI_2$. The scanning direction $DI_1$ in FIGS. 23A–23C corresponds to the X direction in the example shown in FIG. 1, and the non-scanning direction $DI_2$ (direction perpendicular to the scanning direction $DI_1$) in FIGS. 23A–23C corresponds to the Y direction in the example shown in FIG. 1.

As shown in FIG. 23B, when a rotationally symmetrical illumination distribution $ID_{b2}$ is generated in the non-scanning direction $DI_2$ (direction perpendicular to the scanning direction $DI_1$) of the arcuate illumination field IF formed on photosensitive substrate 7 or on the reflective mask 5, the rotationally symmetrical illumination distribution $ID_{b2}$ is provided with an inclined illuminance component so as to correct an illuminance distribution $ID_{b1}$ in the scanning direction $DI_1$ (illuminance distribution inclined reversely in scanning direction $DI_1$). Accordingly, the rotationally symmetrical illumination distribution $ID_{b2}$ can be corrected (prevented).

In the embodiment shown in FIG. 1, the light source 1 is inclined by a predetermined amount about a first axis $Ax_1$ parallel to the Y direction and perpendicular to the center of the light beam (illumination optical axis $Ax_C$) at an exit side of the light source, as shown by the arrow T1. By this operation, the rotationally symmetrical illumination distribution $ID_{b2}$ shown in FIG. 23B is corrected, and as a result, the illumination distribution $ID_{b2}$ becomes flat.

Furthermore, as shown in FIG. 23C, when the inclined illumination distribution $ID_{c2}$ is .3 generated in the non-scanning direction $DI_2$ (direction perpendicular to the scanning direction $DI_1$) of the arcuate illumination field IF formed on photosensitive substrate 7 or on the reflective mask 5, the inclined illumination distribution $ID_{c2}$ is provided with an inclined illuminance component so as to correct an illuminance distribution $ID_{c2}$ in the non-scanning direction $DI_2$ (illuminance distribution inclined reversely in direction perpendicular to the scanning direction $DI_1$). Accordingly, the inclined illumination distribution $ID_{c2}$ can be corrected (prevented).

Therefore, referring to the embodiment shown in FIG. 1, the light source 1 is inclined by a predetermined amount about a second axis $Ax_2$, which is parallel to the Z direction and perpendicular to the light beam center (illumination optical axis $Ax_C$) at an exit side of the light source, as shown by the arrow T2. By this operation, the inclined illumination distribution $ID_{C2}$ shown in FIG. 23C is corrected. As a result, the illumination distribution $ID_{C2}$ becomes flat.

Furthermore, as long as a relationship is satisfied in which the first axis $Ax_1$ and the second axis $Ax_2$ are perpendicular to each other, the first axis $Ax_1$ can be set at any arbitrary position parallel to the Y axis, and the second axis $Ax_2$ can be set at any arbitrary position parallel to the X axis.

Next, the adjusting principles and adjusting mechanism that adjusts for the telecentricity of the photosensitive substrate 7 or of the reflective mask 5 are explained with reference to FIGS. 1 and 24A–24C.

Figure 24A:
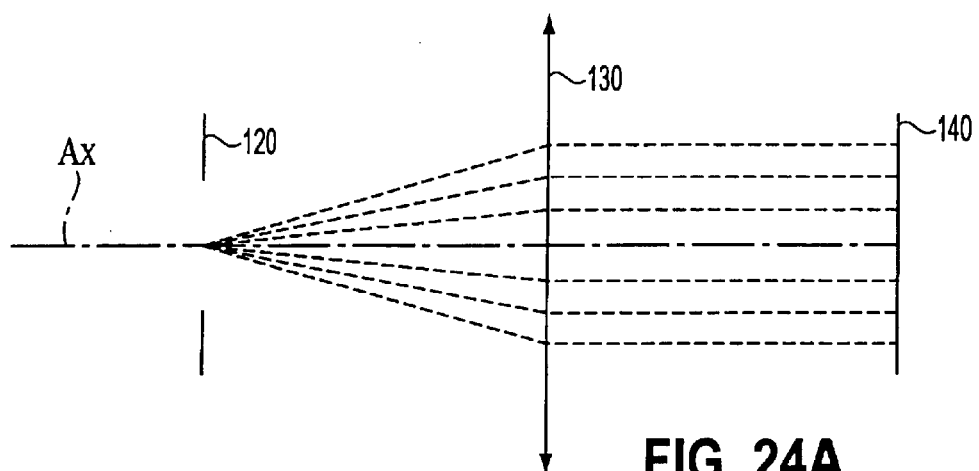
FIGS. 24A–C are diagrams explaining telecentricity adjustment principles.
Figure 24B:
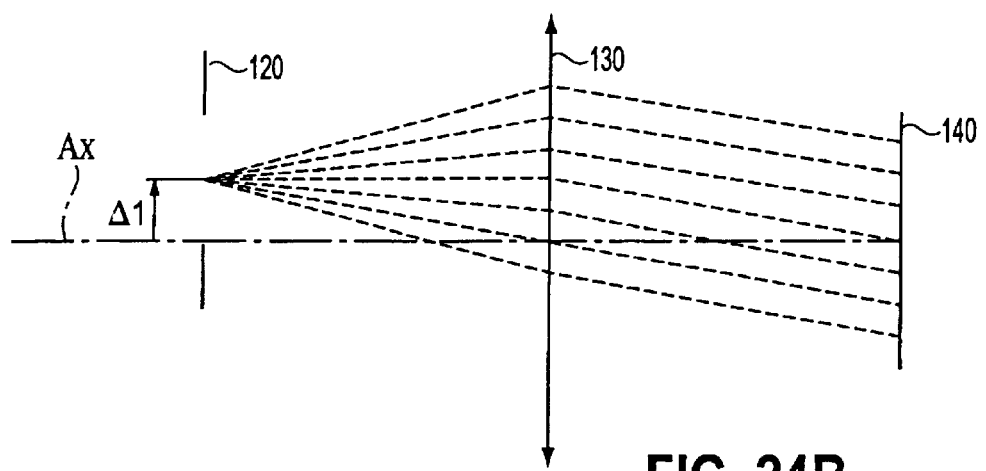
Figure 24C:
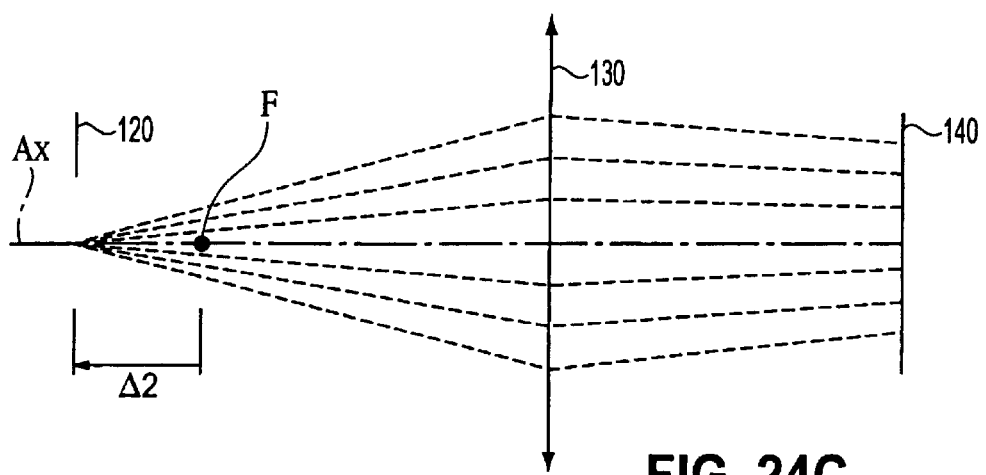

Here, FIGS. 24A–24C schematically show telecentricity (degree of perpendicularity of the principle light ray with respect to an illuminated surface or the degree of parallelism of the principle light ray with respect to the illumination optical axis) formed in the arcuate illumination field IF formed on the photosensitive substrate 7 or on the reflective mask 5 in the embodiment shown in FIG. 1. In order to simplify the explanation, FIGS. 24A–24C schematically show the embodiment shown in FIG. 1. In FIGS. 24A–24C, an aperture stop 120 that regulates the secondary light source corresponds to the reflective type optical integrator of each example, which will be described later, in the example shown in FIG. 1. The optical component 130 corresponds to the condenser mirror 3 of each example which will be described later and the example shown in FIG. 1. An illumination plane 140 corresponds to the reflective mask 5 or the photosensitive substrate 7 of each example which will be described later and the example shown in FIG. 1.

FIG. 24A shows a completely telecentric state, as the light source side focal point F of the optical component 130 matches the center of the aperture stop 120. FIG. 24B shows a state in which an oblique component is applied to the telecentricity (inclination telecentricity is generated), as the center of the aperture stop 120 is relatively decentered by a change amount $\Delta 1$ in a direction perpendicular to the optical axis Ax with respect to the light source side focal point F of the optical component 130. FIG. 24C shows a state in which telecentricity isotropically changes (magnification telecentricity is generated) according to the position from the optical axis Ax, as the light source side focal point of the optical component 130 and the center of the aperture stop 120 change by a change amount $\Delta 2$ along the optical axis.

As shown in FIG. 24B, when an oblique component is generated in the telecentricity in the arcuate illumination field IF formed on the photosensitive substrate 7 or on the reflective mask 5, the aperture stop 120 can be moved in a reverse direction (downward along a direction perpendicular to the optical axis Ax) by a change amount $-\Delta 1$ with respect to the optical component 130, in order to correct for the oblique component of telecentricity.

Therefore, in the embodiment shown in FIG. 1, by shifting the reflective type optical integrator 2 by the predetermined amount along the plane (YZ plane) perpendicular to the illumination optical axis $Ax_C$ (X direction), the oblique component of telecentricity shown in FIG. 24B can be corrected.

Furthermore, as shown in FIG. 24C, in the arcuate illumination field IF formed on the reflective mask 5 or on the photosensitive substrate 7, telecentricity isotropically changes (i.e., magnification telecentricity is generated) according to the position of the focal point along the optical axis. Thus, by shifting the aperture stop 120 in a reverse direction (the left side direction along the optical axis Ax) along the optical axis Ax by change amount $-\Delta 2$ with respect to the optical component 130, telecentricity in a reverse direction (magnification telecentric component in a reverse direction) is isotropically applied according to the position from the optical axis Ax. By this operation, change of telecentricity which is isotropically generated according to the position along the optical axis Ax can be corrected.

Therefore, in the embodiment shown in FIG. 1, by shifting the reflective type optical integrator 2 by a predetermined amount along the illumination optical axis $Ax_C$ (X direction), a change of telecentricity that is isotropically generated according to the position along the optical axis $Ax_C$ shown in FIG. 4C can be corrected.

Figure 25:
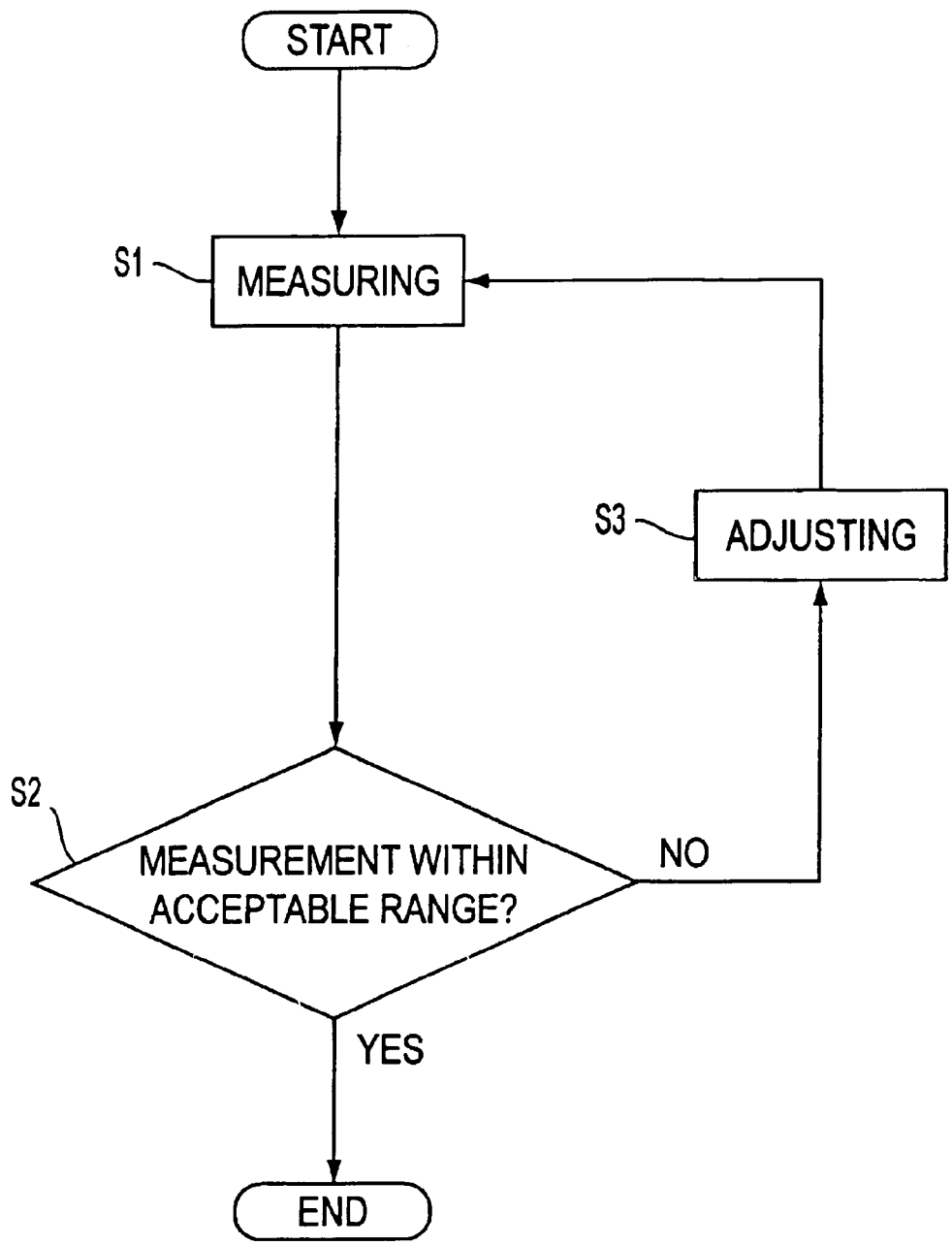
FIG. 25 is a flowchart of a process for adjusting an illumination characteristic.

Next, the following explains a process of adjusting illumination characteristics (illumination distribution, telecentricity, and the like) in the photosensitive substrate 7 (an illumination object) with reference to FIGS. 1 and 25.

(Step 1)

First, in step S1, an illumination characteristic measuring mask having a uniform reflective surface is mounted on the mask stage MS, and an optical characteristic of the surface of the photosensitive substrate 7 (image plane of the projection system 6) is measured. Furthermore, when the illumination characteristic is measured after the exposure process, the reflective mask 5 used for exposure mounted on the mask stage MS is replaced with the above-mentioned illumination characteristic measuring mask.

When setting of the illumination characteristic measuring mask on the mask stage MS is completed, a control system 8 shifts a substrate stage WS via a driving system $D_2$, and an illumination characteristic measuring sensor IS arranged at one end of the substrate stage WS is positioned in an image plane (or an exposure field) of the projection system 6. Furthermore, as the control system 8 two-dimensionally moves the substrate stage WS within the image plane (or within the exposure field) of the projection system 6 via the driving system $D_2$, the illumination characteristic measuring sensor IS detects illumination characteristic information within the image plane (or within the exposure field) of the projection system 6 in a two-dimensional matrix. Output signals from the illumination characteristic measuring sensor IS obtained for the respective positions within the image plane (or an exposure field) of the projection system 6 are input to the control system 8. With respect to the measurement result, illumination characteristic information (illumination distribution, telecentricity, and the like) within the image plane (or the within the exposure field) of the projection system 6 is displayed by a display device, which is not depicted, electrically connected to the control system 8.

(Step 2)

In step S2, the control system 8 determines whether the current illumination characteristic(s) is (are) acceptable by a process of a predetermined calculation based on the measurement result obtained in the above-mentioned step SI. If the measured illumination characteristic(s) is (are) acceptable, the flow of the adjusting process shown in FIG. 25 is completed, the illumination characteristic measuring mask mounted on the mask stage MS is replaced with the reflective mask 5 for exposure, and an exposure operation begins.

On the other hand, when the measured illumination characteristic(s) is (are) not acceptable, the process moves to step S3 for performance of an adjusting process.

(Step 3)

In step S3, the control system 8 drives at least one of the adjusting systems (driving systems) $AD_1$–$AD_4$ upon calculating the correction amount of the illumination characteristic(s) based on the measurement result obtained in the above-mentioned step S1. Accordingly, for example, correction of the illumination distribution and correction of telecentricity are performed.

Specifically, based on the output from the control system 8, the first adjusting system $AD_1$ inclines the light source 1, as shown in the arrow direction T1, using the first axis $Ax_1$ as a center of rotation. By this operation, the rotationally symmetrical illumination distribution $ID_{b2}$ along the Y direction in the arcuate illumination field IF (the exposure field of the illumination system or the exposure field of the projection system 6) formed on the substrate 7 is corrected, and the illumination distribution $ID_{b2}$ becomes flat.

Furthermore, based on the output from the control system 8, the second adjusting system $AD_2$ inclines the light source 1, as shown in the arrow direction T2, about the second axis $AX_2$. By this operation, the inclined illumination distribution $ID_{C2}$ along the Y direction in the arcuate illumination field IF (the exposure field or the exposure field of the projection system 6) formed on the substrate 7 is corrected, and the illumination distribution $ID_{C2}$ becomes flat.

Additionally, based on the output from the control system 8, a third adjusting system $AD_3$ moves (decenters) the reflective type optical integrator 2 along the plane (YZ plane) perpendicular to the illumination optical axis $Ax_C$ (X direction). By this operation, the oblique component of telecentricity is corrected.

Furthermore, based on the output from the control system 8, a fourth adjusting system $AD_4$ moves the reflective type optical integrator 2 along the illumination optical axis $Ax_C$ (X direction). By this operation, change of telecentricity which is isotropically generated according to the position along the optical axis (magnification telecentricity) is corrected.

By driving at least one of the above-mentioned first through fourth driving systems $AD_1$–$AD_4$, after correction of the illumination distribution and correction of telecentricity, for example, are completed, the process again returns to step S1, and the illumination characteristic(s) within the image plane (or the exposure field) of the projection system 6 are measured. Furthermore, by confirming the illumination characteristic(s) within the image plane (or the exposure field) of the projection system 6 in step S1, if the measured illumination characteristic(s) is (are) acceptable, the adjusting procedure of FIG. 25 is completed. Next, the illumination characteristic measuring mask mounted on the mask stage MS is replaced with the reflective mask 5 for exposure, and the exposure operation begins.

Upon confirming the illumination characteristic(s) within the image plane (or the exposure field) of the projection system 6 in step SI, if the measured illumination characteristic(s) is not acceptable, the process moves to step S3, and the adjusting process is executed. The processes of steps S1–S3 are repeated until it is determined that the illumination characteristic(s) is (are) acceptable.

The process shown in FIG. 25 is not limited to automatic control by the control system 8, but can be manually executed. For example, in the above-mentioned step S3, the control system 8 controls driving systems ($AD_1$–$AD_4$) such as motors as an adjusting system. However, rather than controlling the four adjusting systems $AD_1$–$AD_4$) by the control system 8, these four adjusting systems ($AD_1$–$AD_4$) can be mechanical or electrical adjusting mechanisms that are adjusted by an operator. In this case, based on the measurement result of step S1, the operator can correct the illumination distribution and telecentricity via the four adjusting systems ($AD_1$–$AD_4$).

Furthermore, in the measuring process of the above-mentioned step S1, an example was explained in which the illumination characteristic(s) is (are) measured in the image plane (or the exposure field) of the projection system 6 by using the illumination characteristic measuring sensor IS arranged at one end of the substrate stage WS. However, by arranging the illumination characteristic measuring sensor IS at one end of the mask stage MS, two-dimensional illumination characteristics within the illumination field IF of the illumination system (1–4) can be measured by using this illumination characteristic measuring sensor IS. In this measurement, the illumination characteristic measuring mask is not needed.

Next, with reference to FIGS. 8, 9A and 9B, 10A and 10B, and 11A and 11B, a second embodiment of this invention is explained. In the above first embodiment, an example was shown in which the multi-light source formation optical system (optical integrator) is constituted by only one reflective element group 2. However, in the second embodiment, an example will be shown in which the multi-light source optical system (optical integrator) is constituted by two reflective element groups (20a, 20b).

Figure 8:
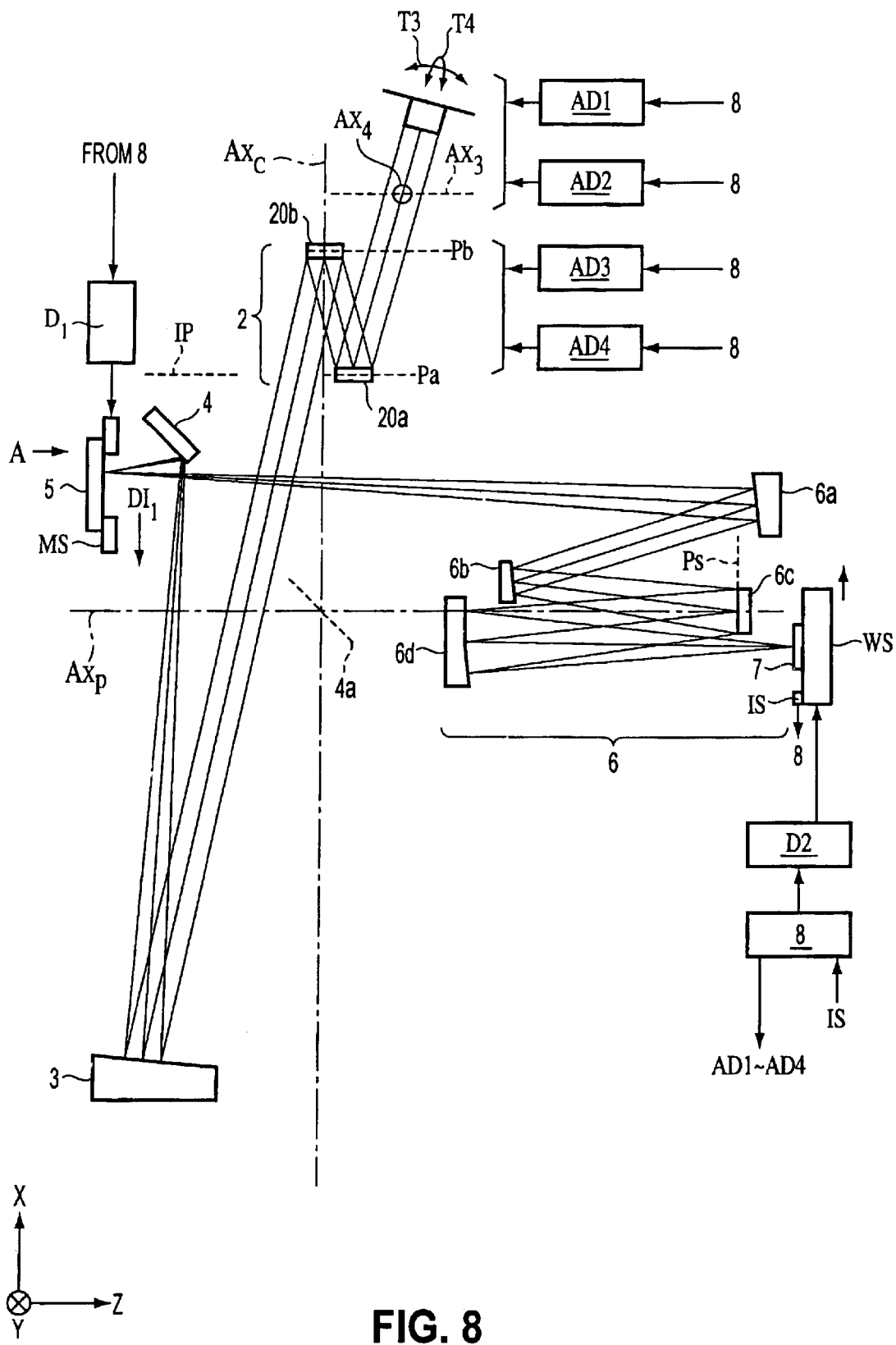
FIG. 8 is a diagram showing a schematic structure of an exposure apparatus according to a second embodiment of the invention.
Figure 9B:
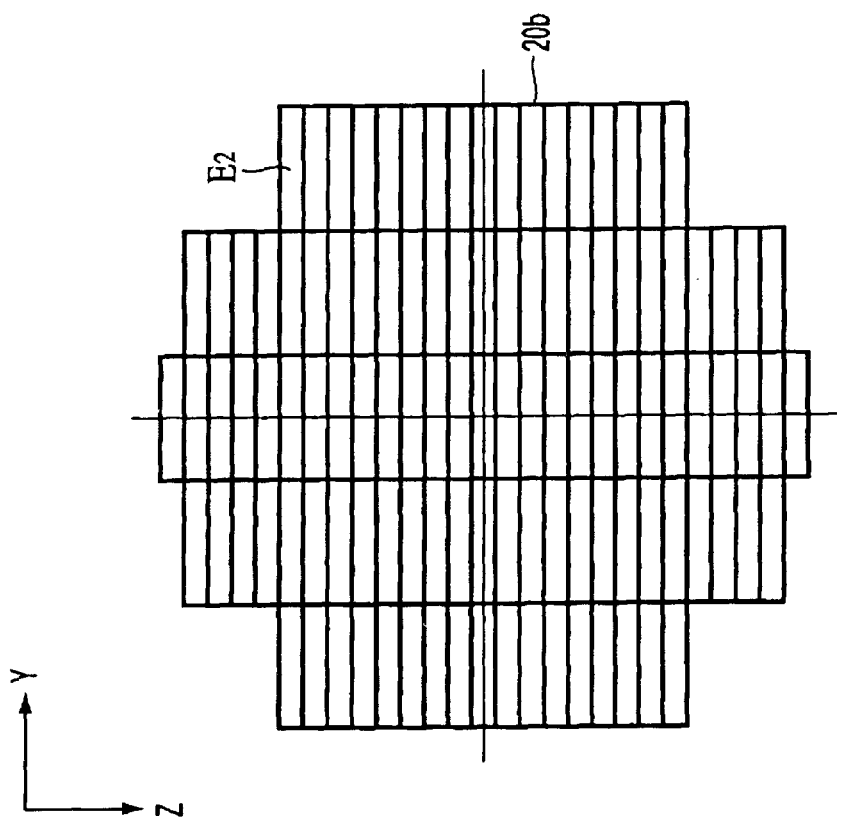
FIG. 9B is a front view showing a structure of a second reflective element group.
Figure 9A:
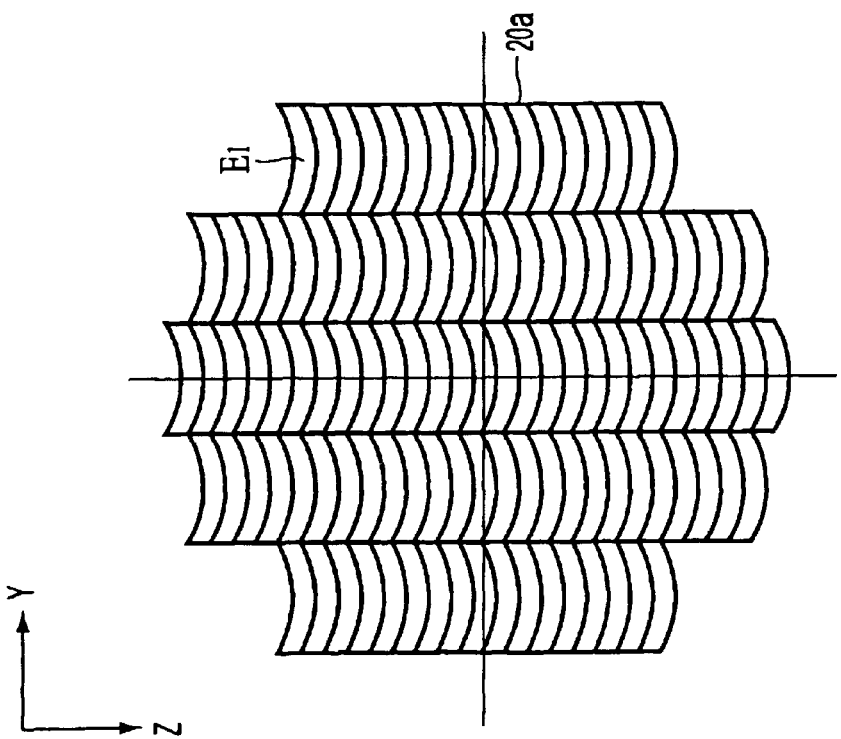
FIG. 9A is a front view showing a structure of a first reflective element group.
Figure 10A:
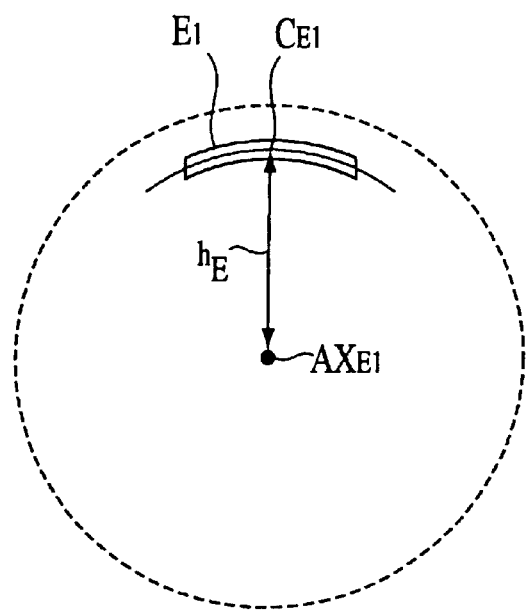
FIG. 10A is a front view showing the respective reflective elements within the first reflective element group shown in FIG. 9A.
Figure 10B:
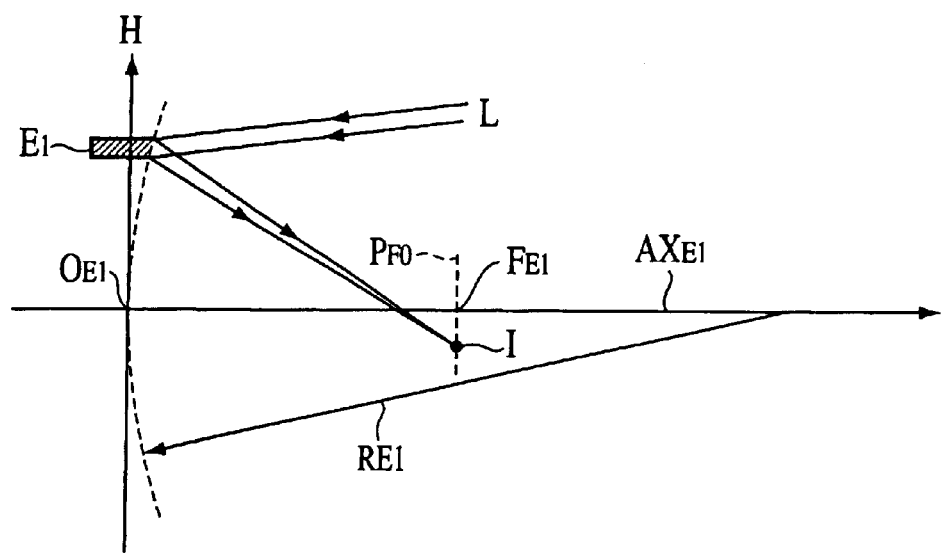
FIG. 10B is a cross-sectional view showing a cross-sectional shape of the reflective elements shown in FIG. 10A.
Figure 11A:
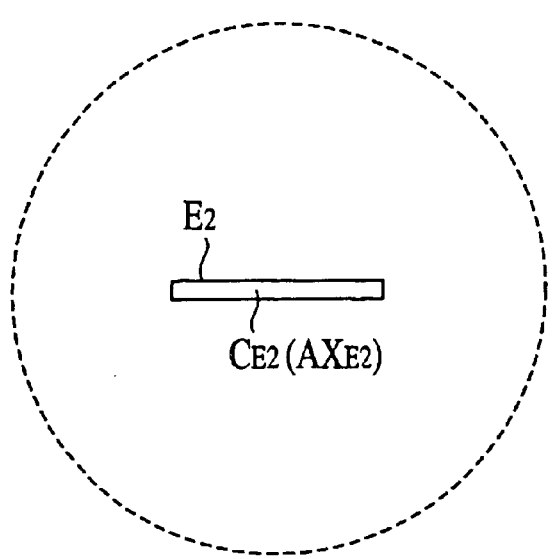
FIG. 11A is a front view showing the respective reflective elements within the second reflective element group shown in FIG. 9B.
Figure 11B:
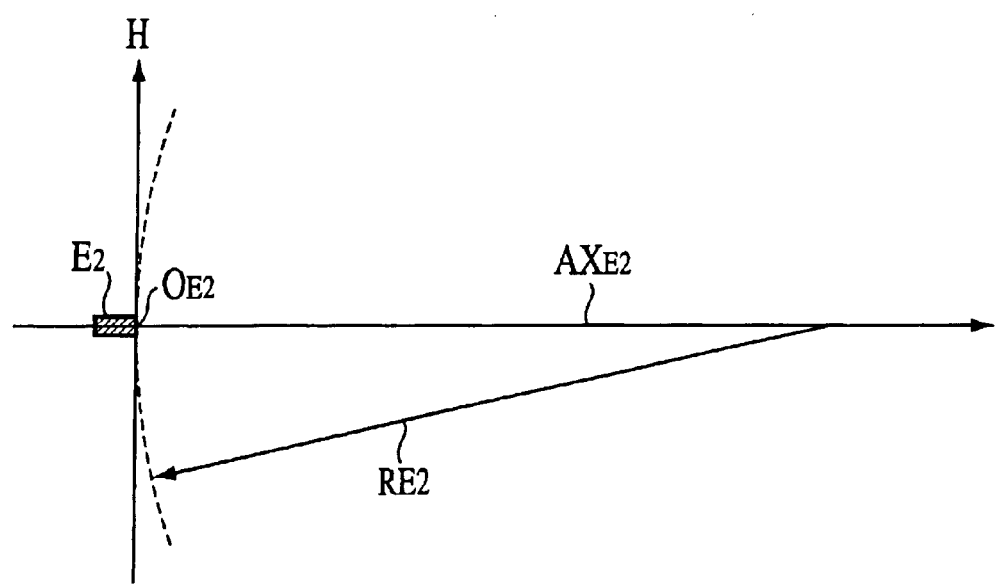
FIG. 11B is a cross-sectional view showing a cross-sectional shape of the reflective elements shown in FIG. 11A.
Figure 12:
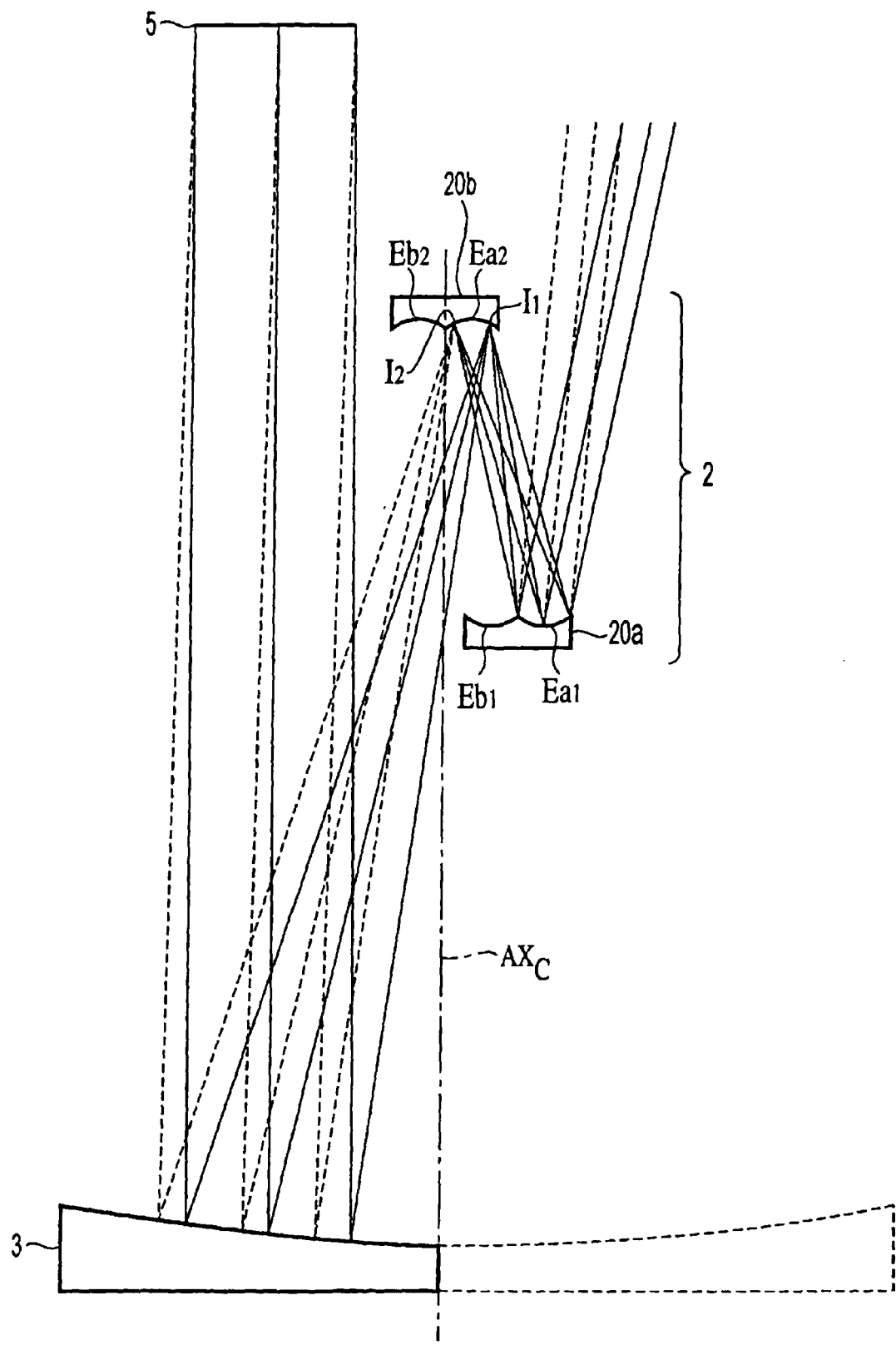
FIG. 12 is a diagram showing an operation of the first and second reflective element groups shown in FIG. 8.

FIG. 8 is a diagram showing a schematic structure of a second embodiment according to this invention. FIGS. 9A and 9B show a front view illustrating a structure of two reflective element groups (20a, 20b), which function as a multi-light source formation optical system (optical integrator). FIGS. 10A and 10B are diagrams showing a structure of the respective reflective elements $E_1$ forming the first reflective element group 20a. FIGS. 11A and 11B are diagrams showing a structure of the respective reflective elements $E_2$ forming the second reflective element group 20b. FIG. 12 is a diagram showing an operation of the two reflective element groups (20a, 20b), which function as the multi-light source formation optical system (optical integrator) shown in FIG. 8.

As shown in FIG. 8, an X-ray radiation device, which functions as a light source 1, is a synchrotron generator that provides a radiation ray having a wavelength of 10 nm–15 nm, a laser plasma X-ray source radiating an X-ray having a wavelength of 10 nm–15 nm, or the like. The radiation ray (X-ray) provided from the light source 1 is radiated toward the multi-light source formation optical system (optical integrator) 2.

The multi-light source formation optical system (optical integrator) 2 is formed by a first reflective element group 20a and a second reflective element group 20b. First, the first reflective element group 20a is explained. The first reflective element group 20a includes a plurality of first reflective elements (optical elements) $E_1$ finely arranged in a two-dimensional manner along a predetermined reference plane $P_b$ parallel to the YZ plane. Specifically, as shown in FIG. 9A, the first reflective element group 20a has a plurality of reflective elements $E_1$, each having a reflective curved surface with an outline (outer shape) in an arc shape. There are five rows of the first reflective elements $E_1$ in group 20a. Each row includes a plurality of first reflective elements aligned along the Z direction, and the rows are arranged along the Y direction. Furthermore, the five rows of first reflective elements are arranged so that group 20a has an overall substantially circular shape.

The shape (arc shape) of each reflective element $E_1$ is similar to the shape of the arcuate illumination field IF formed on the reflective mask 5 as an illumination surface which will be described later. The respective reflective elements $E_1$ have a shape in which part of a reflective curved surface of a specified radius of curvature $R_{E1}$ in a specified region decentered from the optical axis $Ax_{E1}$ is curved so that the outline shape (outer shape) becomes a arcuate as shown in FIGS. 10A and 10B. The center $C_{E1}$ of the arcuate reflective element $E_1$ is located at a height $h_E$ above the optical axis $Ax_{E1}$. Accordingly, as shown in FIG. 10B, the decentered reflective surfaces of the respective reflective elements $E_1$ are formed by a decentered spherical mirror having a specified radius of curvature $R_{E1}$.

Therefore, as shown in FIG. 10B, the radiation light (X-ray) L incident from a specified oblique direction with respect to the optical axis $Ax_{E1}$ of the reflective element $E_1$ forms a light source image I as the light is focused at the plane $P_{F0}$ (a position separated from the optical axis $Ax_{E1}$) perpendicular to the focal point $F_{E1}$ of the reflective element $E_1$. Furthermore, the focal length $f_{E1}$ of the reflective element $E_1$ at this time is the distance between the apex $O_{E1}$ of the reflective curved surface of the reflective element $E_1$ and the focal point $f_{E1}$ of the reflective curved surface of the reflective element $E_1$. If $R_{E1}$ is the radius of curvature of the reflective curved surface of the reflective element $E_1$, the relationship of the following formula (3) is established.

$$f_{E1} = -R_{E1}/2 \quad (3)$$

With reference to FIG. 8, with respect to the radiation ray (X-ray) which obliquely enters from a specified direction to the first reflective element group 20a, due to the reflective operation of the plurality of reflective elements $E_1$, arcuate light images I corresponding in number to the number of the plurality of reflective elements $E_1$ are formed at the position $P_b$ (the position of the surface of the respective reflective elements that form the second reflective element group 20b), which is shifted from the incident light beam. In other words, if the radiation light L enters from an oblique direction with respect to the respective optical axes $Ax_{E1}$ of the reflective elements $E_1$ forming the first reflective element group 20a, due to the reflective light-focusing operation of the reflective elements $E_1$, the light source images I are respectively formed at the plane $P_b$ which passes through the focal point $F_{E1}$ that exists on the respective optical axes $Ax_E$. Essentially, a plurality of secondary light sources are formed at the plane $P_b$ ($P_{F0}$ of FIG. 10B) in which the plurality of light source images I are formed.

As shown in FIG. 9B, the second reflective element group 20b is arranged at the plane $P_b$ in which the plurality of light source images I are formed. Here, with respect to the radiation light provided from the radiation light source 1, in addition to a collimated light beam, a light beam with a diverging angle of a certain range is radiated. Because of this, a certain size of light source image I is formed in the plane $P_b$ by the first reflective element group 20a. Therefore, in order to effectively use the radiation light provided from the radiation light source 1, the second reflective element group 20b functions as a field mirror group. That is, a plurality of second reflective elements $E_2$ forming the second reflective element group 20b respectively function as a field mirror.

The structure of the second reflective element group 20b is now explained. The second reflective element group 20b is formed by a plurality of second reflective elements (optical elements) $E_2$ finely two-dimensionally arranged along a specified second reference plane (the plane $P_b$ in which the light source images I are formed) parallel to the YZ plane. Specifically, as shown in FIG. 9B, the second reflective element group 20b has a plurality of reflective elements $E_2$ having a reflective curved surface with an outline (outer shape) formed in an oblong shape. Additionally, the second reflective element group 20b has five rows, arranged in the Y direction, each having a plurality of second reflective elements aligned in the Z direction. The overall shape of the group 20b is substantially circular.

That is, the plurality of second reflective elements $E_2$ forming the second reflective element group 20b are respectively aligned-so as to face the plurality of first reflective elements $E_1$, that form the first reflective element group 20a, one to one. Here, as shown in FIGS. 11A and 11B, the reflective elements $E_2$ each have a cross-sectional shape with part of the reflective curved surface of a specified radius of curvature $RE_2$ in a specified region that includes the optical axis $Ax_{E2}$ having an outline (outer shape) of an oblong shape. The center $C_{E2}$ of this oblong-shaped reflective element $E_2$ matches the optical axis $Ax_{E2}$. Accordingly, the reflective surface of the reflective elements $E_2$ is formed by a concentric spherical mirror having a specified radius of curvature $RE_2$ as shown in FIGS. 11A and 11B.

A function as a light source image formation optical system in which a plurality of light source images I are formed, that is, a multi-light source formation optical system in which a plurality of secondary light sources are formed, can be obtained by the first and second reflective element groups. The light beams from the plurality of light source images I reflected by the second reflective element group 20a are incident to the condenser mirror 3, which has the optical axis $Ax_c$, and which functions as a condenser optical system. This condenser mirror 3 is a decentered spherical mirror that is decentered with respect to the optical axis $Ax_C$. The focal point of this condenser mirror 3 matches the secondary light source plane $P_2$ in which the plurality of light source images I are formed by the second optical element group 20a. The center of curvature $O_C$ of the condenser mirror 3 exists at the center of the plurality of light source images I formed on the second reflective element group (the position at which the optical axis $Ax_C$ and the plane $P_2$ in which the light source images I are formed cross each other), or at the center of the optical element group 2.

The optical axis $Ax_C$ of the condenser mirror 3 is parallel to the respective optical axes, $Ax_{E1}$ of the plurality of optical elements $E_1$ forming the first optical element group 20a, but is not parallel to the optical axes $Ax_{E2}$ of the plurality of optical elements $E_2$ forming the second optical element group 20b. That is, the optical axes $Ax_{E2}$ of the plurality of optical elements go $E_2$ forming the second optical element group 20b are inclined at half of the entrance angle of the light beam as if the obliquely incident light beam were perpendicularly incident.

After the light beams from the plurality of light source images I reflected by the second reflective element group 20a are respectively reflected and the light is focused by the condenser mirror 3, the reflective mask 5 is superimposingly illuminated by the arcuate light images via the flat mirror 4. FIG. 4 shows an arcuate illumination field IF formed on the reflective mask 5 when it is seen from the direction shown by arrow A of FIG. 8, that is, from behind the reflective mask 5. The center of curvature $O_{IF}$ of the arcuate illumination field IF exists on the optical axis $Ax_P$ of the projection system shown in FIG. 1. Furthermore, if the flat mirror 4 of FIG. 8 is removed, the illumination region IF is formed at the position of the illumination plane IP of FIG. 8, and the center of curvature $O_{IF}$ of the illumination field IF at this time exists on the optical axis $Ax_C$ of the condenser mirror 3.

In the example shown in FIG. 8, the optical axis $Ax_C$ of the condenser mirror 3 is not deflected by 90° by the flat mirror 4; however, if the optical axis $Ax_C$ of the condenser optical system 3 were deflected by 90° by a hypothetical reflective surface 4a of the flat mirror 4 as shown in FIG. 8, the optical axis $Ax_C$ of the condenser mirror 3 would be the optical axis $Ax_P$ of the projection system 6 with respect to the reflective mask 5. Because of this, it can be said that these optical axes ($Ax_C$, $Ax_P$) are optically coaxial. Therefore, the condenser mirror 3 and the projection system 6 are arranged so that the respective optical axes ($Ax_C$, $Ax_P$) optically pass through the center of curvature OF of the arcuate illumination field IF.

A specified circuit pattern is formed in the surface of the reflective mask 5, and this reflective mask 5 is held by a mask stage MS that is two-dimensionally movable along the XY plane. Light reflected from the reflective mask 5 is imaged onto a wafer 7 coated by resist as a photosensitive substrate via the projection system 6, and an arcuate-shaped pattern image of the reflective mask 5 is projected and transferred onto the wafer 7. The wafer 7 is held by a substrate stage WS that is two-dimensionally movable along the XY plane.

The mask stage MS two-dimensionally moves along the XY plane via a first driving system $D_1$, and the substrate stage WS two-dimensionally moves along the XY plane via a second driving system $D_2$. With respect to these two driving systems ($D_1$, $D_2$), the respective driving amounts are controlled by a control system 8. Therefore, with respect to the control system 8, as the mask stage MS and the substrate stage WS are moved in opposite directions (arrow directions) via the two driving systems ($D_1$, $D_2$), the entire pattern formed on the reflective mask 5 is scanned and exposed onto the wafer 7 via the projection system 6. By this operation, a desired circuit pattern in a photolithography process of fabricating a semiconductor device is transferred onto the wafer 7, so that a desired semiconductor device can be fabricated.

The projection system 6 having the optical axis $Ax_P$ is an off-axis type reduction system with four aspherical mirrors (6a–6d) each having an effective reflective surface at a position separated from the optical axis $Ax_C$ as explained in the first embodiment. The first, third, and fourth aspherical mirrors (6a, 6c, and 6d) are concave aspherical mirrors, and the second aspherical mirror 6b is a convex aspherical mirror. The pupil position of the projection system 6 exists on the reflective surface of the third aspherical mirror 6c, and an aperture stop or the like is arranged at this pupil position $P_S$.

The following explains the first and second reflective element groups (20a, 20b) of the example shown in FIG. 8 with reference to FIG. 12. FIG. 12 is a diagram showing an enlarged portion of the illumination device which illuminates the reflective mask 5 shown in FIG. 8. In FIG. 12, to clarify the explanation, the flat mirror 4 is omitted, and the first reflective element group 20a is formed by two reflective elements ($E_{a1}$, $E_{b2}$), and the second reflective element group 20b is formed by two reflective elements ($E_{a2}$, $E_{b2}$).

The first reflective element group 20a includes two first reflective elements ($E_{a1}$, $E_{b1}$) arranged along a specified first reference plane $P_a$ located at a position optically conjugate to the reflective mask 5, or in the vicinity of the conjugate position. Furthermore, the second reflective element group 20b includes two reflective elements ($E_{a2}$, $E_{b2}$) arranged along a specified second reference plane $P_b$, located at a position optically conjugate to the pupil position of the projection system 6, or in the vicinity of the conjugate position.

As shown in FIG. 12, the radiated light (X-ray), shown by solid lines, incident to the reflective element $E_{a1}$ within the first reflective element group 20a from a certain direction is formed into arcuate light beams that correspond to an outline shape of the reflective surface of the reflective element $E_{a1}$, and the arcuate light beams (light beams shown by solid lines) form the light source image $I_1$ at one end of the reflective element $E_{a2}$ within the second reflective element group 20b by the light focusing operation of the reflective surface of the reflective element $E_{a1}$.

The radiated light (X-ray), shown by dotted lines, incident to the reflective element $E_{a1}$ within the first reflective element group 20a from another direction is formed into arcuate light beams that correspond to an outline shape of the reflective surface of the reflective element $E_{a1}$, and the arcuate light beams (light beams shown by dotted lines) form a light source image $I_2$ at another end of the reflective element $E_{a2}$ within the second reflective element group 20b by the light focusing operation of the reflective surface of the reflective element $E_{a1}$.

Thus, when the radiated light in the range of the angle shown by the solid lines and dotted lines is incident to the reflective element $E_{a1}$ within the first reflective element group 20a, a light source image extending between the light source image $I_1$ and the light source image $I_2$ is formed on the reflective element $E_{a2}$ within the second reflective element group 20b. Subsequently, the light beams from the two light source images ($I_1$, $I_2$) are focused by the reflective light focusing operation (operation of the field mirror) of the reflective element $Ea_2$ within the second reflective element group 20b. Furthermore, the light is focused by the reflective light focusing operation of the reflective surface of the condenser mirror 3, and the reflective mask 5 is arcuately illuminated by superimposed light images incident from two directions. Furthermore, the paper plane direction of FIG. 12 is a width direction of the arcuate illumination field formed on the reflective mask 5.

An optical operation by the reflective element $E_1$ within the first reflective element group 20a and the reflective element $E_{b2}$ within the second reflective element group 20b is the same as the optical operation of the reflective element $E_{a1}$ within the first reflective element group 20a and the reflective element $E_{a2}$ within the second reflective element group 20b described above, so its explanation is omitted. Thus, the light from the plurality of light source images formed by the two reflective element groups (20a, 20b) superimposingly illuminates the reflective mask 5 in an arcuate shape, so that uniform illumination can be accomplished efficiently. Additionally, the light beams from the light source images with a certain size can be effectively focused by the operation of the reflective elements E (operation of the field mirror) within the second reflective element group 20b, so that the size of the condenser mirror 3 can be made compact.

In the second embodiment shown in FIG. 8, an adjusting mechanism to improve illumination characteristics (illumination distribution, telecentricity, and/or the like) in the photosensitive substrate 7 or in the reflective mask 5 is explained. Furthermore, it is assumed that a light beam having a normal (Gaussian) intensity distribution is supplied from the light source 1 shown in FIG. 8.

First, an illumination characteristic measuring sensor IS arranged at one end of the substrate stage WS detects illumination characteristic information within the measured image plane (or exposure field) of the projection system 6. Next, the control system 8 determines whether the current illumination characteristics are acceptable based on the measurement result in the illumination characteristic measuring sensor IS. If the measured illumination characteristics are not acceptable, the control system 8 drives at least one of the first through fourth adjusting systems (driving systems $AD_1$–$AD_4$) upon calculation of the correction amount of the illumination characteristic based on the above-mentioned measurement result. Thus, correction of illumination distribution and correction of telecentricity, for example, are performed.

The first adjusting system $AD_2$ inclines the light source 1 by a specified amount about a specified third axis $Ax_3$ that is parallel to the Y axis as shown by the arrow T3 based on the output from the control system 8. By this operation, the rotationally symmetrical illumination distribution $ID_{b2}$ along the Y direction in the arcuate illumination field (the exposure field or the exposure field of the projection system 6) IF formed on the substrate 7 is corrected, and the illumination distribution $ID_{b2}$ becomes flat.

Additionally, based on the output from the control system 8, the second adjusting system $AD_2$ inclines the light source 1 by a specified amount about a fourth axis $Ax_4$ (axis parallel to the Z axis) perpendicular to the above-mentioned third axis $Ax_3$ as shown by the arrow T4. By this operation, the inclined illumination distribution $ID_{c2}$ along the Y direction in the arcuate illumination field (the exposure field or the exposure field of the projection system 6) IF formed on the substrate 7 is corrected, and the illumination distribution $ID_{c2}$ becomes flat.

Furthermore, based on the output from the control system 8, the third adjusting system $AD_3$ unitarily moves (decenters) the reflective element groups (20a, 20b) as a reflective type optical integrator 2 by a specified amount along a plane (YZ plane) perpendicular to the light beam center illumination optical axis $Ax_c$ (X axis). By this operation, the oblique component of telecentricity (inclination telecentricity) is corrected.

A Additionally, based on the output from the control system 8, the fourth adjusting system $AD_4$ unitarily moves the two reflective element groups (20a, 20b) as a reflective type optical integrator 2 in a direction (X direction) along the illumination optical axis $Ax_c$. By this operation, change of telecentricity which is isotropically generated. according to the position along the optical axis (magnification telecentricity) is corrected.

Furthermore, as long as the third axis $Ax_3$ and the fourth axis $Ax_4$ shown in FIG. 8 satisfy a relationship in which they cross each other, the third axis $Ax_3$ can be set at any arbitrary position parallel to the Y axis, and the fourth axis $Ax_4$ can be set at any arbitrary position parallel to the X axis.

Thus, by driving at least one of the first through fourth adjusting systems $AD_1$–$D_4$, illumination characteristics in the arcuate exposure field (exposure region) formed on the substrate can be suitably corrected.

Furthermore, the adjusting operation of the illumination characteristics is the same as shown in the above-described FIG. 25, so its explanation is omitted. However, without having the control system 8 shown in FIG. 8 control the four adjusting systems ($AD_1$–$AD_4$), it is also possible that the operator mechanically or electrically adjusts these four adjusting systems ($AD_1$–$AD_4$). In this case, based on the measurement result made by the illumination characteristic measuring sensor IS (illumination characteristic measuring device), the operator can correct illumination distribution and telecentricity via the four adjusting systems ($AD_1$–$AD_4$).

In FIG. 8, an example was explained in which the illumination characteristics in the image plane (or the exposure field) of the projection system 6 were measured by using the illumination characteristic measuring sensor IS arranged at one end of the substrate stage WS. However, two-dimensional illumination characteristics within the illumination region IF of the illumination systems (1–4) can also be measured by using this illumination characteristic measuring sensor IS by arranging the illumination characteristic measuring sensor IS at one end of the mask stage MS. In this measurement, the illumination characteristic measuring mask does not need to be used.

In the embodiment shown in FIG. 8, the light source images formed at the surfaces of the respective reflective elements within the second reflective element group 20b are re-imaged at the pupil position $P_s$ of the projection system 6 (the entrance pupil position of the projection system 6), so that Koehler illumination is accomplished. As shown in the above-mentioned second embodiment, for example, in order to expose a mask pattern onto the photosensitive substrate 7 by using light, such as an X-ray or the like, that has a dispersion angle and a wavelength of 100 nm or less, even if all the illumination devices and projection systems are formed by reflective type members and reflective type elements, the arcuate illumination field in which illumination is uniform on the mask can be effectively formed while the conditions of Koehler illumination can-be substantially maintained.

Figure 13:
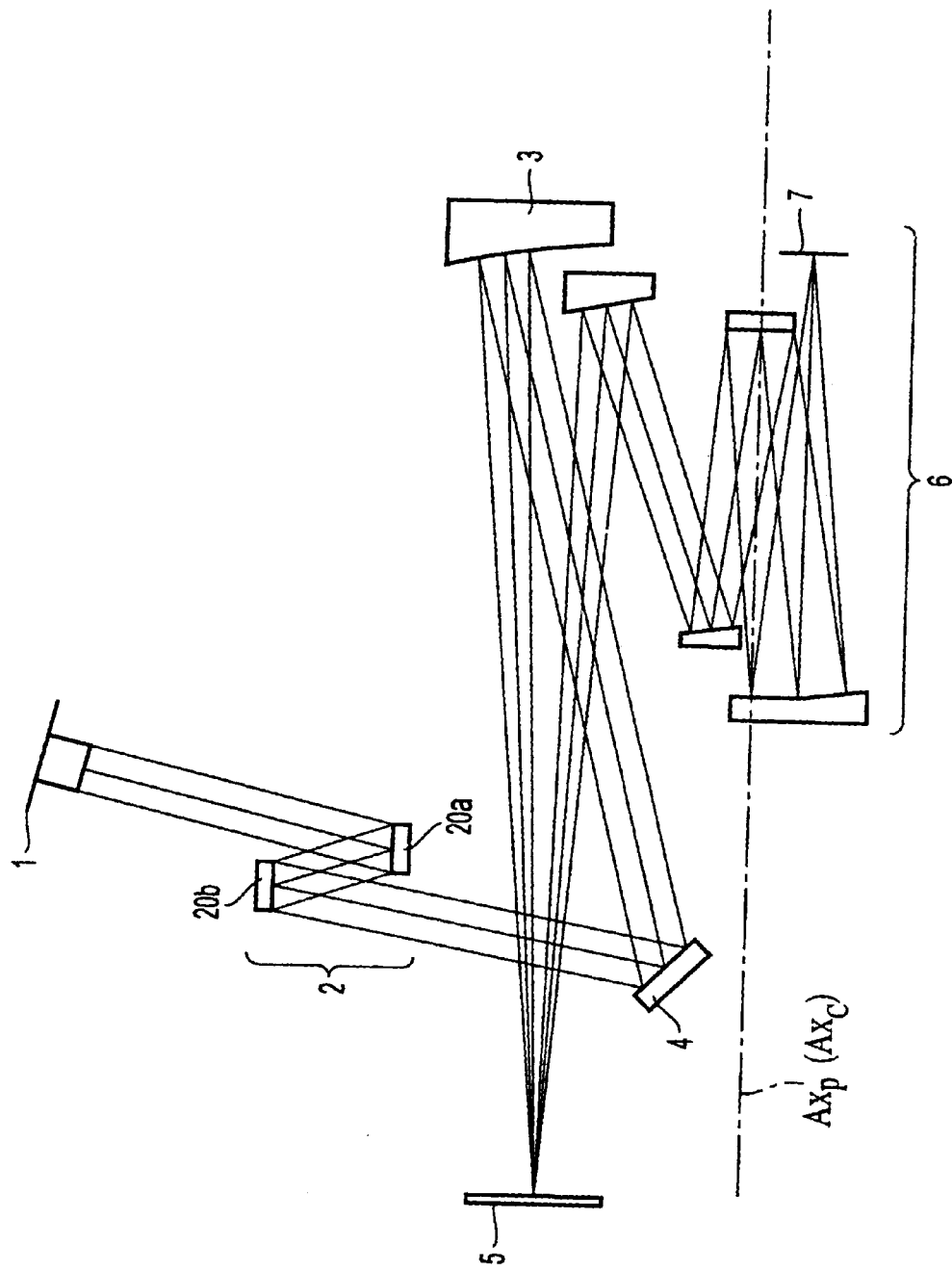
FIG. 13 is a diagram showing a modified example of an exposure apparatus according to the second embodiment shown in FIG. 8.

Additionally, in the second embodiment shown in FIG. 8, an example was described in which decentered spherical reflective surfaces were used as the condenser mirror 3 forming the condenser optical system and as the respective reflective elements ($E_1$, $E_2$) forming the first and second reflective element groups (20a, 20b). These elements also can be aspherical. Additionally, in the second embodiment shown in FIG. 8, an example was shown in which the condenser mirror 3 and the projection system 6 are arranged so that the optical axis $Ax_c$ of the condenser mirror 3 and the optical axis $Ax_p$ of the projection system 6 cross each other. However, as shown in FIG. 13, the condenser mirror 3 and the projection system 6 can also be arranged so that the optical axis $Ax_c$ of the condenser mirror 3 and the optical axis $Ax_p$ of the projection system 6 can be on the same axis by changing the arrangement of the deflecting mirror (flat mirror) 4.

Figure 14A:
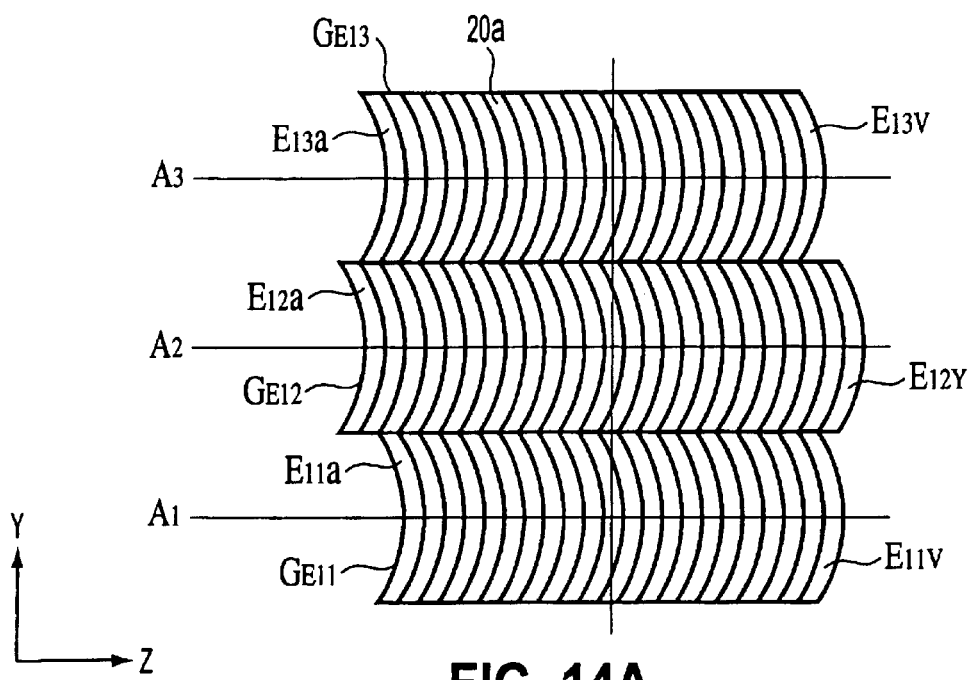
FIG. 14A is a front view showing a modified example of the first reflective element group shown in FIG. 9A.
Figure 14B:
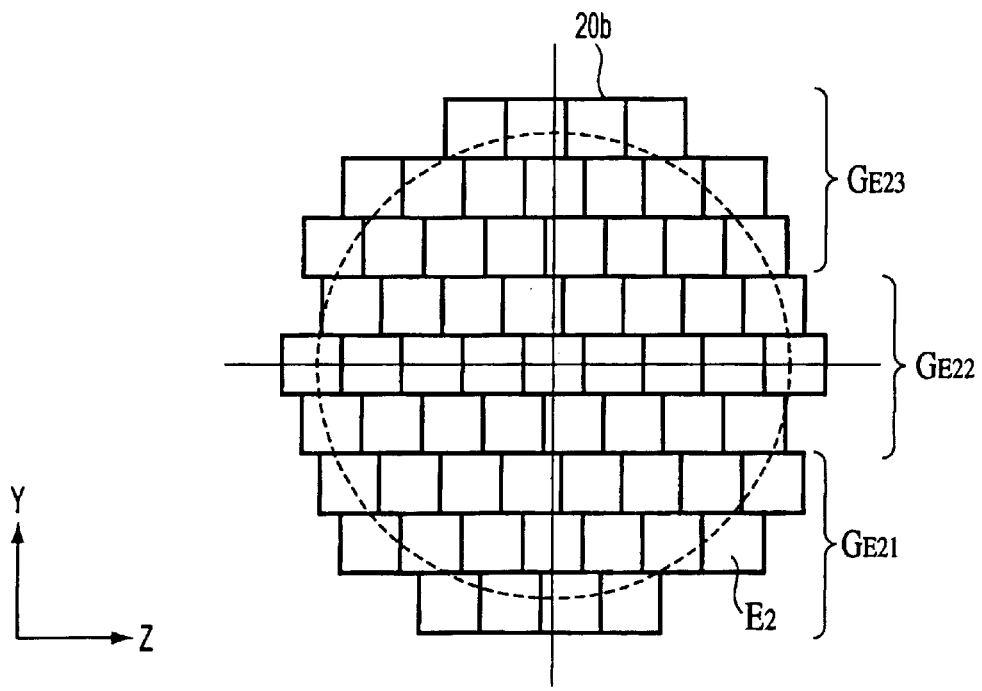
FIG. 14B is a front view showing a modified example of the second reflective element group of FIG. 9B.
Figure 15:
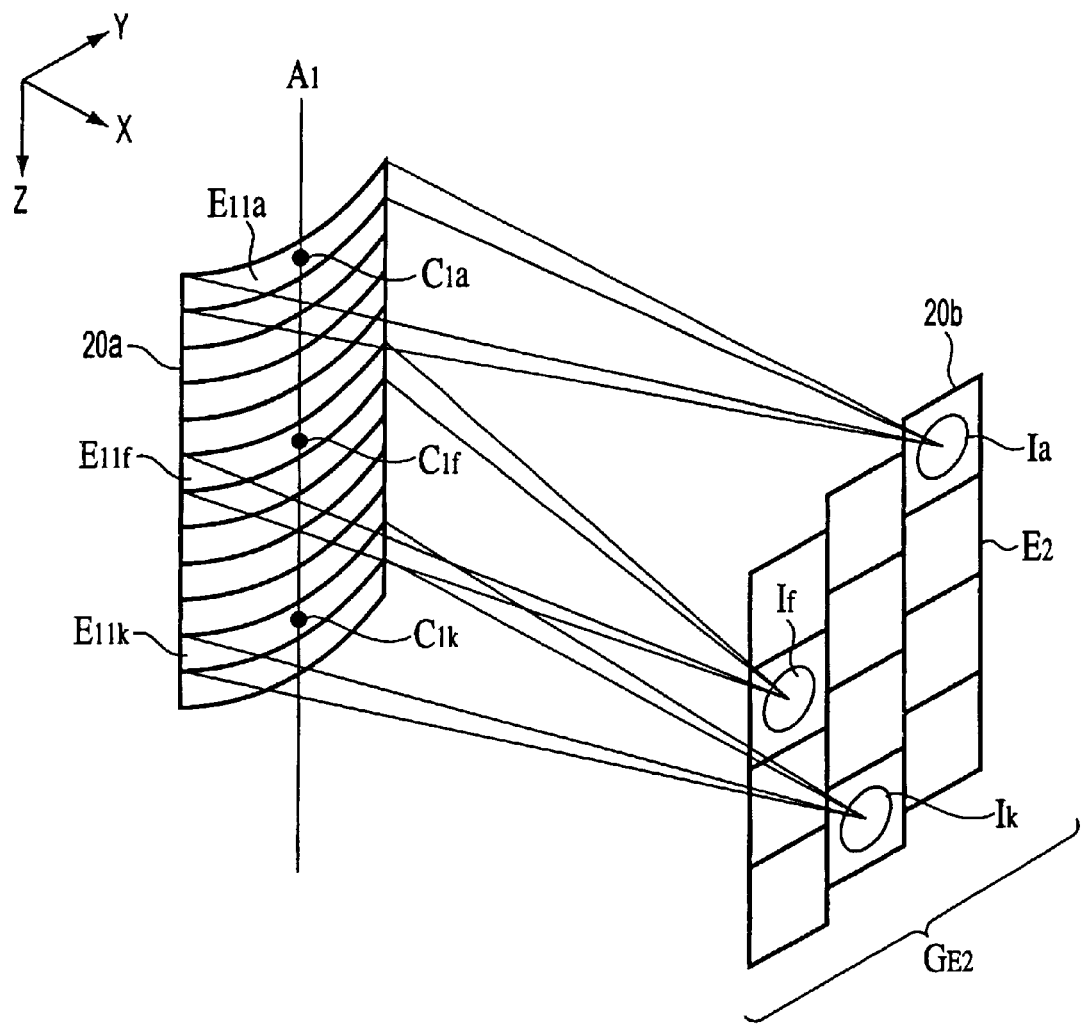
FIG. 15 is a diagram showing an operation of the first and second reflective element groups shown in FIG. 14.

Next, with the reference to FIGS. 14A, 14B and 15, a modified example of the second embodiment shown in FIG.

8 is explained. In this example, in order to further improve the illumination effectiveness in the first, and second reflective element groups (20a, 20b) shown in FIGS. 9A and 9B, the first and second reflective element groups (20a, 20b) shown in FIG. 8 have a structure shown in FIGS. 14A, 14B and 15.

First, the structure of the first reflective element group 20a is explained. As shown in FIG. 14A, the first reflective element group 20a includes three rows of second reflective elements aligned in the Y direction, each having a plurality of first reflective elements with an arcuate outline (outer shape) aligned in the Z direction. The first reflective element row $G_{E11}$ includes a plurality of reflective elements ($E_{11a}$–$E_{11v}$). With respect to the first reflective element row $G_{E11}$, arbitrary reflective elements that form the first reflective element row $G_{E11}$ are aligned in a state that is rotated by a separated amount about the axis $A_1$ parallel to the Z axis crossing the center of the first reflective element row (the center of the respective reflective elements).

The second reflective element row $G_{E12}$ includes a plurality of reflective elements ($E_{12a}$–$E_{12y}$) The second reflective element row $G_{E12}$ is aligned in a state in which arbitrary reflective elements that form the second reflective element row $G_{E12}$ are rotated by a specified amount about the axis $A_2$ parallel to the Z axis crossing the center of the second reflective element row (center of the respective reflective elements).

The third reflective element row $G_{E13}$ includes a plurality of reflective elements ($E_{13a}$–$E_{13v}$). The third reflective element row $G_{E13}$ is aligned in a state in which arbitrary reflective elements that form the third reflective element row $G_{E13}$ are rotated by a specified amount about the axis $A_3$, which is parallel to the Z axis, crossing the center of the third reflective element row (center of the respective reflective elements).

Next, the structure of the second reflective element group 20b is explained. As shown in FIG. 14B, the second reflective element group 20b has nine rows, aligned in the Y direction, of reflective elements, each having a plurality of second reflective elements $E_2$ with a substantially square-shaped outline (outer shape) aligned in the Z direction. Additionally, the second reflective element group 20b has a first group $G_{E21}$ formed by three rows of first-third reflective element rows, a second group $G_{E22}$ formed by three rows of fourth-sixth reflective element rows, and a third group $G_{E23}$ formed by three rows of seventh-ninth reflective element rows.

Here, light source images which have been focused by the respective reflective elements ($E_{11a}$–$E_{11v}$) of the first reflective element row $G_{E11}$ within the first reflective element group 20a, are respectively formed at the surface of the respective reflective elements $E_2$ forming the first group $G_{E21}$ Furthermore, light source images which have been focused by the respective reflective elements ($E_{12a}$–$E_{12y}$) of the second reflective element row $G_{E12}$ within the first reflective element group 20a are respectively formed at the surface of the respective reflective elements $E_2$ forming the second group $G_{E22}$.

Additionally, the light source images which have been focused by the respective reflective elements ($E_{13a}$–$E_{13v}$) of the third reflective element row $G_{E13}$ within the first reflective element group 20a are respectively formed at the surface of the respective reflective elements $E_2$ forming the third group $G_{E23}$. Specifically, as shown in FIG. 15, the reflective elements ($E_{11a}$–$E_{11k}$) that form the first reflective element row $G_{E11}$ are aligned in a state in which arbitrary reflective elements that form the first reflective element row $G_{E11}$ are rotated by a predetermined amount about the axis $A_1$, which is parallel to the Z axis, crossing the center of the first reflective element row (centers $C_{1a}$–$C_{1k}$ of the reflective elements).

For example, the reflective element $E_{11a}$ is fixed in a state that is rotated by a specified (small) amount about the axis $A_1$, in a right (counter-clockwise) direction, such that this reflective element $E_{11a}$ forms a circular light source image $I_a$ on the upper-most reflective element $E_2$ of the third row first group $G_{E21}$. Furthermore, the reflective element $E_{11f}$ is fixed in a state that is rotated by a specified amount about the axis $A_1$ in a left (clockwise) direction, such that the reflective element $E_{11f}$ forms a circular light source image $I_f$ on the second reflective elements $E_2$ from the top of the first row of the first group $G_{E21}$.

Additionally, the reflective element $E_{11k}$ is fixed without being rotated about the axis $A_1$, such that this reflective element $E_{11k}$ forms a circular light source image $I_f$ on the fourth reflective element $E_2$ from the top of the second row of the first group $G_{E21}$. The optical axis of the reflective element $E_{11k}$ at this time is parallel to the optical axis of the respective reflective elements forming the first part group $G_{E21}$.

The structure shown in FIG. 15 is the same with respect to the structure between the second group $G_{E22}$ and the second reflective element row $G_{E12}$ within the first reflective element group 20a and between the third group $G_{E23}$ and the third reflective element row $G_{E12}$ within the first reflective element group 20a. Thus, according to the first and second reflective elements (20a, 20b) shown in FIGS. 14 and 15, compared to the structure of the first and second reflective elements (20a, 20b) shown in FIG. 9, illumination efficiency can be improved because the peripheral portion of light source image is not shielded by the outline (outer shape) of the second reflective element.

In the first and second embodiments described above, reflective elements (E, $E_1$) having an arcuate outline (outer shape) within the first reflective element group that forms at least one part of the multi-light source formation optical system are formed by decentered mirrors which are decentered with respect to the optical axes ($Ax_E$, $Ax_{E1}$) of the elements. Accordingly, restrictive conditions can be significantly moderated with respect to the optical design compared to the case when non-decentered reflective elements are used because it is sufficient to correct aberration for only the arcuate region for a certain image height (height from the optical axes). By this operation, aberration generated in the reflective elements within the first reflective element group can be sufficiently controlled. Accordingly, there is an advantage that extremely good, uniform arcuate illumination can be realized at the illuminated surface of the mask 5 or the like.

Furthermore, by forming the condenser optical system as a decentered mirror system, aberration generated in the condenser optical system can be sufficiently controlled. Therefore, both of the above-mentioned advantages can be obtained simultaneously. Additionally, although the condenser optical system can be formed by one decentered mirror, it can also be formed by a plurality of decentered mirrors. In addition, if the condenser optical system is formed so as to incline at least one of the first reflective element group and the second reflective element group by a small amount as shown in the first and second embodiments, illumination distribution or the like in the arcuate illumination field formed on the illuminated surface can be adjusted. Furthermore, illumination distribution or the like in the arcuate illumination field can be adjusted by moving or inclining at least one decentered mirror forming the condenser optical system by a small amount in a specified direction (of the optical axis of the condenser optical system, or a direction perpendicular to the optical axis).

Furthermore, in order to form a compact device while a suitable illumination field is maintained, it is preferable that the condenser mirror 3 and the first reflective element group 20a in the second embodiment also satisfy the relationship of formula (2) described earlier. Furthermore, in each of the above-described embodiments, an example was shown in which the first optical element and the second optical element forming the multi-light source formation optical system are reflective mirrors. However, these elements can also be formed by refractive lens elements. In this case, it is preferable that the cross-sectional shape of the lens element forming the first optical element be arcuate. Additionally, in FIGS. 9 and 14 described above, the first optical element group 20a and the second optical element group 20b which are finely arranged are shown with no space between the plurality of reflective elements ($E_1$, $E_2$). However, in the second optical element group shown in FIGS. 9B and 14B, it is not necessary to finely arrange the plurality of reflective elements $E_2$ with no spaces in-between them. As described earlier, this is because a plurality of light source images are formed, corresponding to the respective reflective elements $E_2$, on the second light element group 20b or in its vicinity. Furthermore, as long as these light source images are within the effective reflective region of the respective reflective elements $E_2$, there will be no light amount loss. Accordingly, when a plurality of light source images are dispersedly formed having spaces therebetween on the second light element group 20b or in its vicinity, the plurality of reflective elements $E_2$ in the second optical element group can be dispersely arranged with spaces therebetween.

The reflective type optical integrator shown in FIGS. 1, 2, 8, 9A, 9B, 13, 14A, 14B and 15 has a structure provided with at least one reflective element group (2, 20a, 20b) in order to function so as to uniformly illuminate an illumination object (mask 5, substrate 7) or to form a secondary light source with a specified shape and size. However, instead of the reflective element group, a reflective type diffractive optical element can be used. In this case, the reflective type optical integrator can be formed by at least one reflective type diffractive optical element. Furthermore, forming the reflective type optical integrator by at least one reflective type diffractive optical element is the same as in the embodiments shown in FIGS. 16–22, which will be described below.

Figure 16:
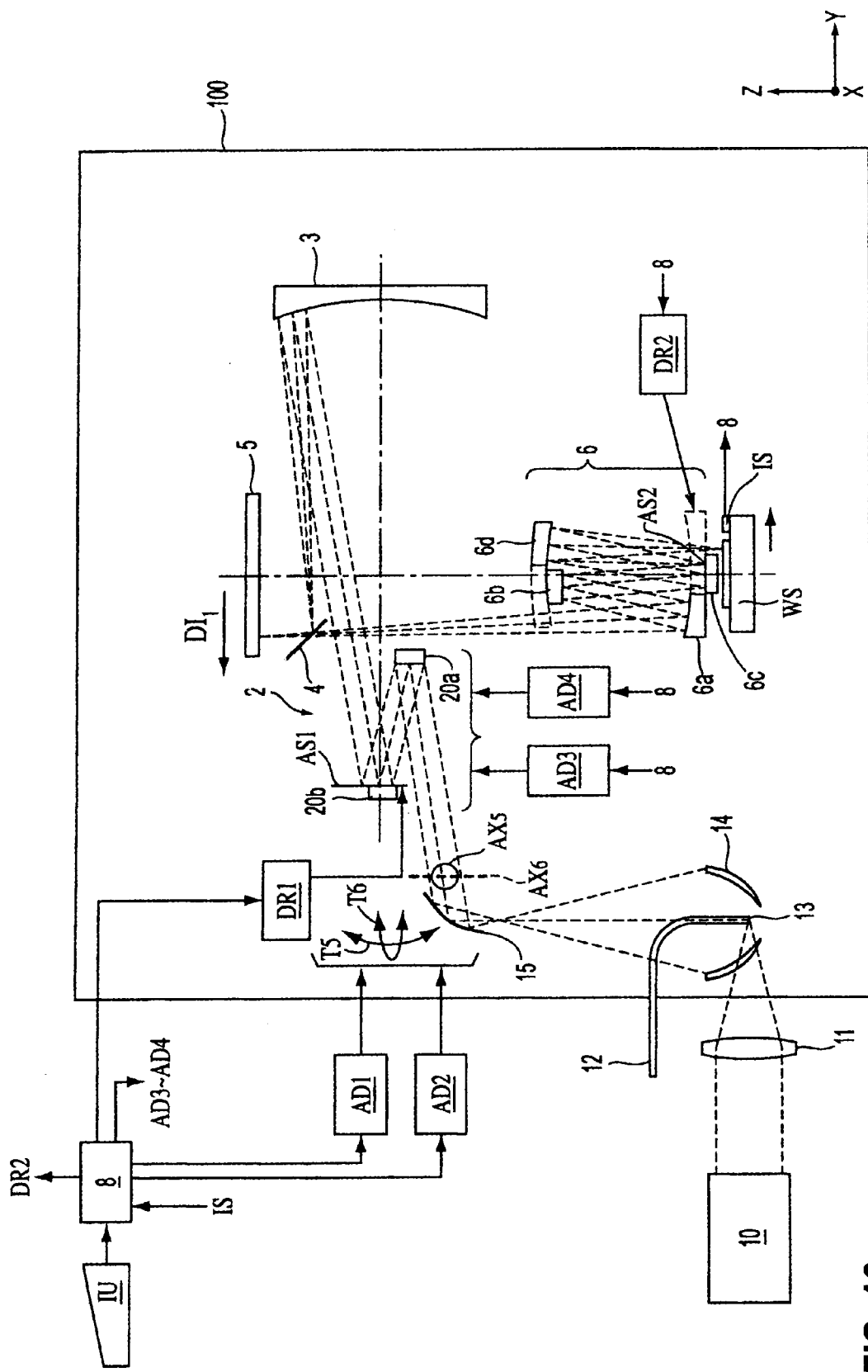
FIG. 16 is a diagram showing a modified example of an exposure apparatus according to the first embodiment shown in FIG. 1.

In FIG. 16, a modified example of a projection exposure apparatus is shown which performs an exposure operation by a step-and-scan method, related to the first embodiment shown in FIG. 1. The projection exposure apparatus shown in FIG. 16 performs an exposure operation by the step-and-scan method using light of approximately 5 nm–20 nm in a soft X-ray region (EUV light). Furthermore, in FIG. 16, the same symbols are used for the elements having the same functions shown in FIG. 1. In FIG. 16, the optical axis direction of the projection system which forms a reduced image of the mask 5 onto the wafer 7 is a Z direction, the paper plane direction perpendicular to this Z direction is a Y direction, and a direction perpendicular to the paper plane direction, which is perpendicular to the YZ plane, is an X direction. Furthermore, in the device shown in FIG. 16 and FIGS. 17 and 19–21, which will be described later, as shown in FIGS. 1 and 8, driving devices ($D_1$, $D_2$) are provided to relatively move the mask stage MS and the substrate stage WS with respect to the projection system 6; however, the mask stage MS and driving devices ($D_1$, $D_2$) are not shown in FIGS. 17 and 19–21.

As shown in FIG. 16, the exposure apparatus projects an image of part of the circuit pattern formed on the reflective mask 5 onto the wafer 7 (substrate) via the projection system 6. The mask 5 and the wafer 7 are relatively scanned in a one-dimensional direction (Y direction) with respect to the projection optical system 6, so that the entire circuit pattern of the mask 5 can be transferred to the respective plurality of shot areas on the wafer 7 by the step-and-scan method.

Transmission of the soft X-ray, which is an exposure illumination light, is low with respect to the atmosphere. Therefore, the optical path through which the EUV light passes is covered by a vacuum chamber 100 and is shielded from the atmosphere. A laser light source 10 provides infrared laser light in the visible region and can be, for example, a YAG semiconductor laser, an excimer laser, or the like. The laser light is focused by a light focusing optical component 11 to a position 13. A nozzle 12 ejects a gas medium toward the light focusing position 13, and the ejected medium receives a laser light with high illumination at the position 13. At this time, the temperature of the emitted medium becomes high due to the energy of the laser light, is activated into a plasma state, and emits the EUV light when transferred to a low potential state.

An elliptical mirror 14 is arranged in the vicinity of position 13. This elliptical mirror 14 is positioned so that its first focal point substantially matches the light focusing position 13. A multi-layer film to reflect the EUV light is arranged inside the elliptical mirror 14, and the EUV light which is reflected here passes to a parabolic mirror (collimator reflective mirror) 15 after being once focused at a second focal point of the elliptical mirror 14. This reflective mirror 15 is positioned so that its focal point substantially matches the second focal point position of the elliptical mirror 14.

The EUV light which exits from the parabolic mirror 15 passes to a reflective type fly eye optical system 2, which functions as an optical integrator, in a substantially collimated state. A light collection optical system is formed by the light focusing optical component 11, the elliptical mirror 14, and the parabolic mirror 15. The reflective type fly eye optical system 2 is formed by the first reflective element group 20a which is constituted by a collection of a plurality of reflective surfaces (reflective surfaces of a plurality of reflective elements $E_1$) and the second reflective element group 20b having a plurality of reflective surfaces (reflective surfaces of a plurality of reflective elements $E_2$) corresponding to the plurality of reflective surfaces of the first reflective element group 20a. A multi-layer film to reflect the EUV light is arranged also on the plurality of reflective surfaces that form the first and second reflective element groups 20a and 20b.

A first variable aperture stop AS1 to vary the numerical aperture of a light beam which illuminates the reflective mask 5 (numerical aperture of the illumination system) is arranged at the reflective surface position of the second reflective element group 20b which forms the reflective type fly eye optical system 2, or at a position nearby. This first variable aperture stop AS1 has a substantially circular variable aperture, and the aperture diameter of the aperture of the first variable aperture stop AS1 is varied by the first driving system DR1.

The collimated EUV light from the parabolic mirror 15 is formed by the first reflective element group 20a into a plurality of light source images as the EUV light is focused by the respective reflective surfaces. In the vicinity of the positions at which the plurality of light source images are formed, a plurality of reflective surfaces of the second reflective element group 20b are positioned, and the plurality of reflective surfaces of the second reflective element group 20b substantially function as a field mirror. Thus, based on the substantially parallel light beams from the parabolic mirror 15, the reflective type fly eye optical system 2 forms a plurality of light source images as secondary light sources.

After the EUV light from the secondary light sources formed by the reflective type fly eye optical system 2 passes to the condenser mirror 3, which is positioned so that the vicinity of the secondary light source positions is located at its focal point position, and the light is reflected and focused by the condenser mirror 3, it reaches the reflective mask 5 via an optical path folding mirror 4. A multi-layer film to reflect the EUV light is arranged on the surface of the optical path folding mirror 4 and the condenser mirror 3. As described previously, the condenser mirror 3 focuses the EUV light generated from the secondary light sources and superimposingly uniformly illuminates a specified illumination field on the reflective mask 5.

A pattern of multi-layer film that reflects the EUV light is arranged on the reflective mask 5, and the EUV light which has been reflected by the reflective mask 5 is imaged by the projection system 6, so that the image of the reflective mask 5 is transferred onto the wafer 7, which is a photosensitive substrate. In this embodiment, in order to spatially separate an optical path of the illumination light passing to the reflective mask 5 and the EUV light passing to the projection system 6 as the light is reflected by the reflective mask 5, the illumination system is a non-telecentric system, and the projection system 6 is also a non-telecentric optical system on the mask side.

Furthermore, the structure of the projection system 6 is the same as the structure of the projection system 6 shown in FIG. 1, so further explanation is omitted. A multi-layer film which reflects the EUV light is arranged on the surface of four mirrors (6a–6d) that form the projection system 6 shown in FIG. 16. The mirror 6c is arranged at the pupil position of the projection system 6, or in the vicinity thereof, in FIG. 17, and a second variable aperture stop is arranged which varies the numerical aperture of the projection system 6 at the reflective surface of the mirror 6c or in the vicinity thereof. The second variable aperture stop AS2 has a substantially circular variable aperture, and the aperture diameter of the aperture of the second variable aperture stop AS2 is varied by a second driving system DR2.

Varying the ratio between the numerical aperture of the illumination system and the numerical aperture of the projection system 6 (coherence factor or σ value) is now explained. The σ value is defined by σ=NA1/NA2 if the numerical aperture of the illumination system is NA1 and the numerical aperture of the projection system 6 is NA2. Depending on the process by which the pattern is transferred to the wafer 7 and the degree of fineness of the pattern which is transferred to the wafer 7, it is necessary to make variable the ratio between the numerical aperture of the illumination system and the numerical aperture of the projection system 6, and to adjust the resolution, the depth of focus, or the like of the projection system 6. Because of this, exposure information concerning the exposure conditions of respective wafers sequentially mounted on the wafer stage WS by a supply device, which is not shown, and mounting information of various masks sequentially mounted on the mask stage MS is input to the control device 8 via an input unit IU, such as, e.g., a console. Based on the input information from the input unit IU, every time a wafer 7 is mounted on the wafer stage WS, the control device 8 determines whether the ratio between the numerical aperture of the illumination system and the numerical aperture of the projection system 6 needs to be changed. If it is determined that the ratio between the numerical aperture of the illumination system and the numerical aperture of the projection system 6 needs to be changed, the control device 8 drives at least one of two driving systems (DR1, DR2) and varies the aperture diameter of at least one of the first variable aperture stop AS1 and the second variable aperture stop AS2. By this process, appropriate exposure can be accomplished under various exposure conditions.

In response to varying the aperture diameter of the first variable aperture stop AS1, it is desirable that the reflective mirror 15 be replaced with a reflective mirror having a different focal length. By this process, according to the size of the aperture of the first variable aperture stop AS 1, the light beam diameter of the EUV light which enters the reflective type fly eye optical system 2 can be changed, and illumination is possible under an appropriate C value while high illumination effectiveness is maintained.

With reference to the embodiment shown in FIG. 16, an adjusting mechanism to improve illumination characteristics (illumination distribution, telecentricity, or the like) on the reflective mask 5 or on the photosensitive substrate 7 is now explained.

The illumination characteristic measuring sensor IS arranged at one end of the substrate stage WS detects illumination characteristic information within the image plane (or exposure field) of the measured projection system 6. Subsequently, based on the measurement result of the illumination characteristic measuring sensor IS, the control system 8 determines, upon performing a specified calculation, whether the current illumination characteristics are acceptable. If the measured illumination characteristics are not acceptable, the control system 8 drives at least one of the first through fourth adjusting systems $AD_1$–$AD_4$ upon calculation of the correction amount of the illumination characteristics based on the measurement result. For example, the illumination distribution and telecentricity are corrected.

Based on the output from the control system 8, the first adjusting system $AD_1$, inclines the parabolic mirror 15, as shown by the arrow T5, about a fifth axis $Ax_5$, which is parallel to the X axis of the exit side of the parabolic mirror 15, by a specified amount. By this operation, the rotationally symmetrical illumination distribution $ID_{b2}$ along the Y direction in the arcuate illumination field IF (exposure region or exposure field of the projection system 6) formed on the substrate 7 is corrected, and the illumination distribution $ID_{b2}$ becomes flat.

Based on the output from the control system 8, the second adjusting system $AD_2$ inclines the parabolic mirror 15, as shown by the arrow T6, about a sixth axis $Ax_6$ (axis parallel to the Z axis) perpendicular to the fifth axis $Ax_5$ on the exit side of the parabolic mirror 15 by a specified amount. By this operation, the inclined illumination distribution $ID_{C2}$ along the Y direction in the arcuate illumination field IF (the exposure region or the exposure field of the projection system 6) formed on the substrate 7 is corrected, and the illumination distribution $ID_{C2}$ becomes flat.

Based on the output from the control system 8, the third adjusting system $AD_3$ unitarily moves (decenters) the reflective type optical integrator 2 (20a, 20b) and the first aperture stop AS1 by a specified amount along a plane (XZ plane) perpendicular to the illumination optical axis $Ax_C$ (X direction). By this operation, the oblique component of telecentricity (inclined telecentricity) can be corrected.

Based on the output from the control system 8, the fourth adjusting system $AD_4$ unitarily moves the reflective type optical integrator 2 (20a, 20b) and the first aperture stop AS1 along the illumination optical axis $Ax_C$ (Y direction) by a specified amount. By this operation, change of telecentricity which is isotropically generated according to the position along the optical axis (magnification telecentricity) can be corrected.

Furthermore, as long as the fifth axis $Ax_5$ and the sixth axis $Ax_6$ shown in FIG. 16 cross (intersect) each other, the fifth axis $Ax_5$ can be set at any arbitrary position parallel to the X axis, and the sixth axis $Ax_6$ can be set at any arbitrary position parallel to the Z axis. Furthermore, the scanning direction $DI_1$ in FIG. 23 corresponds to the Y direction in the example shown in FIG. 16, and the non-scanning direction $DI_2$ (direction perpendicular to the scanning direction $DI_1$) in FIG. 23 corresponds to the X direction in the example shown in FIG. 16.

Thus, by driving at least one of the first through fourth adjusting systems $AD_1$–$AD_4$, illumination characteristics in the arcuate exposure field (exposure region) formed on the substrate can be suitably corrected.

Furthermore, the adjusting operation of the above-mentioned illumination characteristics is the same as the adjusting operation of FIG. 25 described above, so further explanation is omitted. Without having the control system 8 shown in FIG. 16 control the four adjusting systems ($AD_1$–$AD_4$), the adjusting operation can be performed by a mechanical or an electrical adjusting mechanism in which an operator adjusts the four adjusting systems ($AD_1$–$AD_4$). In this case, based on the measurement result obtained by the illumination characteristic measuring sensor IS (illumination characteristic measuring device), the operator can correct the illumination distribution and telecentricity via the four adjusting systems ($AD_1$–$D_4$).

Additionally, in FIG. 16, an example was explained in which illumination characteristics in the image plane (exposure field) of the projection system were measured by using the illumination characteristic measuring sensor IS arranged at one end of the substrate stage WS. However, it is also acceptable to provide the illumination characteristic measuring sensor IS at one end of the mask stage MS, and to measure the two-dimensional illumination characteristics within the illumination field IF of the illumination system (1–4) by using this illumination characteristic measuring sensor IS. In this measurement, the illumination characteristic measuring mask does not need to be used.

Furthermore, in the exposure apparatus shown in FIG. 16, when the distribution is not uniform, such as when the light illumination distribution on the reflective mask 5 or the wafer 7 is inclined, the inclination of the light illumination distribution can be corrected by decentering the light beam so that the light beam, such as the EUV light or the like, which enters the reflective type fly eye optical system 2 crosses the reflective element group 20a. For example, by slightly decentering the parabolic mirror 15, the inclination of the light illumination distribution can be corrected. That is, when inclination of the light illumination distribution is generated in the right-and-left direction (X direction) of the arcuate illumination field formed on the wafer surface on the reflective mask 5, by moving the parabolic mirror 15 in the X direction, the inclination of the light illumination distribution can be corrected. Furthermore, when illumination is different between the center and the surrounding part in the width direction (Z direction) of the arcuate illumination field formed on the wafer surface or on the surface of the reflective mask 5, by moving the parabolic mirror 15 in the Z direction, the inclination of the light illumination distribution can be corrected.

Due to making at least one of the first variable aperture stop AS1 and the second variable aperture stop AS2 variable, there are cases where the illumination state may deteriorate due to generation of illumination irregularities or the like of the arcuate illumination field formed on the wafer 7 or on the mask 5. At this time, it is preferable to slightly move at least one optical component among the parabolic mirror 15, the reflective type fly eye optical system 2, and the condenser mirror 3, to correct the illumination irregularity or the like of the arcuate illumination field.

Figure 17:
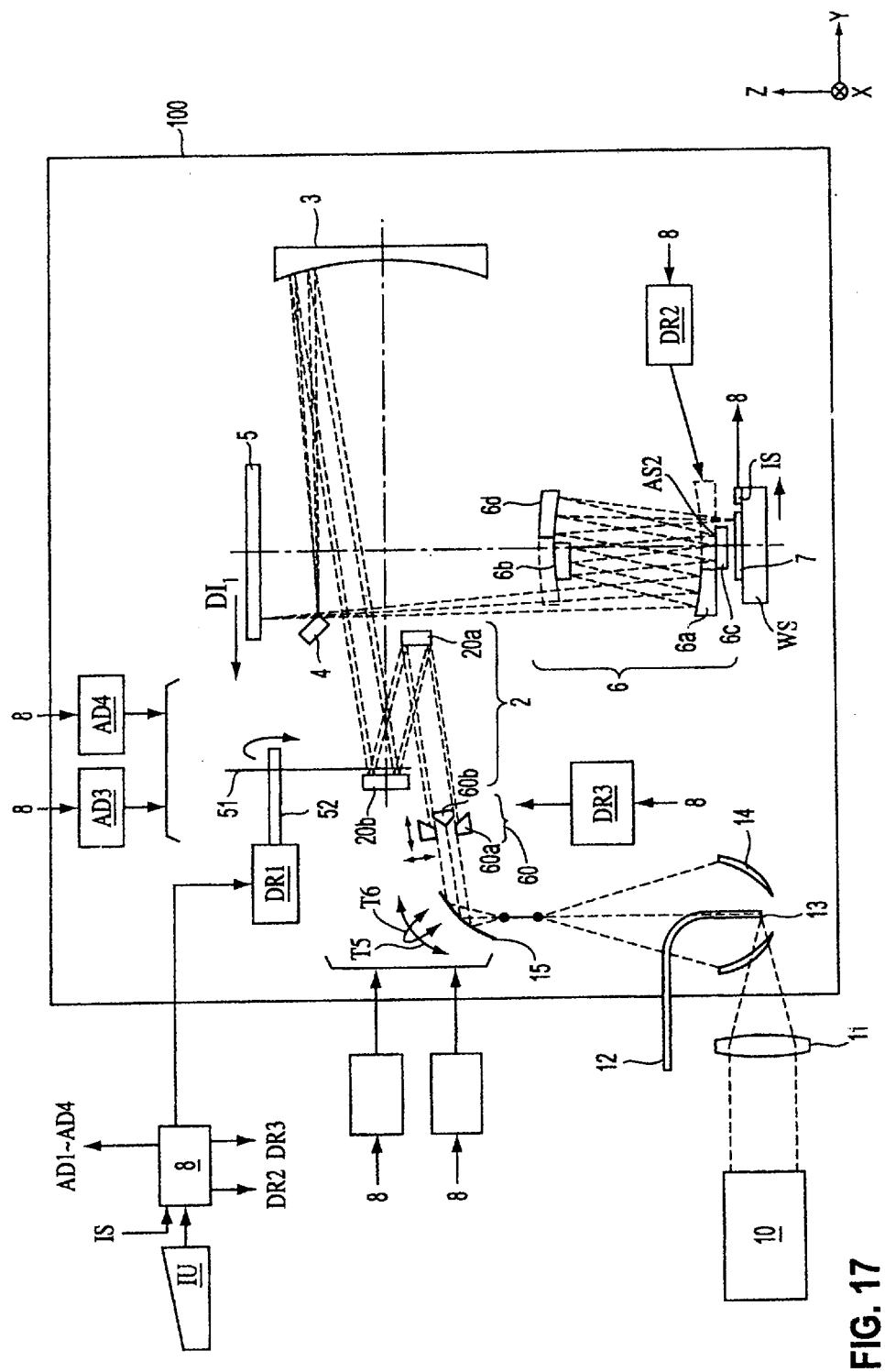
FIG. 17 is a diagram showing a first modified example of the exposure apparatus shown in FIG. 16.

FIG. 17 shows a first modified example of the projection exposure apparatus shown in FIG. 16. In FIG. 17, the elements having the same function as the elements shown in FIG. 16 are identified by the same symbols. The first difference between the exposure apparatus shown in FIG. 16 described above and the exposure apparatus shown in FIG. 17 is that, instead of the first variable aperture stop AS1 arranged at the position of or in the vicinity of the reflective surface of the second reflective element group 20b, which is one of the elements forming the reflective type fly eye optical system 2, a turret plate 51 (see FIG. 18) is provided in which different shapes and sizes of a plurality of aperture stops (50a–50f) are formed. The turret plate 51 can be rotated about a specified rotation axis 52 by the first driving system DR1.

A second difference with respect to the exposure apparatus shown in FIG. 16 is that an annular light beam converting unit 60 that converts the EUV light having a circular light beam cross section into EUV light having an annular light beam cross section is removably provided in the optical path between the parabolic mirror 15 and the first reflective element group 20a.

This annular light beam converting unit 60 has a first reflective member 60a having an annular reflective surface and a second reflective member 60b with a circular-conical reflective surface. To make the ratio variable between the inner diameter of the ring and the outer diameter of the ring of the annular EUV light that enters the reflective type fly eye optical system 2, the first reflective member 60a and the second reflective member 60b are provided so as to be relatively movable along the illumination optical path.

Figure 18:
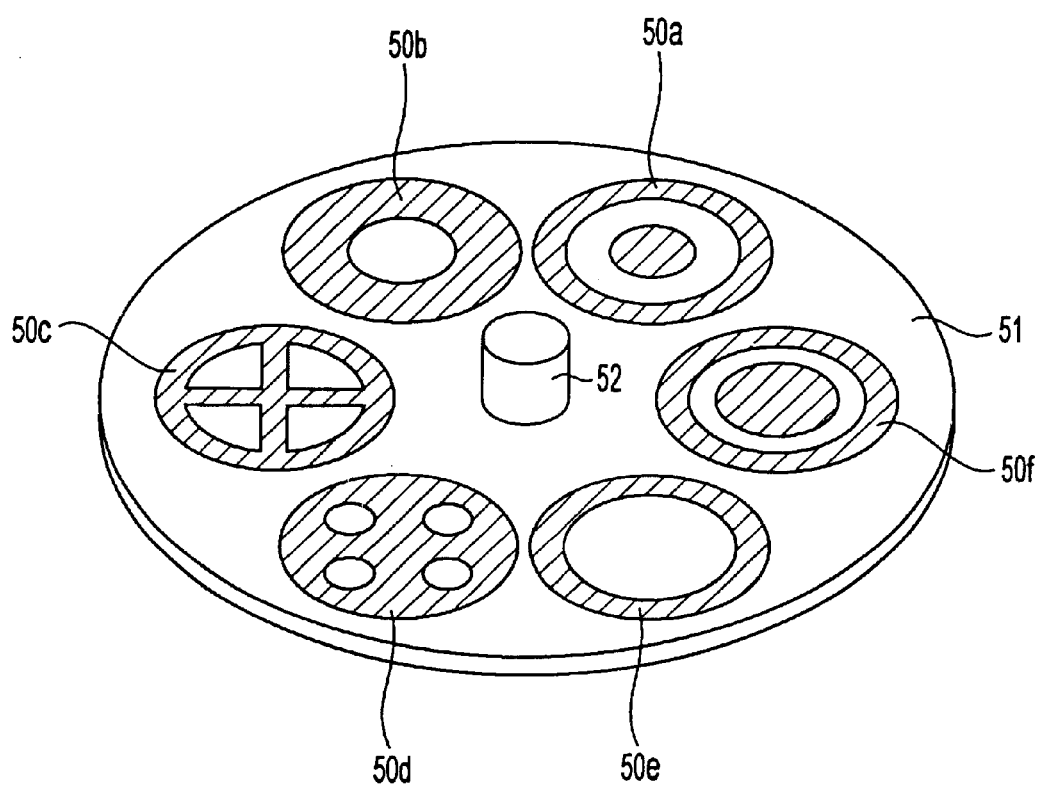
FIG. 18 is a perspective view showing a structure of a turret plate included in the FIG. 17 exposure apparatus.

Insertion and removal of the annular light beam converting unit 60 into the illumination optical path and the relative movement between the first reflective member 60a and the second reflective member 60b along the illumination optical path are performed by a third driving system DR3. With reference to FIGS. 17 and 18, the turret plate 51 and the ring light beam converting unit 60 are explained in detail.

The turret plate 51, which has a plurality of aperture stops, is rotatable about an axis 52 as shown in FIG. 18. As shown in the figure, on the turret plate 51, aperture stops 50a–50f having different shapes are arranged. The aperture stop 50a is an aperture stop having an annular aperture, and the aperture stops 50b and 50e are aperture stops having circular apertures with different diameters. The aperture stop 50c is an aperture stop including four wedge-shaped apertures, and the aperture stop 50d is an aperture stop including four round-shaped apertures. The aperture stop 50f is an aperture stop having an annular ratio (ratio between the outer diameter and the inner diameter of the annular aperture) different from the aperture stop 50a.

In FIG. 17, the input device IU inputs necessary information to select an illumination method on the mask 5 or on the wafer 7. For example, the input device IU inputs mounting information of the various masks to be sequentially mounted on the mask stage MS and exposure information (a supply map or the like of the wafers including the exposure information) related to the exposure conditions for the respective wafers to be sequentially mounted by a supply device, which is not depicted, depending on the process by which a pattern is to be transferred to the wafer 7 and the degree of fineness of the pattern which is transferred to the wafer 7.

In the example shown in FIG. 17, based on the input information from the input device IU, the control device 8 can select "first annular illumination", "second annular illumination", "first normal illumination", "second normal illumination", "first special oblique illumination", or "second special oblique illumination". Here, "annular illumination" illuminates the EUV light from an oblique direction with respect to the reflective mask 5 and the wafer 7 by making the shape of the secondary light sources formed by the reflective type fly eye optical system 2 annular. By this operation, the resolution and depth of focus of the projection system 6 are improved. By making the secondary light sources formed by the reflective type fly eye optical system 2 a plurality of dispersed decentered light sources decentered from the center by a specified distance, "special oblique illumination" illuminates the EUV light from an oblique direction with respect to the reflective mask 5 and the wafer 7 and further improves the resolution and depth of focus of the projection system 6. Furthermore, "normal illumination" illuminates the mask 5 and the wafer 7 at an appropriate cy value by making the shape of the secondary light sources formed by the reflective type fly eye optical system 2 substantially circular.

Based on the input information from the input device IU, the control device 8 controls the first driving system DR1 that rotates the turret plate 51, the second driving system DR2 that changes the aperture diameter of the variable aperture stop AS2 of the projection system 6, and the third driving system DR3 that changes a relative interval between the two reflective members (60a, 60b) in the annular light beam converting unit 60 and, which also inserts/removes the annular light beam converting unit 60 into the illumination optical path.

The following explains the operation of the control device 8. When the illumination state of the mask 5 is set at normal illumination, based on the input information from the input device IU, the control device 8 selects "first normal illumination" or "second normal illumination". Here, "first normal illumination" and "second normal illumination" have different σ values.

For example, when the control device 8 selects "first normal illumination", the control device 8 drives the first driving system DR1 and rotates the turret plate 51 so that the aperture stop 50e is positioned at a position of the secondary light sources formed at an exit side of the second optical element group 20b. Simultaneously, the control device 8 changes the aperture diameter of the second variable stop within the projection system 6 via the second driving system DR2 as needed. If the annular light beam converting unit 60 is located in the illumination optical path, the control device 8 withdraws the annular light beam converting unit 60 from the illumination optical path via the third driving system DR3. Under the setting state of the illumination system described above, if the EUV light illuminates the pattern of the reflective mask 5. the pattern of the reflective mask 5 can be exposed onto the photosensitive substrate 7 via the projection system 6 under the condition of "first normal illumination" (appropriate σ value).

Furthermore, when the control device 8 selects "second normal illumination", the control device 8 drives the first driving system DR1 and rotates the turret plate 51 so that the aperture stop 50b is positioned at a position of the secondary light sources formed at an exit side of the second optical element group 20b. Simultaneously, the control device 8 changes the aperture diameter of the second variable aperture stop within the projection system 6 via the second driving system DR2 as needed. If the annular light beam converting unit 60 is located within the illumination optical path, the control device 8 withdraws the annular light beam converting unit 60 from the illumination optical path via the third driving system DR3. Under the setting state of the illumination system described above, when the EUV light illuminates the pattern of the reflective mask 5, the pattern of the reflective mask 5 can be exposed onto the photosensitive substrate 7 via the projection system 6 under the appropriate "second normal illumination" condition (i.e., the σ value is larger than what is used during the first normal illumination).

Furthermore, as described in the examples of FIGS. 16 and 17, in response to making the aperture diameter of the first aperture stop AS1 variable, it is preferable that the reflective mirror 15 be replaced with a reflective mirror having a different focal length. By this operation, in response to the size of the aperture of the first aperture stop AS1, the light beam diameter of the EUV light which enters the reflective type fly eye optical system 2 can be changed, and illumination under the appropriate σ value becomes possible while maintaining illumination with high efficiency.

Furthermore, when the illumination of the reflective mask 5 is oblique illumination, based on the input information from the input device IU, the control device 8 selects one of "first annular illumination", "second annular illumination", "first special oblique illumination", and "second special oblique illumination". The difference between "first annular illumination" and "second annular illumination" is a different annular ratio of the annular secondary light sources. The difference between the "first special oblique illumination" and "second special oblique illumination" is a different distribution of the secondary light sources. That is, the secondary light sources in "first special oblique illumination" are distributed into four wedge-shaped regions, and the secondary light sources in "second special oblique illumination" are distributed in four circular regions.

For example, when "first annular illumination" is selected, the control device 8 drives the driving system DR1 and rotates the turret plate 51 so that the aperture stop 50a is positioned at a position of the secondary light sources formed at an exit side of the second optical element group 20b. When "second annular illumination" is selected, the control device 8 drives the driving system DR1 and rotates the turret plate 51 so that the aperture stop 50f is positioned at a position of the secondary light sources formed at an exit side of the second optical element group 20b. When "first special oblique illumination" is selected, the control device 8 drives the driving system DR1 and rotates the turret plate 51 so that the aperture stop 50c is positioned at a position of the secondary light sources formed at an exit side of the second optical element group 20b. When "second special oblique illumination" is selected, the control device 8 drives the driving system DR1 and rotates the turret plate 51 so that the aperture stop 50d is positioned at a position of the secondary light sources formed at an exit side of the second optical element group 20b.

When one of the above-mentioned four aperture stops (50a, 50c, 56d, 50f) is set within the illumination optical path, simultaneously the control device 8 changes the aperture diameter of the second variable aperture stop within the projection system 6 via the second driving system DR2 as needed. Next, the control device 8 adjusts the annular light beam converting unit 60 to locate the annular light beam converting unit 60 in the illumination optical path via the third driving system DR3. The annular light beam converting unit 60 is set, and adjustment is performed as follows.

First, when the annular light beam converting unit 60 is not located within the illumination optical path, the control device 8 locates the annular light beam converting unit 60 within the illumination optical path via the third driving system DR3. Next, the control device 8 changes a relative spacing between two reflective members (60a, 60b) within the annular light beam converting unit 60 via the third driving system DR3 so that the annular light beam is effectively guided to the aperture of one of the aperture stops within the four aperture stops (50a, 50c, 50d, 50f) located at an exit side of the second optical element group 20b. By this operation, the annular light beam converting unit 60 can convert the light beam which enters therein to an annular light beam having an appropriate annular ratio.

Through the above-mentioned setting and adjustment of the annular light beam converting unit 60, the secondary light sources formed at the reflective type fly eye optical system 2 can be annular secondary light sources having an appropriate annular ratio corresponding to the respective apertures of the four aperture stops (50a, 50c, 50d, 50f), so oblique illumination can be performed onto the reflective mask Sand on the wafer 7 under illumination with high efficiency.

When the plurality of aperture stops (50a–50f) having different shapes and sizes are located within the illumination optical path due to the rotation of the turret plate 51, there are cases in which the illumination state in the arcuate illumination field formed on the wafer 7 or on the mask 5 may change, due to illumination irregularities or the like. At such times, it is preferable to correct the illumination irregularity in the arcuate illumination field by slightly moving at least one of optical components among the parabolic mirror 15, the reflective type fly eye optical system 2, and the condenser mirror 3.

In the example shown in FIG. 17, information such as the illumination condition is input to the control device 8 via the input device IU; however, a detector can also be arranged which reads information provided on the reflective mask 5. Information concerning the illumination method can be recorded by, for example, a bar code located at a position outside the region of the circuit pattern of the reticle R. The detector reads the information relating to the illumination condition and transmits the information to the control device 8. The control device 8 controls three driving devices (DR1–DR3) as described above based on the information related to the illumination condition.

Additionally, in the example shown in FIG. 17, an aperture stop is arranged at the position of the secondary light sources formed by the reflective fly eye optical system 2. However, when illumination with aperture stops (50c, 50d) having four decentered apertures is not needed, and only "annular illumination" and "normal illumination" are performed, it is not necessary to provide all of the aperture stops in the turret plate 51, as can be easily understood from the principles of this invention.

Furthermore, in the light beam converting unit 60, by forming the reflective surface of the first reflective member 60a by two pairs of flat mirror elements diagonally arranged in an opposing manner, and by forming the reflective surface of the second reflective member 60a in a square-column manner, four decentered light beams can be formed. Thus, the secondary light sources formed by the reflective type fly eye optical system 2 can be quadrupole secondary light sources decentered from the center of the fly eye type optical system 2. Therefore, the EUV light can be guided so as to match the apertures of the aperture stops (50c, 50d) with four decentered apertures.

Referring to the embodiment shown in FIG. 17, an adjusting mechanism is now explained to suitably improve illumination characteristics (illumination distribution, telecentricity, and/or the like) on the photosensitive substrate 7 or on the reflective mask 5.

First, the illumination characteristic measuring sensor IS arranged at one end of the substrate stage WS detects illumination characteristic information within the image plane (or exposure field) of the measured projection system 6. Next, based on the measurement result in the illumination characteristic measuring sensor IS, the control system 8 determines whether the current illumination characteristics are acceptable upon performing a specified calculation. If the measured illumination characteristics are not acceptable, the control system 8 drives at least one of the first through fourth adjusting (driving) systems $AD_1$–$AD_4$ upon calculating the correction amount of the illumination characteristic based on the above-mentioned measurement result and performs, for example, correction of illumination distribution and telecentricity.

Based on the output from the control system 8, the first adjusting system $AD_1$ inclines the parabolic mirror 15, as shown by the arrow T5, by a specified amount about the fifth axis $Ax_5$, which is parallel to the X axis at an exit side of the parabolic mirror 15. By this operation, the rotationally symmetrical illumination distribution $ID_{b2}$ along the Y direction in the arcuate illumination field IF (exposure region or exposure field of the projection system 6) formed on the substrate 7 is corrected, and the illumination distribution $ID_{b2}$ becomes flat.

Based on the output from the control system 8, the second adjusting system $AD_2$ inclines the parabolic mirror 15, as shown by the arrow T6, by a specified amount about the sixth axis $Ax_6$ (axis parallel to the Z axis) perpendicular to the fifth axis $Ax_5$ on an exit side of the parabolic mirror 15. By this operation, the inclined illumination distribution $ID_{c2}$ along the Y direction in the arcuate illumination field IF (exposure region or exposure field of the projection system 6) formed on the substrate 7 is corrected, and the illumination distribution $ID_{c2}$ becomes flat.

Based on the output from the control system 8, the third adjusting system $AD_3$ unitarily moves (decenters) the reflective type optical integrator 2 (20a, 20b) and the turret plate 51 (including the first driving system $D_1$ and the rotation axis 52) along a plane (XZ plane) perpendicular to the illumination optical axis $Ax_c$ (Y direction). By this operation, the oblique component of telecentricity (inclination telecentricity) can be corrected.

Based on the output from the control system 8, the fourth adjusting system $AD_4$ unitarily moves the reflective type optical integrator 2 (20a, 20b) and the turret plate 51 (including the first driving system $D_1$ and the rotation axis 52) in the direction (Y direction) along the illumination optical axis $Ax_c$. By this operation, a change of telecentricity isotropically generated according to the position along the optical axis (magnification telecentricity) can be corrected.

As long as the fifth axis $Ax_5$ and the sixth axis $Ax_6$ are perpendicular to each other, the fifth axis $Ax_5$ can be set at any arbitrary position parallel to the X axis, and the sixth axis $Ax_6$ can be set at any arbitrary position parallel to the Z axis.

Thus, by driving at least one of the first through fourth adjusting systems AD1–AD4, illumination characteristics in the arcuate exposure field (exposure region) formed on the substrate can be suitably corrected.

The adjusting operation of the above-mentioned illumination characteristic is the same as shown in FIG. 25 described above, so further explanation is omitted. However, it is also acceptable to, rather than having the control system 8 shown in FIG. 17 control the four adjusting systems ($AD_1$–$AD_4$), provide an electrical or mechanical adjusting mechanism by which the operator can adjust the four adjusting systems ($AD_1$–$AD_4$). In this case, based on the measurement result by the illumination characteristic measuring sensor IS (illumination characteristic measuring device), the operator can correct illumination distribution and telecentricity via manually operating the four adjusting systems ($AD_1$–$AD_4$).

An example was explained in FIG. 17 in which an illumination characteristic in the image plane (or exposure field) of the projection system 6 was measured by using the illumination characteristic measuring sensor IS arranged at one end of the substrate stage WS. However, by arranging the illumination characteristic measuring sensor IS at one end of the mask stage MS, two-dimensional illumination characteristics within the illumination field IF of the illumination system (1–4) can also be measured by using the illumination characteristic measuring sensor IS. In this measurement, the illumination characteristic measuring mask sL does not need to be used.

The annular light beam converting unit 60 shown in FIG. 17 can be formed by a reflective type diffractive optical element, and the incident light can be converted to an annular light beam by a diffraction operation of the reflective type diffractive optical element. Additionally, if the annular light beam converting unit 60 is formed by a plurality of reflective type diffractive optical elements, the annular ratio can be varied. In this case, for example, the annular ratio can be changed by making the interval between the plurality of reflective type diffraction optical elements variable.

At the entrance side of the reflective type integrator 2, a quadrupole illumination reflective type diffractive optical element may be arranged as a quadrupole light beam formation unit, and the incident light can be converted into four light beams by the diffractive operation of the reflective type diffractive optical element. By this operation, quadrupole illumination, which is a special oblique illumination, can be performed. In this case, if a quadrupole light beam formation unit is formed by a plurality of reflective type diffractive optical elements, among which the spacing is relatively variable, and the incident light is converted into four light beams thereby, four light intensity distributions formed on the pupil plane can be changed in a radial direction with respect to the center of the pupil plane. Furthermore, if the annular light beam converting unit 60 and the quadrupole light beam formation unit can be removably provided in the illumination optical path, annular illumination, quadrupole illumination, or normal illumination can be selectively performed with high efficiency. Additionally, the special oblique illumination is not limited to the quadrupole illumination, but can be a multipole illumination by using a multipole light beam formation unit that converts the entrance light to a plurality of light beams (2, 4, 8, . . . 2N: N is an integer of 1 or more). In this case, it is preferable that the multipole light beam formation unit includes at least one reflective type diffraction grid.

The reflective type optical integrator can be formed by at least one reflective type diffractive optical element in addition to forming the multipole light beam formation unit by the reflective type diffractive optical elements.

Figure 19:
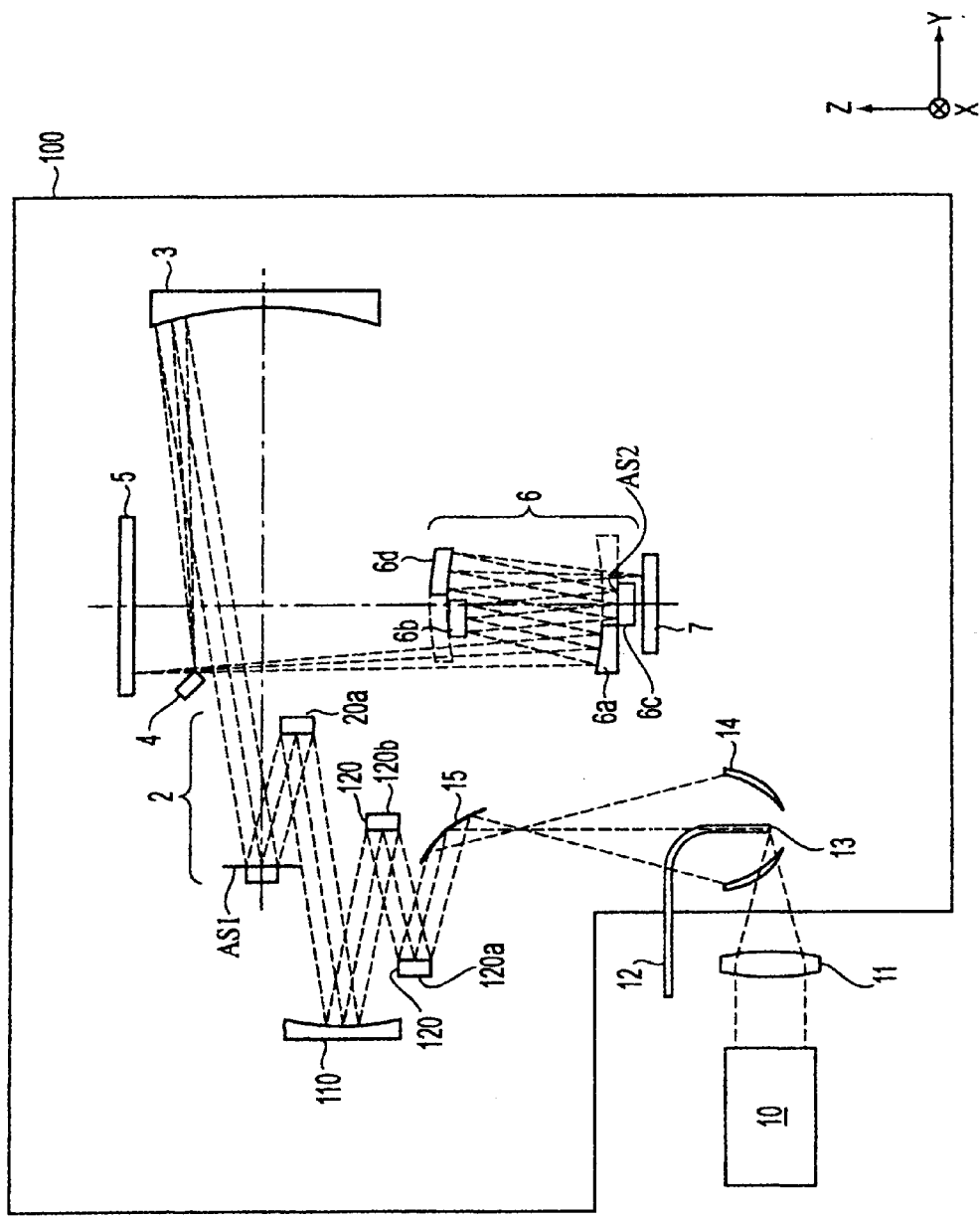
FIG. 19 is a diagram showing a second modified example of the exposure apparatus shown in FIG. 16.

With reference to FIG. 19, the following explains a second modified example of the projection exposure apparatus shown in FIG. 16. The elements having the same functions as elements in FIG. 16 are identified by the same symbols. In the device shown in FIG. 19, and FIGS. 20 and 21, which will be described later, as shown in FIGS. 16 and 17, the respective elements and systems (MS, WS, AS1 or 51, AS2, DR1, DR2, IU, 8, AD1–AD4, and IS) are provided, but these are not shown in FIGS. 19–21. In the device shown in FIGS. 19–21, the structure of the adjusting mechanism to adjust illumination characteristics (illumination distribution, telecentricity, and/or the like) on the photosensitive substrate 7 and the adjusting operation are the same as in the example shown in FIG. 16, so further explanation is omitted. However, in the device shown in FIG. 19, the magnification telecentricity adjustment made by the fourth adjusting device AD4 and the oblique telecentricity adjustment made by the third adjusting device AD3 are performed by movement of the main reflective type fly eye optical system 2 (20a, 20b) as a main reflective type optical integrator.

The difference between the exposure apparatus shown in FIG. 16 and the exposure apparatus shown in FIG. 19 is that a supplemental reflective type fly eye optical system 120, which functions as a supplemental optical integrator (supplemental multi-light source formation optical system), and a relay mirror 110, which functions as a relay optical system, are respectively arranged in the optical path between the reflective type fly eye optical system 2 and the reflective collimator mirror 15. Furthermore, from the arrangement order from the light source side, the supplemental reflective type fly eye optical system 120 is a first reflective type fly eye optical system (first optical integrator, first multi-light source formation optical system), and the main reflective type fly eye optical system 2 is a second reflective type fly eye optical system (second optical integrator, second multi-light source formation optical system). Additionally, the first and second reflective type fly eye optical systems (2, 120) can include at least one reflective type diffraction grid.

The supplemental reflective type fly eye optical system 120 shown in FIG. 19 has a first supplemental reflective element group 120a and a second supplemental reflective element group 120b. As with FIGS. 9A and 14A, it is preferable that the plurality of reflective elements $E_{120a}$ forming the first supplemental reflective element group 120a arranged at an entrance side of the supplemental reflective type fly eye optical system 120 are formed in a shape approximating the overall shape (outer shape) of the first reflective element group 20a arranged at an entrance side of the main reflective type fly eye optical system 2. However, if the plurality of reflective elements $E_{120a}$ forming the first supplemental reflective element group 120a are formed in a shape shown in FIGS. 9A and 14A, it is difficult to finely arrange the respective reflective elements $E_{120a}$ without any space therebetween. Because of this, as shown in FIG. 22A, the plurality of reflective elements $E_{120a}$ forming the first supplemental reflective element group 120a are respectively formed in a substantially square shape. Furthermore, as shown in FIG. 22A, because the cross section of the light beam which enters the first supplemental reflective element group 120a is substantially circular, the plurality of reflective elements $E_{120a}$ are arranged so that the overall shape (outer shape) of the first supplemental reflective element group 120a becomes substantially circular. Thus, the first supplemental reflective element group 120a can form a plurality of light source images (secondary light sources)

with high illumination efficiency at, or in the vicinity of, a position of the second supplemental reflective element group 120*b*.

Figure 22B:
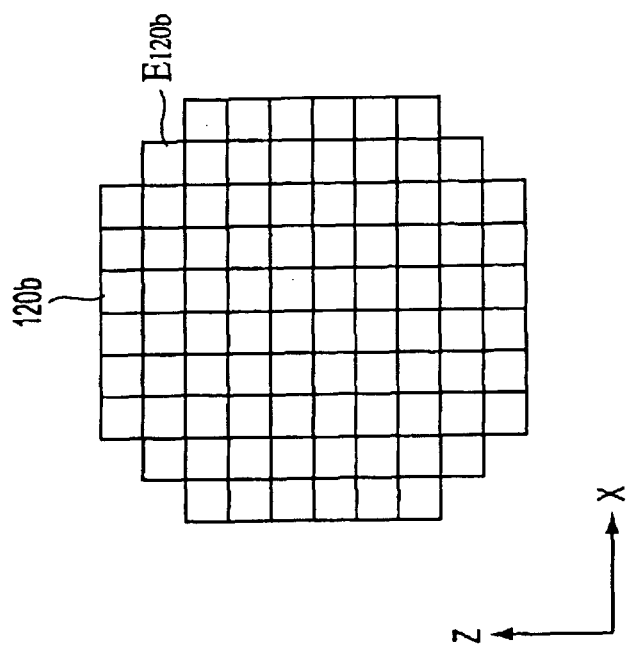
FIG. 22B is a front view showing a structure of a second supplemental reflective element group of FIG. 19.
Figure 22A:
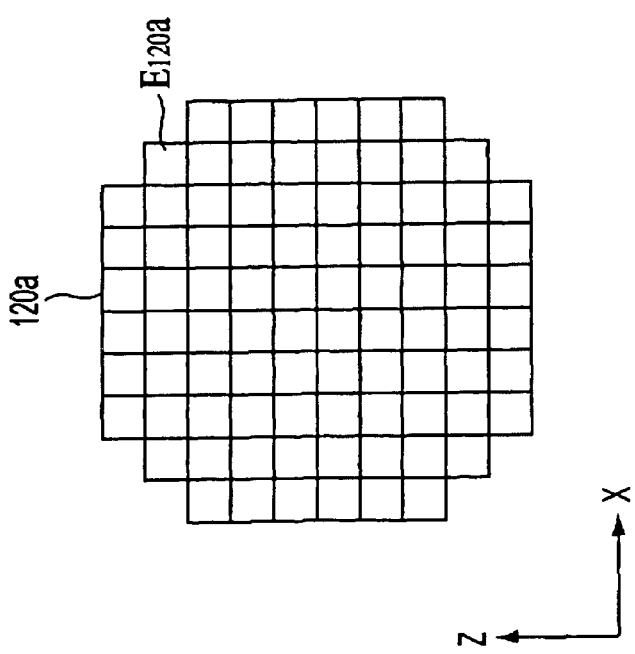
FIG. 22A is a front view showing a structure of a first supplemental reflective element group shown in FIG. 19.

Furthermore, as shown in FIG. 22B, it is preferable that the overall shape (outer shape) of the second supplemental reflective element group 120*b* arranged at an exit side of the supplemental reflective type fly eye optical system 120 is formed in a shape similar to the shape of the respective reflective elements $E_{120b}$ forming the second reflective element group 20*b* arranged at an exit side of the main reflective type fly eye optical system 2. Furthermore, it is preferable that the reflective elements $E_{120b}$ forming the second supplemental reflective element group 120*b* have shapes which receive the entire light source images or are similar to the shapes of the light source images formed by the reflective elements $E_{120a}$ within the first supplemental reflective element group 120*a* corresponding to the reflective elements $E_{120b}$.

In the example shown in FIG. 19, the main reflective type fly eye optical system 2 has the structure shown in FIGS. 14A and 14B. Thus, the plurality of reflective elements $E_2$ which form the second reflective element group 20*b* arranged at an exit side of the main reflective type fly eye optical system 2 have a substantially square shape as shown in FIG. 14B. Therefore, since the light source images formed by the plurality of reflective elements $E_{120a}$ forming the first supplemental reflective element group 120*a* within the supplemental reflective type fly eye optical system 120 are substantially circular, the shape of the respective reflective elements $E_{120b}$ of the second supplemental reflective element group 120*b* arranged at the exit side of the supplemental reflective type fly eye optical system 120 is formed to be a substantially square shape as shown in FIG. 22B. Furthermore, the shape of the reflective elements $E_2$ forming the second reflective element group 20*b* arranged at the exit side of the main reflective type fly eye optical system 2 is substantially square as shown in FIG. 14B, so the plurality of reflective elements $E_{120b}$ are arranged such that the overall shape (outer shape) of the second supplemental reflective element group 120*b* arranged at the exit side of the mn supplemental reflective type fly eye optical system 120 is substantially square as shown in FIG. 22B.

Thus, in the example shown in FIG. 19, because the first and second supplemental reflective element groups (120*a*, 120*b*) can be formed by the same reflective element groups, the fabrication cost can be controlled by using the same reflective element groups. Furthermore, the second reflective element group 20*b* on the mask side of the main reflective type fly eye optical system 120 and the condenser mirror 3 shown in FIG. 19 satisfy the relationship of condition formula (2) described earlier.

The following explains an operation in which two reflective type fly eye optical systems (2, 120) are arranged. A number of light source images corresponding to the multiple (N×M) of M reflective elements of one reflective element group forming the main reflective type fly eye optical system 2 and N reflective elements of one reflective element group forming the supplemental reflective type fly eye optical system 120 are formed at or in the vicinity of the surface of the second reflective element group 20*b*. Accordingly, at or in the vicinity of the surface of the main reflective element group 20*b*, more light source images (third light sources) are formed than the light source images (secondary light sources) formed by the supplemental reflective type fly eye optical system 120. Furthermore, the light from the third light sources from the main reflective type fly eye optical system 2 superimposingly illuminate the reflective mask 5 and the wafer in an arc shape, so illumination distribution in the arcuate illumination field formed on the reflective mask 5 and on the wafer 7 can be made more uniform in the device shown in the FIG. 19, and more stable exposure can be implemented.

A relay mirror (relay optical system) 110 arranged between the two reflective type fly eye optical systems (2, 120) focuses light beams from the plurality of light source images (secondary light sources) from the supplemental reflective type fly eye optical system 120 and guides the light beams to the main reflective type fly eye optical system 2. The relay mirror (relay optical system) 110 functions to make substantially optically conjugate the surface of the reflective element group on the light source side in the supplemental reflective type fly eye optical system 120 and the surface of the reflective element group on the light source side in the main reflective type fly eye optical system 2. Furthermore, the relay mirror (relay optical system) 110 functions to make substantially optically conjugate the surface of the reflective element group in the mask side of the supplemental reflective type fly eye optical system 120 and the surface of the reflective element group on the mask side in the main reflective type fly eye optical system 2. However, the surface of the reflective element group on the light source side in the supplemental reflective type fly eye optical system 120 and the surface of the reflective element group on the light source side in the main reflective type fly eye optical system 2 are at a position substantially optically conjugate to the mask 5 or the wafer 7 as an illumination surface. Furthermore, the surface of the reflective element group on the mask side in the supplemental reflective type fly eye optical system 120 and the surface of the reflective element group on the mask side in the main reflective type fly eye optical system 2 are located at a position substantially optically conjugate to the position of the aperture stop AS or the pupil position of the projection system 6.

In the device shown in FIG. 19, when the illumination distribution in the arcuate illumination field formed on the reflective mask 5 and the wafer is inclined, it is preferable that the supplemental reflective type fly eye optical system 120 is moved (two reflective element groups are unitarily moved). That is, when the two reflective element groups (120*a*, 120*b*) within the supplemental reflective type fly eye optical system 120 are decentered in an X direction or a Z direction, by the operation of coma of the supplemental reflective type fly eye optical system 120, the inclined component of the illumination distribution can be corrected and a flat illumination distribution can be obtained.

For example, when inclined light illumination distribution is generated in the right and left direction (X direction) of the arcuate illumination field formed on the wafer surface or on the surface of the reflective mask 5, by moving the supplemental reflective type fly eye optical system 120 in the X direction, the inclined light illumination distribution is corrected. Furthermore, when the illumination is different between the surrounding part and the center part in the width direction (Z direction) of the arcuate illumination field formed on the wafer surface or on the surface of the reflective mask 5, by moving the supplemental reflective type fly eye optical system 120 in the Z direction, the inclined light illumination distribution can be corrected.

Although the exposure apparatus shown in FIG. 19 is capable of making the light highly uniform due to the two reflective type fly eye optical systems (2, 120), there are cases in which illumination adjustment by inclination and/or movement or the like of the parabolic mirror 15 cannot be made. In this case, the condenser mirror 3 is formed by a plurality of mirrors, and by moving and/or inclining at least one of the mirrors, the inclined illumination distribution in the scanning direction (Y direction, $DI_1$ direction) and in the non-scanning direction (X direction, $DI_2$ direction) can be corrected. Furthermore, on the reflective mirror 4 arranged between the mask 5 and the condenser mirror 3, a reflective film having a reflectance characteristic (e.g., a specified reflectance characteristic according to an angle) can be formed so that illumination can be uniformly corrected on an illumination surface (the pattern surface of the mask 5 or the exposure surface of the substrate 7). Furthermore, a filter can also be arranged in the illumination optical path so that illumination can be uniformly corrected on the illumination surface (the pattern surface of the mask 5 or the exposure surface of the substrate 7).

In order to normally form the image of the reflective mask 5 on the wafer 7 by the exposure apparatus shown in FIG. 19, it preferable that the image of the exit pupil of the illumination system (the image of the third light source formed by the second reflective type fly eye optical system 2) is formed in a non-aberrated state at the center of the entrance pupil of the projection system 6. If this condition is not satisfied, it is preferable that telecentricity of the illumination system is adjusted by moving the position of the exit pupil of the illumination system, thereby adjusting the position of the entrance pupil of the projection system 6. For example, by unitarily moving the main reflective type fly eye optical system (two reflective element groups 20a, 20b) 2 and the first aperture stop AS1, telecentricity of the illumination system is adjusted, and the center of the image of the exit pupil of the illumination system can be matched with the center of the entrance pupil of the projection system 6. However, if there is no need for arranging the aperture stop AS1 at the position of the third light source formed by the main reflective type fly eye optical system 2, it is sufficient to unitarily move the two reflective element groups (20a, 20b) within the main reflective type fly eye optical system 2.

Additionally, in the example shown in FIGS. 16 and 17, in order to match the image of the exit pupil of the illumination system with the center of the entrance pupil of the projection system 6, the center of the image of the exit pupil of the illumination system can be matched with the center of the entrance pupil of the projection system 6 by unitarily moving the reflective type fly eye optical system (the two reflective element groups 20a, 20b) 2 and the first aperture stop AS1. Furthermore, if there is no need for arranging the aperture stop AS1 at the position of the secondary light source formed by the reflective type fly eye optical system 2 shown in FIGS. 16 and 17, it is sufficient to unitarily move the two reflective element groups (20a, 20b) within the reflective type fly eye optical system.

In the example shown in FIGS. 16, 17, and 19, the light source parts (10–15) which provide the EUV light to the reflective type fly eye optical system 2 require a significant volume, so there is a possibility that the light source parts may have a volume that is more than the main part of the exposure apparatus (the optical system from the reflective type fly eye optical system 2 to the wafer 7 and the control system). Accordingly, it is possible to individually separate the light source parts (10–15) from the main part of the exposure apparatus, and the light source parts (10–15) and the main part of the exposure apparatus may be individually arranged on a base. In this case, in case deformation is generated on a floor due to the weight of the light source parts (10–15) and the main part of the exposure apparatus, and/or due to vibration of the floor generated due to walking of an operator or the like, there is a possibility that an adjustment state may become inaccurate because the optical axis of the light source parts (10–15) is shifted from the optical axis of the optical system within the main part of the exposure apparatus.

Therefore, in the optical path (from the reflective type fly eye optical system 2 to the wafer 7) of the main part of the exposure apparatus, it is preferable to arrange a photoelectrical detector which detects any shift of the optical axis of the light source parts (10–15). Then, the inclination of the reflective mirror 15 (collimator mirror) can be adjusted, by a controller that controls the inclination of the reflective mirror 15 based on the output from the photoelectrical detector. By this operation, even if vibration of the floor due to walking of the operator or the like and/or deformation on the floor are generated, the optical axis of the light source parts (10–15) can be automatically matched with the optical axis of the optical system within the main part of the exposure apparatus.

Figure 20:
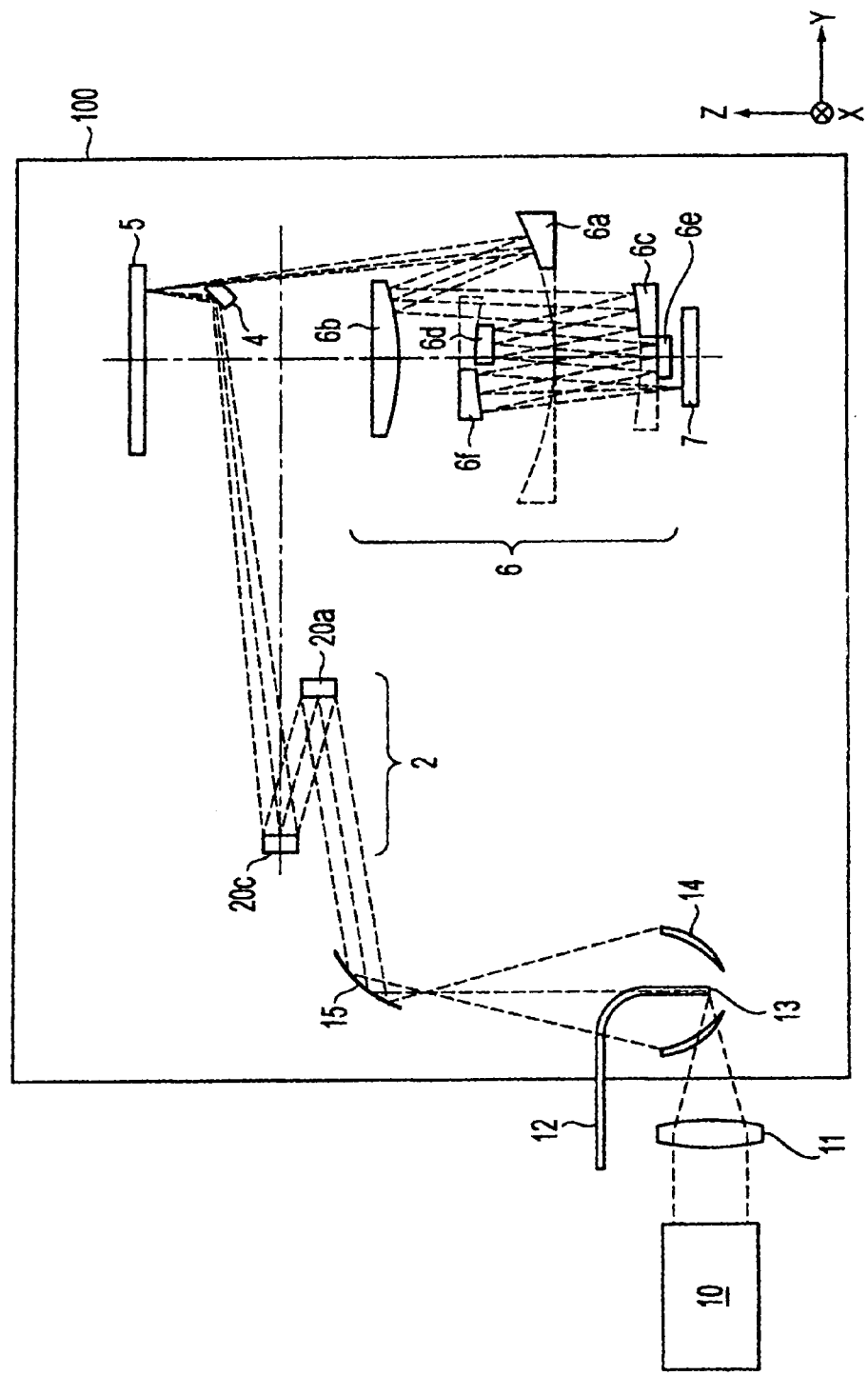
FIG. 20 is a diagram showing a third modified example of the exposure apparatus shown in FIG. 16.

It is difficult to obtain high reflectance for soft X ray mirrors. Accordingly, in a soft X ray exposure apparatus, it is preferable that the number of mirrors forming the optical system be decreased. Therefore, as one method for decreasing the number of mirrors, the structure of the condenser mirror 3 can be omitted by curving the entire second reflective element group, which is one of the elements that form the reflective type fly eye optical system 2 shown in FIGS. 9B and 14B. That is, a second reflective element group can be formed in which the plurality of reflective elements E2 are arranged along the reference spherical surface (reference curved surface) with a specified curvature, so the function of the condenser mirror 3 can be accomplished by the second reflective element group. FIG. 20 shows a second reflective element group 20c, which also functions as the condenser mirror 3. Group 20c is substituted for the second reflective element group 20b, which is one of the elements forming the reflective type fly eye optical system 2 shown in FIGS. 8, 16, and 17. The projection system 6 in FIG. 20 is formed by six mirrors (6a–6f) to further improve imaging capability.

In the examples shown in FIGS. 16, 17, 19 and 20, an exposure apparatus using a laser plasma light source is shown. However, one disadvantage of a laser plasma light source is that it generates a spray of microscopic matter. The optical components become contaminated by this microscopic matter, causing deterioration of the capability of the optical system (reflectance and uniformality of reflection of the mirror). Because of this, between the light source part and the main part of the exposure apparatus, it is desirable that a filter be arranged that traps the microscopic matter while permitting transmission of only the soft X rays. It is preferable to use a thin film formed of a light transmissive membrane as the filter.

Figure 21:
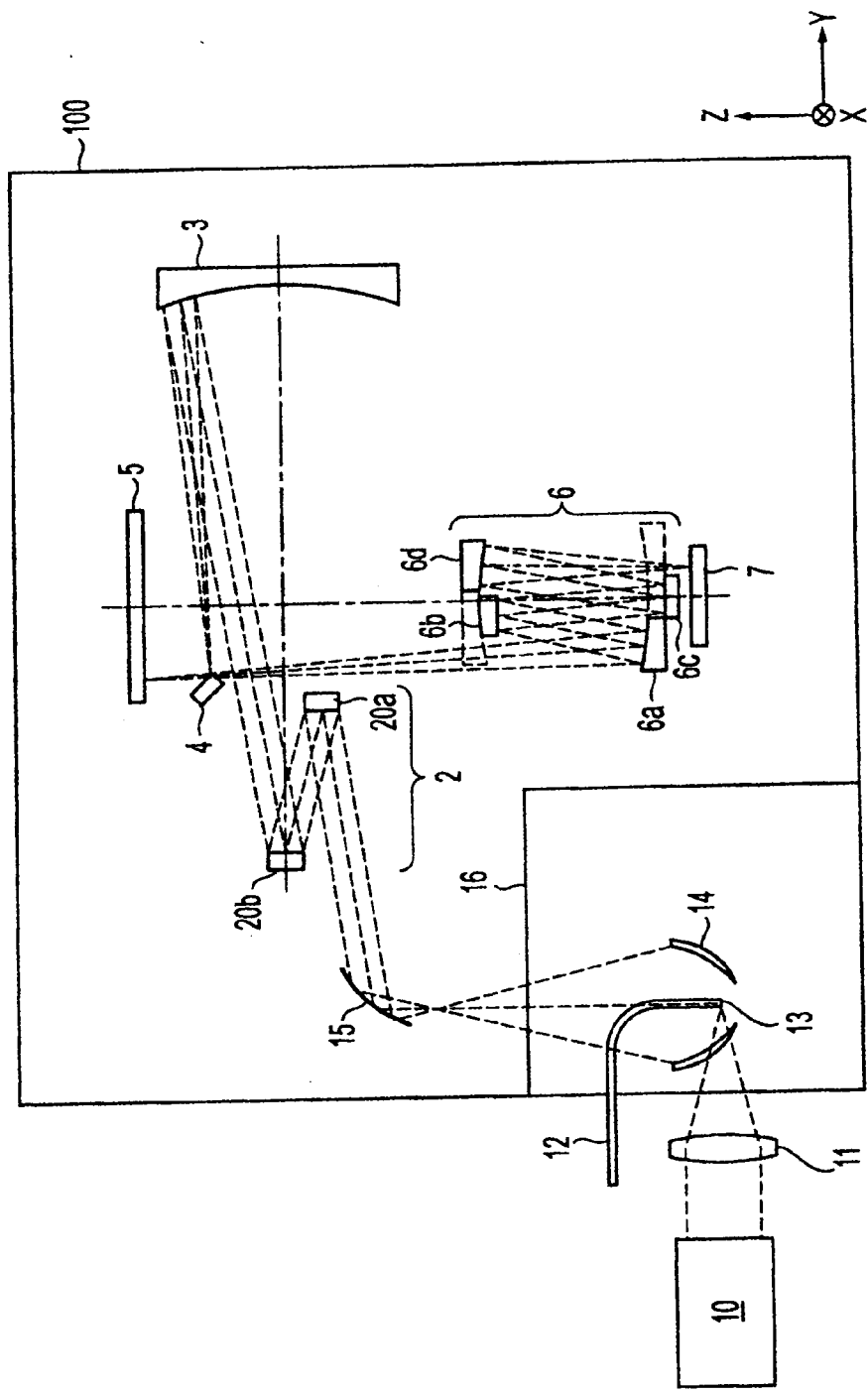
FIG. 21 is a diagram showing a fourth modified example of the exposure apparatus shown in FIG. 16.

FIG. 21 shows an example in which such a filter 16, which traps microscopic matter, is arranged. As shown in FIG. 21, if the debris prevention filter 16 is arranged between the elliptical mirror 14 and the collimator mirror 15, even if microscopic matter is generated, only the elliptical mirror 14 and the filter 16 will need to be replaced, thereby reducing maintenance costs.

As described earlier, because the soft X ray has low transmittance through the atmosphere, the exposure apparatus shown in FIGS. 16, 17, 19, 20, and 21 are covered by a vacuum chamber 100. However, heat accumulated in the optical components does not escape easily, and because of this, the mirror surfaces can be deformed easily. Therefore, it is preferable that cooling mechanisms be arranged for the optical components within the vacuum chamber 100. It is further preferable that a plurality of cooling mechanisms be fixed to the mirrors, and if the temperature distribution within the mirrors can be controlled, the deformation of the mirrors during the exposure operation can be controlled.

Additionally, a multi-layer film can be provided on the reflective surface of the mirrors forming the optical system in the exposure apparatus shown in FIGS. 16, 17, 19, 20, and 21, but it is preferable that the multi-layer film should be laminated and formed by a plurality of substances including one or more of molybdenum, ruthenium, rhodium, silicon, and silicon oxide.

Furthermore, as shown in the FIGS. 16 and 17, by using an illumination condition changing mechanism (variable aperture stop AS1, the turret plate 51 with various apertures (50a, 50f), or the like), if the size of the secondary light sources formed by the reflective type integrator 2 is changed (variableness of the a value) and/or the shape of the secondary light sources is changed (changed to a circular shape, an annular shape, or a quadrupole shape), there are cases in which the illumination characteristics may change in response to this change. Accordingly, in response to a change of an illumination condition by the illumination condition changing mechanism, it is preferable to correct (adjust) an inclined component of the illumination distribution in the scanning direction and in the non-scanning direction (direction perpendicular to the scanning direction) of the arcuate illumination field formed on the photosensitive substrate or of the arcuate illumination field formed on the mask and to correct (adjust) magnification telecentricity and oblique telecentricity of the arcuate illumination field formed on the photosensitive substrate or on the mask. However, depending on the case, it is acceptable to perform at least one of correction of the inclined components of the illumination distribution in the scanning direction and in the non-scanning direction and correction of telecentricity including oblique telecentricity and magnification telecentricity.

Furthermore, an exposure apparatus related to this invention can be assembled by electrically, mechanically, or optically connecting the respective optical components and stages in the device shown in the embodiments of FIGS. 1–25 described above so as to accomplish the functions described herein.

Figure 26:
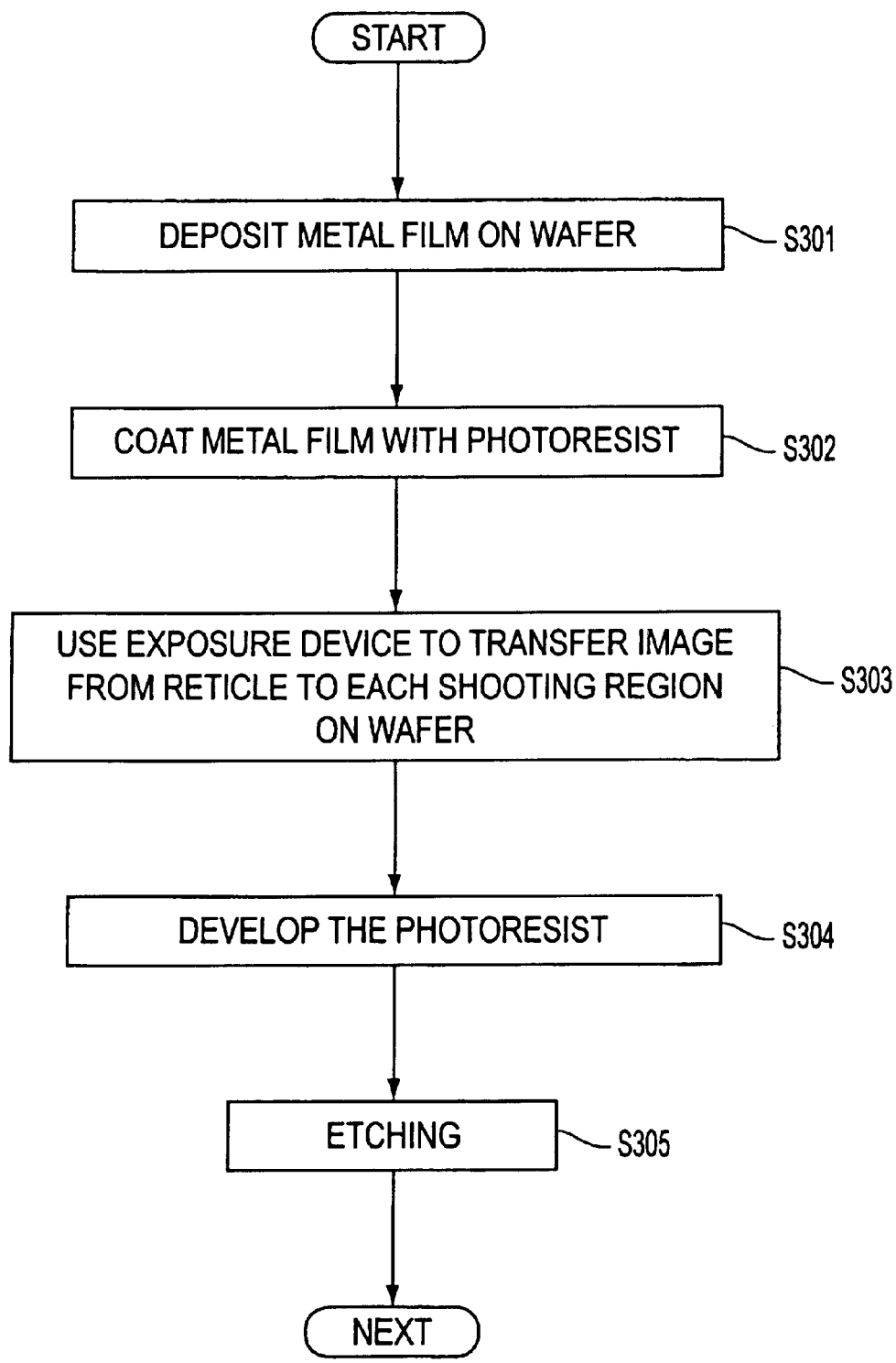
FIG. 26 is a flowchart of one example of a method when a semiconductor device is obtained as a micro-device.

The flowchart of FIG. 26 is used to explain one example of a method of manufacturing a semiconductor device (one type of micro-device) by forming a specified circuit pattern on a wafer or the like (a photosensitive substrate) by using an exposure apparatus shown in the embodiments of FIGS. 1–25;

First, in step S301, a metal film is deposited on a wafer. In the following step S302, photoresist is coated on the metal film. Next, in step S303, by using a projection exposure apparatus shown in FIGS. 1–25, an image of a pattern on a mask (reticle) is sequentially exposed and transferred (i.e., scanning exposure is effected) to the respective shot regions on the wafer via the projection optical system (projection optical unit). Then, after the photoresist on the wafer is developed in step S304, a resist pattern on the wafer is etched in step S305, so that a circuit pattern corresponding to the pattern on the mask is formed in the respective shot regions on the wafer. By forming circuit patterns in additional layers, a device such as a semiconductor device or the like can be fabricated.

According to the method of fabricating a semiconductor device described above, a semiconductor device having an extremely fine circuit pattern can be obtained with a good throughput.

Furthermore, with the exposure apparatus shown in FIGS. 1–25 described above, by forming a specified pattern (circuit pattern, electrode pattern, or the like) on a plate (glass or quartz substrate), a liquid crystal display element (another type of micro-device) can be obtained. The following explains one example of a method for fabricating a liquid crystal display element with reference to the flowchart of FIG. 27.

Figure 27:
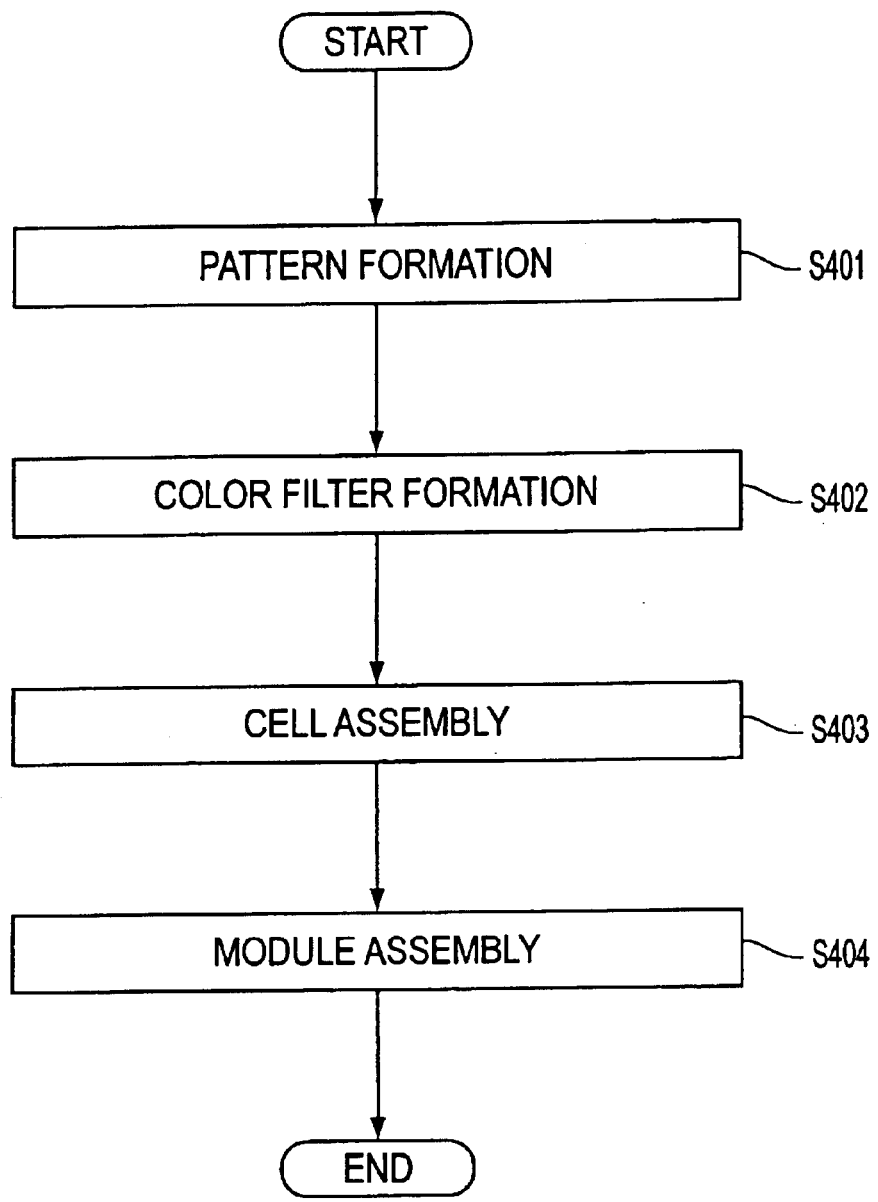
FIG. 27 is a flowchart of one example of a method when a liquid crystal element is obtained as a micro-device.

In FIG. 27, in a pattern formation process S401, a so-called photolithography process is performed which transfers and exposes a pattern of the reticle to a photosensitive substrate (a glass substrate or the like coated by resist) by using an exposure apparatus of the embodiments described with respect to FIGS. 1–25. A specified pattern including many electrodes or the like is formed on the photosensitive substrate by this photolithography process. Then, as the exposed substrate goes through processes such as a developing process, an etching process, a mask stripping process, or the like, a specified pattern is formed on the substrate, and the process moves to the following color filter formation process S402.

Next, in the color filter formation process S402, a color filter is formed in which groups of three dots corresponding to R (Red), G (Green) and B (Blue) are aligned in a matrix, or a plurality of groups of three stripe filters of R, G, and B are aligned in a horizontal scanning line direction. A cell assembly process S403 is performed after the color filter formation process S402.

In the cell assembly process S403, a liquid crystal panel (liquid crystal cell) is assembled by using a substrate having the specified pattern obtained in the pattern formation process S401, a color filter obtained in the color filter formation process S402, and the like. In the cell assembly process S403, liquid crystal material is filled between the color filter obtained in the color filter formation process S402 and the substrate having the specified pattern obtained in the pattern formation process S401, and a liquid crystal panel (liquid crystal cell) is fabricated.

After that, in a module assembly process S404, a liquid crystal display element is completed by attaching parts to the cell such as an electric circuit which performs a display operation of an assembled liquid crystal panel (liquid crystal cell), a back light, and the like.

According to the method of fabricating a liquid crystal display element described above, a liquid crystal display element having an extremely fine circuit pattern can be obtained with a good throughput.

As described above, according to this invention, a much improved method of fabricating a micro-device can be accomplished by exposure of a finer pattern, and by an exposure apparatus having high capability which can sufficiently satisfy strict illumination conditions.

While the present invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single' element, are also within the spirit and scope of the invention.

What is claimed is:

1. An exposure apparatus comprising:
 a projection system having an exposure field that is decentered with respect to an optical axis in order to project a pattern formed on a mask onto a photosensitive substrate;

an illumination optical system that forms an illumination field on the mask, the illumination field being decentered with respect to the optical axis of the projection system;

a drive that relatively moves the mask and the photosensitive substrate along a scanning exposure direction with respect to the projection system;

a first illumination adjustment mechanism that adjusts an illumination characteristic along the scanning exposure direction in one of: (a) the exposure field of the projection system, and (b) the illumination field formed on the mask;

a second illumination adjustment mechanism that adjusts an illumination characteristic in a direction crossing the scanning exposure direction in one of: (a) the exposure field of the projection system, and (b) the illumination field formed on the mask;

a first telecentricity adjustment mechanism that applies an oblique component to telecentricity in one of: (a) the exposure field of the projection system, and (b) the illumination field formed on the mask; and a second telecentricity adjustment mechanism that adjusts telecentricity changing in accordance with a position from the optical axis in one of: (a) the exposure field of the projection system, and (b) the illumination field formed on the mask.

2. The exposure apparatus of claim 1, wherein the illumination optical system forms an arcuate illumination field on the mask in the direction crossing the scanning exposure direction.

3. The exposure apparatus of claim 1, wherein the first illumination adjustment mechanism applies an illumination distribution component that is inclined along the scanning exposure direction, and the second illumination adjustment mechanism applies an illumination distribution component that is inclined along the direction crossing the scanning exposure direction.

4. The exposure apparatus of claim 1, wherein the illumination optical system includes a plurality of illumination optical components, and the first and second illumination adjustment mechanisms move or incline at least one common illumination optical component among the plurality of illumination optical components in mutually different directions.

5. The exposure apparatus of claim 4, wherein the first telecentricity adjustment mechanism adjusts an illumination optical component that is different from an illumination optical component that is adjusted by the first and second illumination adjustment mechanisms, and the second telecentricity adjustment mechanism adjusts an illumination optical component that is different from the illumination optical component adjusted by the first telecentricity adjustment mechanism.

6. The exposure apparatus of claim 4, wherein the first telecentricity adjustment mechanism adjusts an illumination optical component that is different from an illumination optical component that is adjusted by the first and second illumination adjustment mechanisms, and the second telecentricity adjustment mechanism adjusts an illumination optical component that is the same as the illumination optical component adjusted by the first telecentricity adjustment mechanism.

7. The exposure apparatus of claim 1, wherein the illumination optical system includes a plurality of illumination optical components, and the first and second illumination adjustment mechanisms move or incline mutually different optical components among the plurality of illumination optical components in mutually different directions.

8. The exposure apparatus of claim 7, wherein the first telecentricity adjustment mechanism adjusts an illumination optical component that is different from an illumination optical component that is adjusted by the first and second illumination adjustment mechanisms, and the second telecentricity adjustment mechanism adjusts an illumination optical component that is different from the illumination optical component adjusted by the first telecentricity adjustment mechanism.

9. The exposure apparatus of claim 7, wherein the first telecentricity adjustment mechanism adjusts an illumination optical component that is different from an illumination optical component that is adjusted by the first and second illumination adjustment mechanisms, and the second telecentricity adjustment mechanism adjusts an illumination optical component that is the same as the illumination optical component adjusted by the first telecentricity adjustment mechanism.

10. The exposure apparatus of claim 1, wherein the illumination optical system includes a plurality of reflective components, and the first illumination adjustment mechanism, the second illumination adjustment mechanism, the first telecentricity adjustment mechanism, and the second telecentricity adjustment mechanism respectively adjust a position of at least some of the reflective components of the illumination optical system.

11. The exposure apparatus of claim 10, wherein the first and second illumination adjustment mechanisms incline a common reflective component about mutually different axes of rotation.

12. The exposure apparatus of claim 10, wherein the first and second telecentricity adjustment mechanisms move the same reflective component in mutually different directions.

13. The exposure apparatus of claim 10, wherein the first and second illumination adjustment mechanisms move a common reflective component in different directions.

14. The exposure apparatus of claim 11, wherein the first and second telecentricity adjustment mechanisms move the same reflective component in mutually different directions.

15. The exposure apparatus of claim 14, wherein the first and second illumination adjustment mechanism adjust a reflective component that is different from a reflective component adjusted by the first and second telecentricity adjustment mechanisms.

16. The exposure apparatus of claim 1, wherein the illumination optical system comprises:

a radiation source that outputs a radiation beam;

a reflective optical integrator that makes uniform an illumination distribution of radiation from the radiation beam; and a radiation guiding optical system arranged in an optical path between the radiation source and the reflective optical integrator, and that guides the radiation beam from the radiation source to the reflective optical integrator.

17. The exposure apparatus of claim 1, further comprising an illumination condition changing mechanism that changes an illumination condition in the illumination field formed on the mask, or in the exposure field of the projection system formed on the photosensitive substrate; and wherein:

the first illumination adjustment mechanism, the second illumination adjustment mechanism, the first telecentricity adjustment mechanism and the second telecentricity adjustment mechanism perform their respective adjustments according to a change of the illumination condition made by the illumination condition changing mechanism.

18. A method of fabricating a micro-device utilizing the exposure apparatus of claim 1, comprising the steps of:
    illuminating the mask using the illumination optical system of claim 1; and
    exposing an image of the pattern of the mask onto the photosensitive substrate using the projection system of claim 1.

19. An exposure apparatus comprising:
    an illumination optical system having a plurality of reflective components that guide a radiation beam to a mask;
    a projection system that projects a pattern of the mask onto a photosensitive substrate;
    a drive that relatively moves the photosensitive substrate and the mask with respect to the projection system along a specified scanning exposure direction;
    a first telecentricity adjustment mechanism that applies an oblique component to telecentricity in one of: (a) an exposure field of the projection system, and (b) an illumination field formed on the mask; and
    a second telecentricity adjustment mechanism that adjusts telecentricity changing in accordance with a position from an optical axis in one of: (a) the exposure field of the projection system, and (b) the illumination field formed on the mask;
    wherein the first and second telecentricity adjustment mechanisms respectively adjust at least some of the plurality of reflective components of the illumination optical system.

20. The exposure apparatus of claim 19, wherein the second telecentricity adjustment mechanism moves a reflective component that is adjusted by the first telecentricity adjustment mechanism in a direction different from a direction in which the reflective component is moved by the first telecentricity adjustment mechanism.

21. The exposure apparatus of claim 19, wherein the second telecentricity adjustment mechanism moves a reflective component that is different from a reflective component that is adjusted by the first telecentricity adjustment mechanism in a direction different from a direction in which the reflective component is moved by the first telecentricity adjustment mechanism.

22. The exposure apparatus of claim 19, wherein the illumination optical system comprises:
    a radiation source that outputs the radiation beam;
    a reflective integrator that makes uniform an illumination distribution of radiation from the radiation beam on the photosensitive substrate or the mask; and
    a radiation guiding optical system arranged between the radiation source and the reflective integrator that guides the radiation beam from the radiation source to the reflective integrator.

23. The exposure apparatus of claim 19, wherein the projection system includes an exposure field that is decentered with respect to the optical axis, and the illumination optical system forms the illumination field at a position on the mask that is decentered with respect to the optical axis of the projection system.

24. The exposure apparatus of claim 19, further comprising an illumination condition changing mechanism that changes an illumination condition in the illumination field formed on the mask, or an illumination condition in the exposure field of the projection system formed on the photosensitive substrate, and wherein:
    the first telecentricity adjustment mechanism and the second telecentricity adjustment mechanism perform their respective adjustments according to the change of the illumination condition made by the illumination condition changing mechanism.

25. A method of fabricating a micro-device utilizing the exposure apparatus of claim 19, comprising the steps of:
    illuminating the mask using the illumination optical system of claim 19; and
    exposing an image of the pattern of the mask onto the photosensitive substrate using the projection system of claim 19.

26. A method of exposing a pattern of a mask onto a photosensitive substrate, the method comprising the steps of:
    forming an illumination field on the mask, the illumination field being decentered with respect to an optical axis of a projection system;
    projecting the pattern of the mask onto the photosensitive substrate with the projection system, the projection system having an exposure field that is decentered with respect to the optical axis;
    relatively moving the mask and the photosensitive substrate along a scanning exposure direction with respect to the projection system;
    adjusting an illumination characteristic along the scanning exposure direction in one of: (a) the exposure field of the projection system, and (b) the illumination field formed on the mask;
    adjusting an illumination characteristic in a direction crossing the scanning exposure direction in one of: (a) the exposure field of the projection system, and (b) the illumination field formed on the mask;
    applying an oblique component to telecentricity in one of: (a) the exposure field of the projection system, and (b) the illumination field formed on the mask; and
    adjusting telecentricity changing in accordance with a position from the optical axis in one of: (a) the exposure field of the projection system, and (b) the illumination field formed on the mask.

27. The method of claim 26, wherein the illumination optical system forms an arcuate illumination field on the mask in the direction crossing the scanning exposure direction.

28. The method of claim 26, wherein the illumination characteristic along the scanning exposure direction is adjusted by applying an illumination distribution component that is inclined along the scanning exposure direction, and the illumination characteristic in the direction crossing the scanning exposure direction is adjusted by applying an illumination distribution component that is inclined along the direction crossing the scanning exposure direction.

29. The method of claim 26, wherein the illumination optical system includes a plurality of illumination optical components, and the illumination characteristics along the scanning exposure direction and along the direction crossing the scanning exposure direction are adjusted by moving or inclining at least one common illumination optical component among the plurality of illumination optical components in mutually different directions.

30. The method of claim 29, wherein the oblique component to telecentricity is applied by adjusting an illumination optical component that is different from the at least one common illumination optical component, and the telecentricity changing in accordance with a position from the optical axis is adjusted by adjusting an illumination optical component that is different from the illumination optical component adjusted to apply the oblique component to telecentricity.

31. The method of claim 29, wherein the oblique component to telecentricity is applied by adjusting an illumination optical component that is different from the at least one common illumination optical component, and the telecentricity changing in accordance with a position from the optical axis is adjusted by adjusting an illumination optical component that is the same as the illumination optical component adjusted to apply the oblique component to telecentricity.

32. The method of claim 26, wherein the illumination optical system includes a plurality of illumination optical components, and the illumination characteristics along the scanning exposure direction and along the direction crossing the scanning exposure direction are adjusted by moving or inclining different illumination optical components among the plurality of illumination optical components in mutually different directions.

33. The method of claim 32, wherein the oblique component to telecentricity is applied by adjusting an illumination optical component that is different from the different illumination optical components, and the telecentricity changing in accordance with a position from the optical axis is adjusted by adjusting an illumination optical component that is different from the illumination optical component adjusted to apply the oblique component to telecentricity.

34. The method of claim 32, wherein the oblique component to telecentricity is applied by adjusting an illumination optical component that is different from the different illumination optical components, and the telecentricity changing in accordance with a position from the optical axis is adjusted by adjusting an illumination optical component that is the same as the illumination optical component adjusted to apply the oblique component to telecentricity.

35. The method of claim 26, wherein the illumination optical system includes a plurality of reflective components, and the illumination characteristics along the scanning exposure direction and along the direction crossing the scanning exposure direction, the oblique component to telecentricity, and the telecentricity changing in accordance with a position from the optical axis are adjusted by adjusting a position of at least some of the reflective components of the illumination optical system.

36. The method of claim 35, wherein the illumination characteristics along the scanning exposure direction and along the direction crossing the scanning exposure direction are adjusted by inclining a common reflective component about mutually different axes of rotation.

37. The method of claim 35, wherein the oblique component to telecentricity and the telecentricity changing in accordance with a position from the optical axis are adjusted by moving the same reflective component in mutually different directions.

38. The method of claim 35, wherein the illumination characteristics along the scanning exposure direction and along the direction crossing the scanning exposure direction are adjusted by moving a common reflective component in different directions.

39. The method of claim 36, wherein the oblique component to telecentricity and the telecentricity changing in accordance with a position from the optical axis are adjusted by moving the same reflective component in mutually different directions.

40. The method of claim 39, wherein the illumination characteristics along the scanning exposure direction and along the direction crossing the scanning exposure direction are adjusted by adjusting a reflective component that is different from a reflective component moved to adjust the oblique component to telecentricity and the telecentricity changing in accordance with a position from the optical axis.

41. The method of claim 26, further comprising:
changing an illumination condition in the illumination field formed on the mask, or in the exposure field of the projection system formed on the photosensitive substrate; and wherein:
the illumination characteristics along the scanning exposure direction and along the direction crossing the scanning exposure direction, the oblique component to telecentricity, and the telecentricity changing in accordance with a position from the optical axis are adjusted according to the change made to the illumination condition.

42. A method of exposing a pattern of a mask onto a photosensitive substrate, the method comprising the steps of:
forming an illumination field on the mask, the illumination field being decentered with respect to an optical axis of a projection system;
projecting the pattern of the mask onto the photosensitive substrate with the projection system, the projection system having an exposure field that is decentered with respect to the optical axis;
relatively moving the mask and the photosensitive substrate along a scanning exposure direction with respect to the projection system;
applying an oblique component to telecentricity in one of: (a) the exposure field of the projection system, and (b) the illumination field formed on the mask; and
adjusting telecentricity changing in accordance with a position from the optical axis in one of: (a) the exposure field of the projection system, and (b) the illumination field formed on the mask;
wherein the oblique component to telecentricity and the telecentricity changing in accordance with a position from the optical axis are adjusted by moving at least some of the plurality of reflective components of the illumination optical system.

43. The method of claim 42, wherein the oblique component to telecentricity is adjusted by moving a reflective component in a direction different from a direction in which the reflective component is moved in order to adjust the telecentricity changing in accordance with a position from the optical axis.

44. The method of claim 42, wherein the oblique component to telecentricity is adjusted by moving a reflective component that is different from a reflective component that is moved in order to adjust the telecentricity changing in accordance with a position from the optical axis.

45. The method of claim 42, wherein the projection system includes an exposure field that is decentered with respect to the optical axis, and the illumination optical system forms the illumination field at a position on the mask that is decentered with respect to the optical axis of the projection system.

46. The method of claim 42, further comprising:
changing an illumination condition in the illumination field formed on the mask, or an illumination condition in the exposure field of the projection system formed on the photosensitive substrate, and wherein:

the oblique component to telecentricity and the telecentricity changing in accordance with a position from the optical axis are adjusted according to the change made to the illumination condition.

47. An exposure apparatus comprising:
a projection system having an exposure field that is decentered with respect to an optical axis in order to project a reduction image of a pattern formed on a mask onto a photosensitive substrate;
an illumination optical system that forms an illumination field on the mask, the illumination field being decentered with respect to the optical axis of the projection system;
a drive that relatively moves the mask and the photosensitive substrate along a scanning exposure direction with respect to the projection system; and
an illumination adjustment mechanism that adjusts at least one of an illumination characteristic along the scanning exposure direction and an illumination characteristic crossing the scanning exposure direction in one of: (a) the exposure field of the projection system, and (b) the illumination field formed on the mask.

48. The exposure apparatus of claim 47, wherein the illumination optical system includes a plurality of illumination optical components, and the illumination adjustment mechanism moves and/or inclines at least one illumination optical component among the plurality of illumination optical components.

49. The exposure apparatus of claim 48, wherein the illumination adjustment mechanism applies at least one of an illumination distribution component that is inclined along the scanning exposure direction, and an illumination distribution component that is inclined along the direction crossing the scanning exposure direction.

50. The exposure apparatus of claim 47, further comprising:
a first telecentricity adjustment mechanism that applies an oblique component to telecentricity in one of: (a) the exposure field of the projection system, and (b) the illumination field formed on the mask; and
a second telecentricity adjustment mechanism that adjusts telecentricity changing in accordance with a position from the optical axis in one of: (a) the exposure field of the projection system, and (b) the illumination field formed on the mask.

51. The exposure apparatus of claim 47, wherein the illumination adjustment mechanism applies at least one of an illumination distribution component that is inclined along the scanning exposure direction, and an illumination distribution component that is inclined along the direction crossing the scanning exposure direction.

52. An exposure apparatus comprising:
a projection system having an exposure field that is decentered with respect to an optical axis in order to project a reduction image of a pattern formed on a mask onto a photosensitive substrate;
an illumination optical system that forms an illumination field on the mask, the illumination field being decentered with respect to the optical axis of the projection system;
a drive that relatively moves the mask and the photosensitive substrate along a scanning exposure direction with respect to the projection system; and
a telecentricity adjustment mechanism that applies an oblique component to telecentricity in one of: (a) the exposure field of the projection system, and (b) the illumination field formed on the mask.

53. The exposure apparatus of claim 52, further comprising:
another telecentricity adjustment mechanism that adjusts telecentricity changing in accordance with a position from the optical axis in one of: (a) the exposure field of the projection system, and (b) the illumination field formed on the mask.

54. The exposure apparatus of claim 53, wherein the illumination optical system includes a plurality of illumination optical components, and the telecentricity adjustment mechanism and the another telecentricity adjustment mechanism adjust a position of at least one of the illumination optical component of the illumination optical system.

55. An exposure apparatus comprising:
a projection system having an exposure field that is decentered with respect to an optical axis in order to project a reduction image of a pattern formed on a mask onto a photosensitive substrate;
an illumination optical system that forms an illumination field on the mask, the illumination field being decentered with respect to the optical axis of the projection system;
a drive that relatively moves the mask and the photosensitive substrate along a scanning exposure direction with respect to the projection system; and
a telecentricity adjustment mechanism that adjusts telecentricity in one of: (a) the exposure field of the projection system, and (b) the illumination field formed on the mask.

56. The exposure apparatus of claim 55, wherein the illumination optical system includes a plurality of illumination optical components, and the telecentricity adjustment mechanism adjusts the telecentricity by using at least one illumination optical component among the plurality of illumination optical components.

57. The exposure apparatus of claim 55, wherein the illumination optical system has an optical axis that is coaxial with the optical axis of the projection system.

58. The exposure apparatus of claim 57, wherein the illumination optical system includes an optical integrator,
the optical integrator includes a plurality of optical surfaces with a shape similar to a shape of the exposure field of the projection system.

59. The exposure apparatus of claim 58, wherein the plurality of optical surfaces of the optical integrator are arranged in an array.

60. The exposure apparatus of claim 59, wherein the illumination optical system forms an arcuate illumination field on the mask.

61. The exposure apparatus of claim 55, further comprising a telecentricity measurement system.

62. An exposure apparatus comprising:
a projection system having an exposure field that is decentered with respect to an optical axis in order to project a reduction image of a pattern formed on a mask onto a photosensitive substrate;
an illumination optical system that forms an illumination field on the mask, the illumination field being decentered with respect to the optical axis of the projection system; and
a drive that relatively moves the mask and the photosensitive substrate along a scanning exposure direction with respect to the projection system,
wherein the illumination optical system has an optical axis that is optically coaxial with the optical axis of the projection system.

63. The exposure apparatus of claim 62, further comprising a telecentricity adjustment mechanism that adjusts telecentricity changing in accordance with a position from the optical axis in one of: (a) the exposure field of the projection system and (b) the illumination field on the mask.

64. The exposure apparatus of claim 63, further comprising another telecentricity adjustment mechanism that applies an oblique component to telecentricity in one of: (a) the exposure field of the projection system and (b) the illumination field on the mask.

65. The exposure apparatus of claim 62, wherein the illumination optical system includes an optical integrator, the optical integrator includes a plurality of optical surfaces with a shape similar to a shape of the exposure field of the projection system.

66. The exposure apparatus of claim 65, wherein the plurality of optical surfaces of the optical integrator arc arranged in an array.

67. The exposure apparatus of claim 65, wherein the illumination optical system forms an arcuate illumination field on the mask.

68. The exposure apparatus of claim 62, further comprising:

a telecentricity adjustment mechanism that adjusts telecentricity in one of: (a) the exposure field of the projection system, and (b) the illumination field formed on the mask, wherein the illumination optical system includes a plurality of illumination optical components, and the telecentricity adjustment mechanism adjusts the telecentricity by using at least one illumination optical component among the plurality of illumination optical components.

69. A method of exposing a pattern of a mask onto a photosensitive substrate, the method comprising the steps of:

forming an illumination field on the mask, the illumination field being decentered with respect to an optical axis of a projection system;

projecting a reduced image of the pattern of the mask onto the photosensitive substrate with the projection system, the projection system having an exposure field that is decentered with respect to the optical axis;

relatively moving the mask and the photosensitive substrate along a scanning exposure direction with respect to the projection system; and adjusting at least one of an illumination characteristic along the scanning exposure direction and an illumination characteristic crossing the scanning exposure direction in one of: (a) the exposure field of the projection system, and (b) the illumination field formed on the mask.

70. The method of claim 69, wherein the illumination optical system includes a plurality of illumination optical components, and the illumination characteristics along the scanning exposure direction and the direction crossing the scanning exposure direction are adjusted by moving and/or inclining at least one illumination optical component in the illumination optical system.

71. The method of claim 70, wherein the step of adjusting an illumination characteristic applies at least one of an illumination distribution component that is inclined along the scanning exposure direction, and an illumination distribution component that is inclined along the direction crossing the scanning exposure direction.

72. The method of claim 69, further comprising the steps of:

applying an oblique component to telecentricity in one of: (a) the exposure field of the projection system, and (b) the illumination field formed on the mask; and adjusting telecentricity changing in accordance with a position from the optical axis in one of: (a) the exposure field of the projection system, and (b) the illumination field formed on the mask.

73. The method of claim 69, wherein the step of adjusting an illumination characteristic applies at least one of an illumination distribution component that is inclined along the scanning exposure direction, and an illumination distribution component that is inclined along the direction crossing the scanning exposure direction.

74. A method of exposing a pattern of a mask onto a photosensitive substrate, the method comprising the steps of:

forming an illumination field on the mask, the illumination field being decentered with respect to an optical axis of a projection system;

projecting the pattern of the mask onto the photosensitive substrate with the projection system, the projection system having an exposure field that is decentered with respect to the optical axis;

relatively moving the mask and the photosensitive substrate along a scanning exposure direction with respect to the projection system; and applying an oblique component to telecentricity in one of: (a) the exposure field of the projection system, and (b) the illumination field formed on the mask.

75. The method of claim 74, further comprising the steps of:

adjusting telecentricity changing in accordance with a position from the optical axis in one of: (a) the exposure field of the projection system, and (b) the illumination field formed on the mask.

76. The method of claim 75, wherein the illumination optical system includes a plurality of illumination optical components, and the applying step and the adjusting step adjust a position of at least one of the illumination optical components of the illumination optical system.

77. A method of exposing a pattern of a mask onto a photosensitive substrate, the method comprising the steps of:

forming an illumination field on the mask, the illumination field being decentered with respect to an optical axis of a projection system;

projecting the pattern of the mask onto the photosensitive substrate with the projection system, the projection system having an exposure field that is decentered with respect to the optical axis;

relatively moving the mask and the photosensitive substrate along a scanning exposure direction with respect to the projection system; and adjusting telecentricity in one of (a) the exposure field of the projection system, and (b) the illumination field formed on the mask.

78. The method of claim 77, wherein the illumination optical system includes a plurality of illumination optical components, and the adjusting step adjusts a position of at least one of the illumination optical components of the illumination optical system.

79. The method of claim 78, wherein the illumination optical system has an optical axis that is coaxial with the optical axis of the projection system.

80. The method of claim 79, wherein the forming step includes a step of using an optical integrator, the optical integrator includes a plurality of optical surfaces with a shape similar to a shape of the exposure field of the projection system.

81. The method of claim 80, wherein the plurality of optical surfaces of the optical integrator are arranged in an array.

82. The method of claim 81, wherein the forming step forms an arcuate illumination field on the mask.

83. The method of claim 77, further comprising the step of measuring telecentricity in one of (a) the exposure field of the projection system, and (b) the illumination field on the mask.

84. A method of exposing a pattern of a mask onto a photosensitive substrate, the method comprising the steps of:

forming an illumination field on the mask, the illumination field being decentered with respect to an optical axis of a projection system;

projecting the pattern of the mask onto the photosensitive substrate with the projection system, the projection system having an exposure field that is decentered with respect to the optical axis; and relatively moving the mask and the photosensitive substrate along a scanning exposure direction with respect to the projection system, wherein the illumination optical system has an optical axis that is optically coaxial with the optical axis of the projection system.

85. The method of claim 84, further comprising the steps of:

adjusting telecentricity changing in accordance with a position from the optical axis in one of: (a) the exposure field of the projection system, and (b) the illumination field formed on the mask.

86. The method of claim 85, further comprising the steps of:

applying an oblique component to telecentricity in one of: (a) the exposure field of the projection system and (b) the illumination field on the mask.

87. The method of claim 84, wherein the forming step includes a step of using an optical integrator, the optical integrator includes a plurality of optical surfaces with a shape similar to a shape of the exposure field of the projection system.

88. The method of claim 87, wherein the plurality of optical surfaces of the optical integrator are arranged in an array.

89. The method of claim 87, wherein the forming step forms an arcuate illumination field on the mask.

90. The method of claim 84, further comprising the steps of:

adjusting telecentricity in one of (a) the exposure field of the projection system, and (b) the illumination field formed on the mask, wherein the illumination optical system includes a plurality of illumination optical components, and the adjusting step adjusts a position of at least one of the illumination optical components of the illumination optical system.

91. An exposure apparatus comprising:

a projection system having an exposure field that is decentered with respect to an optical axis in order to project a pattern formed on a mask onto a photosensitive substrate;

an illumination optical system that forms an illumination field on the mask, the illumination field being decentered with respect to the optical axis of the projection system;

a drive that relatively moves the mask and the photosensitive substrate along a scanning exposure direction with respect to the projection system;

a first illumination adjustment mechanism that is connected to an optical member in an optical path of the illumination optical system and that adjusts an illumination characteristic along the scanning exposure direction in one of: (a) the exposure field of the projection system, and (b) the illumination field formed on the mask;

a second illumination adjustment mechanism that is connected to an optical member in an optical path of the illumination optical system and that adjusts an illumination characteristic in a direction crossing the scanning exposure direction in one of: (a) the exposure field of the projection system, and (b) the illumination field formed on the mask;

a first telecentricity adjustment mechanism that is connected to an optical member in an optical path of the illumination optical system and that applies an oblique component to telecentricity in one of: (a) the exposure field of the projection system, and (b) the illumination field formed on the mask; and a second telecentricity adjustment mechanism that is connected to an optical member in an optical path of the illumination optical system and that adjusts telecentricity changing in accordance with a position from the optical axis in one of: (a) the exposure field of the projection system, and (b) the illumination field formed on the mask.

92. An exposure apparatus comprising:

an illumination optical system having a plurality of reflective components that guide a radiation beam to a mask;

a projection system that projects a pattern of the mask onto a photosensitive substrate;

a drive that relatively moves the photosensitive substrate and the mask with respect to the projection system along a specified scanning exposure direction;

a first telecentricity adjustment mechanism that is connected to an optical member in an optical path of the illumination optical system and that applies an oblique component to telecentricity in one of: (a) an exposure field of the projection system, and (b) an illumination field formed on the mask; and a second telecentricity adjustment mechanism that is connected to an optical member in an optical path of the illumination optical system and that adjusts telecentricity changing in accordance with a position from an optical axis in one of: (a) the exposure field of the projection system, and (b) the illumination field formed on the mask;

wherein the first and second telecentricity adjustment mechanisms respectively adjust at least some of the plurality of reflective components of the illumination optical system.

93. An exposure apparatus comprising:

a projection system having an exposure field that is decentered with respect to an optical axis in order to project a reduction image of a pattern formed on a mask onto a photosensitive substrate;

an illumination optical system that forms an illumination field on the mask, the illumination field being decentered with respect to the optical axis of the projection system;

a drive that relatively moves the mask and the photosensitive substrate along a scanning exposure direction with respect to the projection system; and an illumination adjustment mechanism that is connected to an optical member in an optical path of the illumination optical system and that adjusts an illumination characteristic along the scanning exposure direction and an illumination characteristic crossing the scanning exposure direction in one of: (a) the exposure field of the projection system, and (b) the illumination field formed on the mask.

94. An exposure apparatus comprising:

a projection system having an exposure field that is decentered with respect to an optical axis in order to project a reduction image of a pattern formed on a mask onto a photosensitive substrate;

an illumination optical system that forms an illumination field on the mask, the illumination field being decentered with respect to the optical axis of the projection system;

a drive that relatively moves the mask and the photosensitive substrate along a scanning exposure direction with respect to the projection system; and a telecentricity adjustment mechanism that is connected to an optical member in an optical path of the illumination optical system and that applies an oblique component to telecentricity in one of: (a) the exposure field of the projection system, and (b) the illumination field formed on the mask.

95. An exposure apparatus comprising:

a projection system having an exposure field that is decentered with respect to an optical axis in order to project a reduction image of a pattern formed on a mask onto a photosensitive substrate;

an illumination optical system that forms an illumination field on the mask, the illumination field being decentered with respect to the optical axis of the projection system;

a drive that relatively moves the mask and the photosensitive substrate along a scanning exposure direction with respect to the projection system; and a telecentricity adjustment mechanism that is connected to an optical member in an optical path of the illumination optical system and that adjusts telecentricity in one of: (a) the exposure field of the projection system, and (b) the illumination field formed on the mask.

* * * * *